(12) United States Patent        (10) Patent No.:     US 8,530,359 B2
Mayer et al.                      (45) Date of Patent:    Sep. 10, 2013

(54) MODULATED METAL REMOVAL USING LOCALIZED WET ETCHING

(75) Inventors: Steven T. Mayer, Lake Oswego, OR (US); David W. Porter, Sherwood, OR (US)

(73) Assignee: Novellus Systems, Inc., Fremont, CA (US)

( * ) Notice: Subject to any disclaimer, the term of this patent is extended or adjusted under 35 U.S.C. 154(b) by 959 days.

(21) Appl. No.: 12/462,424

(22) Filed: Aug. 4, 2009

(65) Prior Publication Data

US 2010/0029088 A1    Feb. 4, 2010

Related U.S. Application Data

(63) Continuation-in-part of application No. 11/602,128, filed on Nov. 20, 2006, now Pat. No. 8,158,532, and a continuation-in-part of application No. 11/888,312, filed on Jul. 30, 2007, now Pat. No. 7,972,970, which is a continuation-in-part of application No. 11/586,394, filed on Oct. 24, 2006, now Pat. No. 7,531,463, which is a continuation-in-part of application No. 10/690,084, filed on Oct. 20, 2003, now Pat. No. 7,338,908.

(60) Provisional application No. 60/737,978, filed on Nov. 19, 2005.

(51) Int. Cl.
    *H01I 21/302* (2006.01)

(52) U.S. Cl.
    USPC .......... 438/748; 438/692; 438/745; 438/747; 438/750; 216/92

(58) Field of Classification Search
    USPC ............. 438/692, 693, 694, 745, 750, 747, 438/748, 754; 216/88, 90, 92, 102
    See application file for complete search history.

(56) References Cited

U.S. PATENT DOCUMENTS

| | | |
|---|---|---|
| 3,183,176 A | 5/1965 | Schwartz |
| 3,313,715 A | 4/1967 | Schwartz |
| 3,393,134 A | 7/1968 | Schwartz |
| 3,619,383 A | 11/1971 | Eisner |
| 3,619,384 A | 11/1971 | Eisner |
| 3,661,752 A | 5/1972 | Capper et al. |
| 3,749,652 A | 7/1973 | Eisner |
| 3,751,343 A | 8/1973 | Macula et al. |
| 3,849,270 A | 11/1974 | Takagi et al. |
| 3,904,489 A | 9/1975 | Johnson |
| 4,002,778 A | 1/1977 | Bellis et al. |
| 4,119,499 A | 10/1978 | Eidschun, Jr. |
| 4,181,760 A | 1/1980 | Feldstein |
| 4,227,986 A | 10/1980 | Loqvist et al. |
| 4,311,551 A | 1/1982 | Sykes |
| 4,363,711 A | 12/1982 | Kuehnle |
| 4,452,684 A | 6/1984 | Palnik |
| 4,592,808 A | 6/1986 | Doubt |
| 4,737,446 A | 4/1988 | Cohen et al. |
| 4,738,756 A | 4/1988 | Mseitif |
| 4,981,725 A | 1/1991 | Nuzzi et al. |
| 5,034,753 A | 7/1991 | Weber |
| 5,096,550 A | 3/1992 | Mayer et al. |
| 5,151,168 A | 9/1992 | Gilton et al. |
| 5,158,860 A | 10/1992 | Gulla et al. |
| 5,169,514 A | 12/1992 | Hendriks et al. |
| 5,203,955 A | 4/1993 | Viehbeck et al. |
| 5,256,565 A | 10/1993 | Bernhardt et al. |
| 5,277,785 A | 1/1994 | Van Anglen |
| 5,318,803 A | 6/1994 | Bickford et al. |
| 5,378,346 A | 1/1995 | Ashiru et al. |
| 5,380,560 A | 1/1995 | Kaja et al. |
| 5,382,447 A | 1/1995 | Kaja et al. |
| 5,453,174 A | 9/1995 | Van Anglen et al. |
| 5,462,649 A | 10/1995 | Keeney et al. |
| 5,486,234 A | 1/1996 | Contolini et al. |
| 5,557,027 A | 9/1996 | Kemp |
| 5,576,052 A | 11/1996 | Arledge et al. |
| 5,674,787 A | 10/1997 | Zhao et al. |
| 5,695,810 A | 12/1997 | Dubin et al. |
| 5,770,095 A | 6/1998 | Sasaki et al. |
| 5,807,165 A | 9/1998 | Uzoh et al. |
| 5,824,599 A | 10/1998 | Schacham-Diamond et al. |
| 5,843,296 A | 12/1998 | Greenspan |
| 5,891,513 A | 4/1999 | Dubin et al. |
| 5,897,375 A | 4/1999 | Watts et al. |
| 5,913,147 A | 6/1999 | Dubin et al. |
| 5,969,422 A | 10/1999 | Ting et al. |
| 5,972,192 A | 10/1999 | Dubin et al. |

| | | | | | | |
|---|---|---|---|---|---|---|
| 6,056,864 | A | 5/2000 | Cheung | 7,049,234 B2 | 5/2006 | Cheng et al. |
| 6,056,869 | A | 5/2000 | Uzoh | 7,056,648 B2 | 6/2006 | Cooper et al. |
| 6,065,424 | A | 5/2000 | Shacham-Diamand et al. | 7,066,586 B2 | 6/2006 | da Silva |
| 6,083,835 | A | 7/2000 | Shue et al. | 7,097,538 B2 | 8/2006 | Talieh et al. |
| 6,103,628 | A | 8/2000 | Talieh | 7,124,386 B2 | 10/2006 | Smith et al. |
| 6,121,152 | A | 9/2000 | Adams et al. | 7,129,165 B2 | 10/2006 | Basol et al. |
| 6,136,707 | A | 10/2000 | Cohen | 7,189,647 B2 | 3/2007 | Patton et al. |
| 6,139,763 | A | 10/2000 | Ina et al. | 7,214,305 B2 | 5/2007 | Matsuda et al. |
| 6,143,155 | A | 11/2000 | Adams et al. | 7,217,649 B2 | 5/2007 | Bailey et al. |
| 6,152,586 | A | 11/2000 | Dealey, Jr. et al. | 7,244,398 B2 | 7/2007 | Kotary et al. |
| 6,153,521 | A | 11/2000 | Cheung et al. | 7,262,504 B2 | 8/2007 | Cheng et al. |
| 6,171,467 | B1 | 1/2001 | Weihs et al. | 7,285,255 B2 | 10/2007 | Kadlee et al. |
| 6,174,353 | B1 | 1/2001 | Yuan et al. | 7,285,494 B2 | 10/2007 | Cheng et al. |
| 6,176,992 | B1 | 1/2001 | Talieh | 7,338,908 B1 | 3/2008 | Koos et al. |
| 6,181,013 | B1 | 1/2001 | Liu et al. | 7,405,163 B1 | 7/2008 | Drewery et al. |
| 6,184,124 | B1 | 2/2001 | Hasegawa et al. | 7,449,098 B1 | 11/2008 | Mayer et al. |
| 6,197,181 | B1 | 3/2001 | Chen | 7,491,252 B2 | 2/2009 | Bian |
| 6,197,364 | B1 | 3/2001 | Paunovic et al. | 7,531,079 B1 | 5/2009 | Mayer et al. |
| 6,207,572 | B1 | 3/2001 | Talieh et al. | 7,531,463 B2 | 5/2009 | Koos et al. |
| 6,214,696 | B1 | 4/2001 | Wu | 7,605,082 B1 | 10/2009 | Reid et al. |
| 6,251,235 | B1 | 6/2001 | Talieh et al. | 7,799,200 B1 | 9/2010 | Mayer et al. |
| 6,270,619 | B1 | 8/2001 | Suzuki et al. | 7,811,925 B1 | 10/2010 | Reid et al. |
| 6,293,850 | B1 * | 9/2001 | Lin et al. ............ 451/41 | 7,972,970 B2 | 7/2011 | Mayer et al. |
| 6,309,981 | B1 | 10/2001 | Mayer et al. | 8,043,958 B1 | 10/2011 | Reid et al. |
| 6,315,883 | B1 | 11/2001 | Mayer et al. | 8,158,532 B2 | 4/2012 | Mayer et al. |
| 6,328,872 | B1 | 12/2001 | Talieh et al. | 2001/0006224 A1 | 7/2001 | Tsuchiya et al. |
| 6,329,284 | B2 | 12/2001 | Maekawa | 2001/0013472 A1 | 8/2001 | Nakamura et al. |
| 6,342,733 | B1 | 1/2002 | Hu et al. | 2001/0034125 A1 | 10/2001 | Uozumi |
| 6,344,129 | B1 | 2/2002 | Rodbell et al. | 2001/0038448 A1 | 11/2001 | Jun et al. |
| 6,355,153 | B1 | 3/2002 | Uzoh et al. | 2002/0061635 A1 | 5/2002 | Lee et al. |
| 6,391,188 | B1 | 5/2002 | Goosey | 2002/0066673 A1 | 6/2002 | Rodbell et al. |
| 6,394,114 | B1 | 5/2002 | Gupta et al. | 2002/0084529 A1 | 7/2002 | Dubin et al. |
| 6,398,855 | B1 | 6/2002 | Palmans et al. | 2003/0001271 A1 | 1/2003 | Uozumi |
| 6,409,904 | B1 | 6/2002 | Uzoh et al. | 2003/0003711 A1 | 1/2003 | Modak |
| 6,413,338 | B1 | 7/2002 | DiPalma | 2003/0059538 A1 | 3/2003 | Chung et al. |
| 6,447,668 | B1 | 9/2002 | Wang | 2003/0075808 A1 | 4/2003 | Inoue et al. |
| 6,478,936 | B1 | 11/2002 | Volodarsky et al. | 2003/0111354 A1 | 6/2003 | Hara et al. |
| 6,482,307 | B2 | 11/2002 | Ashjaee et al. | 2003/0166382 A1 | 9/2003 | Ashjaee et al. |
| 6,524,167 | B1 | 2/2003 | Tsai et al. | 2003/0176049 A1 | 9/2003 | Hegde et al. |
| 6,527,920 | B1 | 3/2003 | Mayer | 2003/0190426 A1 | 10/2003 | Padhi et al. |
| 6,534,116 | B2 | 3/2003 | Basol | 2004/0020520 A1 * | 2/2004 | Kim et al. ............ 134/95.2 |
| 6,537,416 | B1 | 3/2003 | Mayer et al. | 2004/0040853 A1 * | 3/2004 | Marsh et al. ............ 205/104 |
| 6,586,342 | B1 | 7/2003 | Mayer et al. | 2004/0065540 A1 | 4/2004 | Mayer et al. |
| 6,592,742 | B2 | 7/2003 | Sun et al. | 2004/0226827 A1 | 11/2004 | Matsuda et al. |
| 6,630,059 | B1 | 10/2003 | Uzoh et al. | 2004/0253740 A1 | 12/2004 | Shalyt et al. |
| 6,638,411 | B1 | 10/2003 | Mishima et al. | 2005/0000940 A1 | 1/2005 | Iwamoto et al. |
| 6,645,567 | B2 | 11/2003 | Chebiam et al. | 2005/0074967 A1 | 4/2005 | Kondo et al. |
| 6,653,226 | B1 | 11/2003 | Reid | 2005/0145484 A1 | 7/2005 | Basol |
| 6,664,122 | B1 | 12/2003 | Andryuschenko et al. | 2005/0158985 A1 | 7/2005 | Chen et al. |
| 6,692,546 | B2 | 2/2004 | Ma et al. | 2005/0250339 A1 | 11/2005 | Shea et al. |
| 6,692,873 | B1 | 2/2004 | Park | 2005/0258046 A1 | 11/2005 | Basol |
| 6,709,563 | B2 | 3/2004 | Nagai et al. | 2005/0266265 A1 | 12/2005 | Cheng et al. |
| 6,713,122 | B1 | 3/2004 | Mayer et al. | 2006/0037855 A1 | 2/2006 | Hanson et al. |
| 6,716,753 | B1 | 4/2004 | Shue et al. | 2006/0175202 A1 | 8/2006 | Mazur |
| 6,755,954 | B2 | 6/2004 | Mayer | 2006/0205204 A1 | 9/2006 | Beck |
| 6,756,307 | B1 | 6/2004 | Kelly et al. | 2006/0260952 A1 | 11/2006 | Mazur |
| 6,766,817 | B2 | 7/2004 | da Silva | 2007/0051619 A1 | 3/2007 | Mazur |
| 6,774,041 | B1 | 8/2004 | Kondo et al. | 2007/0051639 A1 | 3/2007 | Mazur |
| 6,775,907 | B1 | 8/2004 | Boyko et al. | 2007/0094928 A1 | 5/2007 | Hunter |
| 6,793,796 | B2 | 9/2004 | Reid et al. | 2007/0105377 A1 | 5/2007 | Koos et al. |
| 6,797,132 | B2 | 9/2004 | Talieh et al. | 2007/0131561 A1 | 6/2007 | Wang et al. |
| 6,815,349 | B1 | 11/2004 | Minshall et al. | 2007/0212281 A1 | 9/2007 | Kadlee et al. |
| 6,815,354 | B2 | 11/2004 | Uzoh et al. | 2007/0292314 A1 | 12/2007 | Effenhauser et al. |
| 6,858,121 | B2 | 2/2005 | Basol | 2008/0015531 A1 | 1/2008 | Hird et al. |
| 6,863,795 | B2 | 3/2005 | Teerlinck et al. | 2008/0286701 A1 | 11/2008 | Rath et al. |
| 6,867,136 | B2 | 3/2005 | Basol et al. | 2009/0014415 A1 | 1/2009 | Chelle et al. |
| 6,884,724 | B2 | 4/2005 | Hsu et al. | 2009/0120457 A1 | 5/2009 | Naghshineh et al. |
| 6,887,776 | B2 | 5/2005 | Shang et al. | 2009/0277867 A1 | 11/2009 | Mayer et al. |
| 6,902,659 | B2 | 6/2005 | Talieh | 2009/0280649 A1 | 11/2009 | Mayer et al. |
| 6,918,404 | B2 | 7/2005 | Dias da Silva | 2009/0283499 A1 | 11/2009 | Mayer et al. |
| 6,919,010 | B1 | 7/2005 | Mayer | 2010/0015805 A1 | 1/2010 | Mayer et al. |
| 6,921,551 | B2 | 7/2005 | Basol | 2010/0029088 A1 | 2/2010 | Mayer et al. |
| 6,946,065 | B1 | 9/2005 | Mayer et al. | 2011/0056913 A1 | 3/2011 | Mayer et al. |
| 6,946,066 | B2 | 9/2005 | Basol et al. | 2011/0223772 A1 | 9/2011 | Mayer et al. |
| 6,975,032 | B2 | 12/2005 | Chen et al. | | | |
| 6,984,166 | B2 * | 1/2006 | Maury et al. ............ 451/41 | | | |
| 7,001,854 | B1 | 2/2006 | Papasouliotis et al. | | | |
| 7,008,871 | B2 | 3/2006 | Andricacos et al. | | | |
| 7,037,854 | B2 * | 5/2006 | Bachrach et al. ............ 438/745 | | | |

FOREIGN PATENT DOCUMENTS

| | | |
|---|---|---|
| GB | 1400510 | 7/1975 |
| JP | 02111883 | 4/1990 |
| JP | 03122266 | 5/1991 |
| JP | 2005-187865 | 7/2005 |
| JP | 2009-160486 | 7/2009 |
| KR | 2009-0069606 | 7/2009 |
| WO | 99/47731 | 9/1999 |
| WO | WO03/098676 A1 | 11/2003 |
| WO | WO2009/023387 | 2/2009 |

OTHER PUBLICATIONS

Patri et al., Role of the Functional Groups of Complexing Agents in Copper Slurries, J. of the Electrochemical Society, 2006, pp. G650-G659, vol. 153(7).

Aksu et al., Electrochemistry of Copper in Aqueous Ethylenediamine Solutions, J. of the Electrochemical Society, 2002, pp. B340-B347, vol. 149(7).

Choi et al., Dissolution Behaviors of Copper Metal in Alkaline $H_2O_2$-EDTA Solutions, J. of Nuclear Science and Technology, 1993, pp. 549-553, vol. 30(6).

U.S. Office Action mailed Jan. 23, 2007, from U.S. Appl. No. 11/251,353.

Andryuschenko et al., "Electroless and Electrolytic Seed Repair Effects on Damascene Feature Fill," Proceedings of International Interconnect Tech. Conf., San Francisco Ca., Jun. 4-6, 2001, pp. 33-35.

Chen et al., "ECD Seed Layer for Inlaid Copper Metallisation," Semiconductor Fabtech—$12^{th}$ Edition, 5 Pages, Jul. 2000.

Ken M. Takahashi, "Electroplating Copper into Resistive Barrier Films," Journal of the Electrochemical Society, 147 (4) 1417-1417 (2000).

T.P. Moffat et al., "Superconformal Electrodeposition of Copper in 500-90 nm Features," Journal of the Electrochemical Society, 147 (12) 4524-4535 (2000).

Ritzdorf et al., "Electrochemically Deposited Copper," Conference Proceedings ULSI XV 2000, Materials Research Society, 101-107.

Reid et al., "Optimization of Damascene Feature Fill for Copper Electroplating Process," Shipley Company, IITC 1999, 3 Pages.

Reid et al., "Copper PVD and Electroplating," Solid State Technology, Jul. 2000, www.solid-state.com, 86-103.

Reid et al., "Factors Influencing Fill of IC Features Using Electroplated Copper," Adv Met Conf Proc 1999, MRS 10 Pages, (2000).

Shacham-Diamond et al., "Copper Electroless Deposition Technology for Ultr-Large-Scale-Integration (ULSI) Metallization," Microelectronic Engineering 33 (1997) 47-58.

Hu et al., "Effects of Overlayers on Electromigration Reliability Improvement for Cu/Low K Interconnects," Presented in the Proceedings of the $42^{nd}$ Annual IRPS held Apr. 25-29, 2004, p. v, article published May 28, 2004, 7 Pages.

Park et al., "Electroless Layer Plating Process and Apparatus", Novellus Systems, Inc., U.S. Appl. No. 10/235,420, filed Sep. 30, 2002.

U.S. Office Action dated Sep. 1, 2005 for U.S. Appl. No. 10/235,420.

Sullivan et al, Electrolessly Deposited Diffusion Barriers for Microelectronics, E. J. IBM J Res Develop vol. 42, No. 4 Sep. 1998, 607-620.

Eugene J. O'Sullivan, "Electroless Deposition in Microelectronics: New Trend," Electrochemical Society Proceeding vol. 99-34, 159-171.

T. Itabashi et al., "Electroless Deposited CoWB for Copper Diffusion Barrier Metals," Hitachi Research Laboratory, IEEE, 2002, 285-287.

N. Petrov and Y. Shacham-Diamand, "Electrochemical Study of the Electroless Deposition of Co(W,P) Barrier Layers for Cu Metallization," Electrochemical Soc. Proceedings vol. 2000-27, 134-148.

Yosi Shacham-Diamand and Sergey Lopatin, "Integrated Electroless Metallization for ULSI," Elecrochimica Acta, (44 (19999) 3639-3649.

Theoretical Studies on the Electroless Metal Deposition Reaction Mechanism Group, printed from website http://www.appchem.waseda.ac.jp on Jul. 3, 2002. Published prior to the filing of this application. 3 Pages.

Wolf, Silicon Processing for the VLSI Era, Lattice Press, vol. 3, p. 648.

Office Action mailed Jul. 27, 2007, from U.S. Appl. No. 11/586,394.

Mayer et al., "Pad-Assisted Electropolishing," Novellus Systems, Inc., U.S. Appl. No. 11/213,190, filed Aug. 26, 2005.

Mayer et al., "Topography Reduction and Control by Selective Accelerator Removal," Novellus Systems, Inc., U.S. Appl. No. 11/602,128, filed Nov. 20, 2006.

U.S. Office Action mailed Aug. 16, 2006 from U.S. Appl. No. 10/742,006.

Aksu et al., "The Role of Glycine in the Chemical Mechanical Planarization of Copper," Journal of The Electrochemical Society, 149 (6) G352-G361 (200), Department of Materials Science and Engineering, University of California, Berkeley, Berkeley, California 94720-1760, USA.

U.S. Final Office Action mailed Jul. 18, 2007 from U.S. Appl. No. 11/251,353.

U.S. Office Action mailed Nov. 30, 2006 from U.S. Appl. No. 10/690,084; 6 pages.

U.S. Office Action mailed Aug. 2, 2007 from U.S. Appl. No. 10/690,084.

Notice of Allowance mailed Oct. 2, 2007 from U.S. Appl. No. 10/690,084 and Allowed claims.

U.S. Office Action mailed Feb. 8, 2008 from U.S. Appl. No. 11/251,353.

Final Office Action mailed May 13, 2008 from U.S. Appl. No. 11/251,353.

Notice of Allowance mailed May 13, 2008, from U.S. Appl. No. 11/251,353 and Allowed Claims.

U.S. Final Office Action mailed Jun. 12, 2008 from U.S. Appl. No. 11/586,394.

Mori et al., "Metal Capped Cu Interconnection Technology by Chemical Mechanical Polishing," VMIC Conference, 1996, 487-492.

Hu et al., "Reduced Electromigration of Cu Wires by Surface Coating," Applied Physics Letters, vol. 81, No. 10, (2002), 1782-1784.

E.G. Colgan, "Selective CVD-W for Capping Damascene Cu Lines," Thin Solid Films, 262 (1995), 120-123.

Enhanced Copper Metallurgy for BEOL Application, IBM Technical Disclosure Bulletin, vol. 33, No. 5, (1990), 217-218).

U.S. Office Action mailed Nov. 26, 2007 from U.S. Appl. No. 11/586,394.

Notice of Allowance mailed Mar. 13, 2009 for U.S. Appl. No. 11/586,394 and Allowed Claims.

Reid et al., "Capping Beofre Barrier-Removal IC Fabrication Method," Novellus Systems, Inc., U.S. Appl. No. 12/184,145, filed Jul. 31, 2008.

U.S. Office Action, mailed Nov. 2, 2007 for U.S. Appl. No. 10/824,069.

Contolini, et al., "Electrochemical Planarization for Multilevel Metallization", Lawrence Livermore National Laboratory, J. Electrochem Soc., vol. 141, No. 9, Sep. 1994, pp. 2502-2510.

Sato, et al., "Newly Developed Electro-Chemical Polishing Process of Copper as Replacement of CMP Suitable for Damascene Copper Inlaid in Fragile Low-k Dielectrics", Advanced Process R & D Laboratories, LSI Technology Development, Semiconductor Network Company, Sony Corporation, IEDM Meeting, Dec. 2-5, 2001, pp. 1-4.

Tsai, et al., "CMP-Free CMP-Less Approached for Multilevel Cu/low-k BEOL Integration", Taiwan Semiconductor Manufacturing Company, No. 9, IEDM Meeting, Dec. 2-5, 2001, pp. 1-4.

Notification of ownership transfer of certain patents owned by NuTool, Inc., 2007.

Osterwald et al., "New Theoretical Ideas about the Action of Bath Additives During Cathodic Deposition", Galvanotechnik, vol. 66 (1975), No. 5, pp. 360-365.

Eisner, S., "Electroplating Accompanied by Controlled Abrasion of the Plate", Oct. 1971, pp. 993-996.

Osterwald, Jorg, "Leveling and Roughening by Inhibitors and Catalyst", Institute for Metallurgy of the Technical University of Berlin, vol. 17, No. 5, 1976, pp. 89-94.

U.S. Notice of Allowance, mailed May 15, 2008 for U.S. Appl. No. 10/824,069.

U.S. Office Action for U.S. Appl. No. 10/739,822 mailed May 17, 2007.
U.S. Final Office Action for U.S. Appl. No. 10/739,822 mailed Nov. 27, 2007.
Office Action as mailed on Jun. 13, 2008 for U.S. Appl. No. 11/065,708.
U.S. Office Action for U.S. Appl. No. 11/065,708 mailed Dec. 12, 2007.
U.S. Final Office Action for U.S. Appl. No. 11/065,708 mailed Nov. 12, 2008.
Notice of Allowance for U.S. Appl. No. 11/065,708 mailed Mar. 3, 2009.
U.S. Notice of Allowance, mailed Jul. 10, 2008 for U.S. Appl. No. 10/739,822.
U.S. Notice of Allowance mailed May 20, 2010 for U.S. Appl. No. 11/544,957.
Mayer et al., "Selective Electrochemical Accelerator Removal", U.S. Appl. No. 12/860,787, filed Aug. 20, 2010.
Mayer et al., "Method for Planar Electroplating", U.S. Appl. No. 11/888,318, filed Jul. 30, 2007.
U.S. Office Action mailed Jul. 9, 2010 for U.S. Appl. No. 11/888,318.
U.S. Office Action mailed Oct. 20, 2010 for U.S. Appl. No. 11/602,128.
Silva, "Applied Hydrology to Fluidic Devices", email message received May 11, 2010, 7 pages.
U.S. Office Action for U.S. Appl. No. 11/890,790 mailed Dec. 27, 2010.
U.S. Final Office Action mailed Feb. 3, 2011 issued in U.S. Appl. No. 11/888,318.
U.S. Notice of Allowance dated May 11, 2011 issued in U.S. Appl. No. 11/602,128.
U.S. Final Office Action dated Jun. 10, 2011 issued in U.S. Appl. No. 11/890,790.
U.S. Office Action dated Feb. 3, 2012 issued in U.S. Appl. No. 12/860,787.
U.S. Notice of Allowance dated Dec. 16, 2012 issued in U.S. Appl. No. 11/602,128.
U.S. Notice of Allowance dated Jun. 15, 2012 issued in U.S. Appl. No. 12/860,787.
U.S. Office Action dated Jun. 22, 2012 issued in U.S. Appl. No. 11/890,790.
Notice of Allowance dated Jun. 11, 2010 for U.S. Appl. No. 12/184,145.
U.S. Office Action dated Aug. 10, 2010 issued in U.S. Appl. No. 11/888,312.
Mukherjee et al., "Planarization of Copper Damascene Interconnects by Spin-Etch Process: A Chemical Approach", Mat. Res. Soc. Symp. vol. 612 © 2000 Materials Research Society.
KR Office Action dated Mar. 23, 2011 issued in Application No. 10-2009-0067246.
International Search Report and Written Opinion issued in Application No. PCT/US2010/043425 dated Apr. 12, 2011.
International Search Report and Written Opinion issued in Application No. PCT/US2010/047181 dated Apr. 12, 2011.
Notice of Allowance dated Jul. 12, 2011 for U.S. Appl. No. 12/875,857.
U.S. Office Action dated Mar. 9, 2012 issued in U.S. Appl. No. 12/535,594.
KR Office Action dated Oct. 24, 2011 issued in Application No. 10-2010-7027667.
SG Office Action dated Oct. 27, 2011 issued in Application No. 200905176-4.
KR Office Action dated May 28, 2012 issued in Application No. 10-2010-7027667.

* cited by examiner

*Primary Examiner* — Lan Vinh
(74) *Attorney, Agent, or Firm* — Weaver Austin Villeneuve & Sampson LLP

(57) ABSTRACT

An apparatus for wet etching metal from a semiconductor wafer comprises a wafer holder for rotating a wafer and a plurality of nozzles for applying separate flow patterns of etching liquid to the surface of the wafer. The flow patterns impact the wafer in distinct band-like impact zones. The flow pattern of etching liquid from at least one nozzle is modulated during a total etching time control the cumulative etching rate in one local etch region relative to the cumulative etching rate in one or more other local etch regions. Some embodiments include a lower etch chamber and an upper rinse chamber separated by a horizontal splash shield. Some embodiments include a retractable vertical splash shield used to prevent splashing of etching liquid onto the inside walls of a treatment container. An etch-liquid delivery system includes a plurality of nozzle flow paths having corresponding nozzle flow resistances, and a plurality of drain flow paths having corresponding drain flow resistances. Nozzle flow resistances and drain flow resistances are matched so that switching the flow from a nozzle to a corresponding drain flow path does not change the flow rate of etching liquid through other nozzles. A non-wafer-contacting measuring device measures a metal thickness on a rotating semiconductor wafer during metal wet etching by immersing a plurality of electrodes in etching liquid in close proximity to the wafer surface of the rotating wafer and determining electrical resistance between a plurality of electrodes.

34 Claims, 26 Drawing Sheets

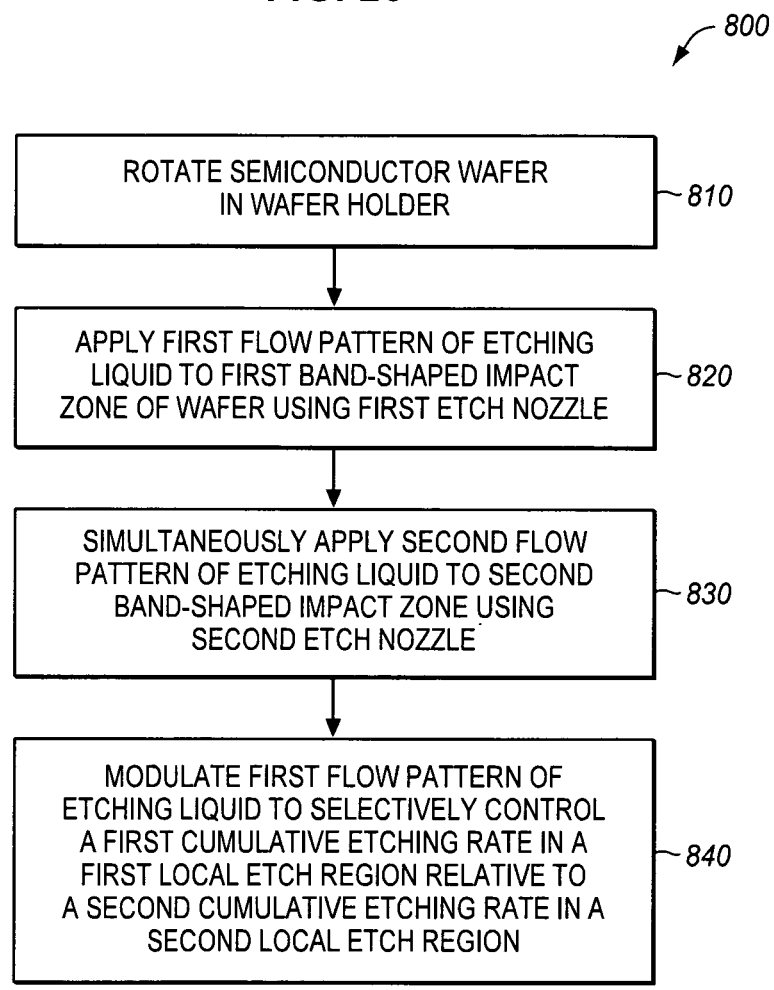

MODULATED METAL REMOVAL USING LOCALIZED WET ETCHING

RELATED APPLICATIONS

This application is a continuation-in-part application, claiming priority under 35 USC 120, of co-owned and co-pending U.S. patent application Ser. No. 11/602,128, filed Nov. 20, 2006, by Mayer et al., having the title "Topography Reduction and Control by Selective Accelerator Removal", which claims the benefit under 35 USC 119(e) of U.S. Provisional Application Ser. No. 60/737,978, filed Nov. 19, 2005, by Mayer et al. This application is also a continuation-in-part application, claiming priority under 35 USC 120, of co-owned and co-pending U.S. patent application Ser. No. 11/888,312, filed Jul. 30, 2007, by Koos et al., titled "Fabrication of Semiconductor Interconnect Structure", which is a continuation-in-part application of U.S. patent application Ser. No. 11/586,394, filed Oct. 24, 2006, by Koos et al., now U.S. Pat. No. 7,531,463, which was a continuation-in-part application of U.S. patent application Ser. No. 10/690,084, filed Oct. 20, 2003, by Koos et al., now U.S. Pat. No. 7,338,908.

These prior patent documents are incorporated herein by reference for all purposes.

FIELD OF THE INVENTION

The invention relates in general to methods and systems for forming metal features in electronic equipment, and more particularly to wet etching excess metal from semiconductor substrates during formation of metal features.

BACKGROUND OF THE INVENTION

A crucial component of integrated circuits is the wiring or metallization layer that interconnects the individual circuits. Conventional metal deposition techniques included physical vapor deposition, e.g., sputtering and evaporation, and chemical vapor deposition techniques. More recently, integrated circuit and equipment manufacturers developed electroplating (i.e., electrochemical deposition) techniques to deposit primary conductor films on semiconductor substrates.

Copper and copper alloys are widely used in the field of semiconductor fabrication as conducting materials. As a conductor, copper is often preferred to other metals, such as aluminum, due to its high electrical conductivity and good electromigration resistance properties. Because of these advantages, copper-filled lines and vias are now ubiquitously seen as conducting paths connecting elements of semiconductor devices, such as in integrated circuits. The transition from aluminum to copper wiring layers resulted in changes in process architecture towards damascene and dual damascene architecture, as well as new process technologies. Copper or other conductive metal layers are typically deposited on a dielectric layer. The dielectric layer typically contains openings, or feature cavities, (e.g., vias and trenches) that are filled with the conductive material to provide a path through the dielectric layer to previously deposited layers and to circuit devices. After the conductive material is removed from exposed field areas outside the feature cavities, only conductive material filling the feature cavities remains in the dielectric layer.

A typical damascene or dual damascene process flow scheme for fabricating copper interconnects, such as copper lines and vias, typically includes: forming a trench pattern on a layer dielectric layer using an etch-resistant photoresist; etching a trench pattern; removing the photoresist; forming a via pattern on a dielectric material using etch resistant photoresist; etching vias; removing resist; depositing a barrier (e.g., tantalum, tantalum nitride, and combination of these) and a copper seed layer (e.g. using plasma vapor deposition, PVD); electroplating copper to fill the etched feature cavities; and removing (e.g., polishing) copper and barrier off the wafer face leaving copper-filled electrically isolated interconnect circuitry.

As the number of levels in an interconnect technology is increased, the stacking of additional layers produces more rugged and complex topography. Compounding this problem, electroplating bath additives are now commonly utilized to promote rapid "bottom-up" filling of high aspect-ratio features in damascene copper electroplating processes to ensure complete void-free metal fill of high aspect ratio features (features deeper than they are wide). Baths with good "bottom-up" filling characteristics fill high aspect ratio features more rapidly and without creating void or seam when compared to baths with less effective combinations of such additives. In some cases (e.g., plating baths with superior bottom-up filling characteristics and little or no leveling additives), plating continues at an accelerated rate after completing the small-feature filling stage. When many high-aspect ratio features are located in close proximity, the high degree of adsorbed accelerator originally associated with the large surface area of that region remains after the features have filled. Hence, growth continues at an accelerated rate beyond the point of filled features, and into the period where metal between the features has merged. When this happens, a macroscopic raised area (series of thicker metallized bumps or a raised plateau) forms over the entire region above underlying high aspect ratio features. This bump formation is also termed "feature overplating" or "momentum plating".

The use of advanced "bottom-up" electrofilling techniques with wafers having both low and high aspect-ratio features has created a problem of deposited metal surfaces with a wide range of topography, that is, topography containing a large range of height and width variations in both recessed and raised areas. Commonly, features vary in width by two to three orders of magnitude on a single layer. As a specific example, a 0.5 µm-deep (thick dielectric) level can have feature widths of from 0.1 µm to 100 µm. Therefore, while electroplating is the preferred method of metallization, various aspects of improved plating regimens create challenging topography for subsequent planarization.

A principal objective of damascene circuit interconnect fabrication is to create metal isolated by and embedded in a dielectric medium. Modern copper electroplating for damascene processes proceeds by a "bottom up" fill mechanism that preferentially fills high-aspect-ratio features such as deep trenches and vias on a wafer surface. The preferential filling of recessed features requires careful control of process conditions. U.S. Pat. No. 6,946,065, titled "Process for Electroplating Metal into Microscopic Recessed Features", issued Sep. 20, 2005 to Mayer et. al., which is hereby incorporated by reference for all purposes, teaches techniques for reducing or avoiding the formation of seams and/or voids when electroplating the interior regions of microscopic recessed features. For the most part, prior art processes do not preferentially fill and planarize low-aspect-ratio features and, therefore, they require significant excess metal deposition ("overburden.") Overburden is the additional copper deposited on the substrate to ensure that all low-aspect-ratio features are completely filled (essentially in an isotropic fashion) to the plane of a base layer, that is, to the plane of the isolating dielectric surface (the "field"). Since the preferential "bottom-up" filling generally does not occur in low-aspect-ratio features, the surface of the overburden above low-aspect-ratio features typically follows the contours of the underlying low-aspect-ratio features. In most cases, the overburden on field regions is slightly thicker than the thickness of the damascene dielectric layer, typically on the order of 1.2 times the depth of the deepest feature. So, for example, a damascene structure that has 0.5 micrometers (μm) deep features typically requires an overburden of at least approximately 0.7 μm to 0.8 μm.

The goal of damascene fabrication operations is to isolate finally the individual lines within the feature cavities of the dielectric layer. Since the filling of low-aspect-ratio features is largely isotropic, plating leads to very little if any reduction in the overall topography of the surface. The step change in plated topography is essentially identical to the initial patterned cavity (recess) depth in the dielectric medium. Note that if metal overburden were isotropically removed after filling of low-aspect-ratio feature cavities, then these low-aspect-ratio features would loose metal below the plane of the dielectric (i.e., below the field plane) before the metal over high-aspect-ratio lines and the field-area metal were removed. Various approaches and techniques of plating, planarization and polishing have been developed in the prior art with the goal that metal still completely fills these low-aspect-ratio features after overburden has been removed and the individual metal lines have been isolated. These approaches and techniques generally require overburden.

A problem sometimes arises during processing of surfaces in which a large number of low aspect-ratio (larger width than depth) features exist. Wide interconnect lines (trenches cut in a dielectric layer for a damascene process) and contact/bond pads often have low aspect ratios. Low-aspect-ratio features generally require the plating of an overburden layer slightly thicker than the thickness of the damascene layer so that the feature is completely filled after planarization. The metal fill profile above these features exhibits large recesses having profiles that resemble the original low aspect-ratio feature. The metal processes used to deposit the metal, which are substantially conformal over such low aspect-ratio features, are often not continued to a point that would geometrically "close" such recesses, because to do so would require depositing a very thick metal layer. Depositing a thick metal layer would be uneconomical due to necessary removal of the large excess of metal at a later stage. Conventional electropolishing techniques can planarize a surface in which the recessed feature to be planarized is no more than perhaps three times as wide as it is deep. For features wider than these, the rate of removal is essentially uniform everywhere. When the metal layer is electropolished to the dielectric surface, recesses over low-aspect-ratio features are propagated and expanded to produce recesses that span the width of these features, leaving effectively little or no metal in the metal pad regions. This is an unacceptable result.

A through-silicon via (TSV) is a vertical electrical connection passing completely through a silicon wafer or a die. TSV technology may be used in 3D packages and 3D integrated circuits, sometimes collectively referred to as 3D stacking. For example, a 3D package may contain two or more integrated circuits (ICs) stacked vertically so that they occupy less space. Traditionally, stacked ICs are interconnected together along their edges using wires, but such wiring can have a limited bandwidth, and increases the stack's dimensions and usually requires extra layers between the ICs. TSVs provide connections through the body of the ICs leading to smaller stacks. Similarly, a 3D single IC may be built by stacking several silicon wafers and interconnecting them vertically. Such stacks behave as a single device and can have shorter critical electrical paths leading to faster operation. Typically, TSV holes may be between about 5 to 400 microns deep (often between about 25 to 150 microns deep). The diameter or width dimension of TSV holes may vary between about 1 to 100 microns (more typically between about 5 to 25 microns). The TSV holes typically have a high aspect ratio, which is defined as the ratio of the TSV-hole depth to the TSV-hole diameter (usually at the opening). In certain applications, the TSV hole aspect ratio may vary between about 3:1 to 10:1. TSV size also depends on which stage of the overall 3D stacking process includes TSV formation. The filling of TSV holes using electroplating techniques often results in the deposition of thick non-planar copper layers characterized by depressions, or "dimples", or by mounds or protrusion, located above TSV feature cavities.

Similar problems may arise from chemical (nonelectrolytic) wet etching of metal from a substrate surface. U.S. Pat. No. 5,486,234, issued Jan. 23, 1996, to Controlini et al., which is hereby incorporated by reference, teaches a method of spin-spray wet etching. To be of greatest utility, wet etching should generally proceed isotropically; that is, there is no selection between etching of metal from peaks and valleys of the substrate surface and etching occurs over the surface at substantially the same rate everywhere. In some circumstances, if chemical wet etching were conducted long enough to remove substantially the metal over field areas and above "overplated" high-aspect-ratio features of a nonplanar substrate, then excessive over-etching of metal and generation of recesses in low-aspect-ratio features would result.

There exists, therefore, a need for improved technology for planarizing conductive layers embedded in dielectric substrates having various feature sizes, particularly having both very narrow (submicron) and very wide (on the order of 100 μm) feature widths. Similarly, there exists a need in the semiconductor industry for planarizing thin metal films and fine metal interconnect lines inlaid on a patterned substrate that includes dielectric and barrier layer materials. There is also a need for removing thick metal layers from semiconductor substrates; for example, copper layers resulting from TSV filling.

SUMMARY OF THE INVENTION

The invention helps to solve some of the problems and to satisfy some of the needs mentioned above by providing systems, apparatuses, methods and compositions for controlled, localized chemical wet etching of metal from integrated circuit substrates. Control of cumulative etching in one or more local etch regions over a total etching process time is achieved by modulating the flow of etching liquid in at least one area of the substrate surface. A feature of embodiments in accordance with the invention is localized metal etching, compared to more common global treatments of the prior art. Localized wet etching of a semiconductor wafer is better able than global techniques to address non-uniformities on a macroscopic scale, for example, differences in metal thicknesses between different areas across a substrate wafer. Embodiments in accordance with the invention help to solve the problem of highly variable and difficult-to-control topography that commonly results from damascene copper electroplating processes.

A basic embodiment of a method of removing metal from a semiconductor wafer using localized wet etching comprises: rotating a semiconductor wafer in a wafer holder; applying a first flow pattern of etching liquid to a first band-like impact zone of the rotating semiconductor wafer using a first etch nozzle during at least a portion of a total etching time; and, simultaneously applying a second flow pattern of etching liquid to a second band-like impact zone using a second etch nozzle during at least a portion of the total etching time. The first impact zone and the second impact zone are spatially distinct from each other, meaning they do not overlap, or at least do not overlap significantly. A first cumulative etching rate in a first local etch region of the semiconductor wafer is selectively controlled relative to a second cumulative etching rate in a second local etch region by modulating the first flow pattern of etching liquid. It is understood that the different cumulative etching rates in two or more different local etch regions may be influenced by flow patterns of etching liquid generated by two or more etch nozzles. In some embodiments, only one flow pattern is modulated to influence and to control cumulative etching rates. In some embodiments, two or more flow patterns are modulated either simultaneously or sequentially during a total etching time to control cumulative etching rates in two or more local etch regions.

In some embodiments, at least of one of the first band-like impact zone and the second band-like impact zone has a substantially elongated rectangular shape (typically greater than 8 times longer in extent than in width) and extends substantially and in many cases completely across the semiconductor wafer substantially parallel to a wafer diameter. In some embodiments, the first impact zone has a radial width in a range of about from 5 mm to 20 mm, and the second impact zone similarly has a radial width in a range of about from 5 mm to 20 mm. In some embodiments, at least one of the first band-like impact zone and the second band-like impact zone has a substantially arced shape and extends completely across the semiconductor wafer. In some preferred embodiments, at least one of the first etch nozzle and the second etch nozzle applies a three-dimensional (3-D) flow pattern of etching liquid that extends close to or beyond the peripheral edges of a semiconductor wafer.

In some embodiments, the first etch nozzle modulates the first flow pattern of etching liquid through one or a combination of the following techniques: by cessation of etching liquid flow; by ceasing flow of etching liquid and then applying deionized water to the first impact zone; by ceasing flow of etching liquid and then applying an etching quenchant to the first impact zone; by changing a flow rate of etching liquid; by changing a composition of etching liquid; by changing a concentration of etching liquid; and, by changing a shape of the first flow pattern. In some embodiments, the first etch nozzle and the second etch nozzle apply etching liquid substantially normal to the surface of a semiconductor wafer. In some embodiments, the first etch nozzle applies the first spray pattern to the first band-like impact zone at an angle in a range of about from 5° to 15° to the surface of a semiconductor wafer so that an inside edge of the first impact zone is offset from the center of the semiconductor wafer by a radial distance in a range of about from 5 mm to 25 mm. In some embodiments, the total flow in the first band-like impact zone is between 200 and 1000 milliliters (or cubic centimeters of fluid) per minute. In some embodiments, the average fluid impact velocity in the direction of the surface (determinable, for example, by dividing the total fluid flow emanating from the nozzle by the fluid impact area, corrected for the slight angle of impact) is between about 5 and 50 cm/sec. Some embodiments further comprise using one or more movable nozzle supporting arm(s) to position the plurality of etch nozzles over the wafer to dispose the plurality of etch nozzles streams substantially above a rotating semiconductor wafer in the wafer holder during localized etching. Some embodiments further comprise moving the nozzle arm to a position in which the nozzle arm and the etch nozzles are not directly above a semiconductor wafer in the wafer holder, including completely retracting the arm and nozzles so some or all of the nozzles do not reside over the wafer. Some embodiments further comprise moving the nozzle arm to an etching position in which a plurality of the etch nozzles are substantially aligned with a radius of a semiconductor wafer in the wafer holder. Some embodiments further comprise adjusting the radial position of at least one of the plurality of etch nozzles relative to the center of a semiconductor wafer. Some embodiments further comprise moving the nozzle arm in a direction perpendicular to a semiconductor wafer in the wafer holder to change the distance of the plurality of etch nozzles from the semiconductor wafer. Some embodiments further comprise adjusting at least one of a plurality of the etch nozzles supported on the nozzle arm to change the distance between the at least one etch nozzle and a semiconductor wafer. Some embodiments further comprise rinsing external surfaces of the nozzle arm and etch nozzles (e.g. with water or an etching quench fluid) using a rinse nozzle. Some embodiments further comprise rinsing the etch nozzles using a rinse nozzle when substantially no etching liquid is flowing through the etch nozzles. In some embodiments, the rinsing of the nozzles and arms may occur simultaneously with the flowing of etch line and wafer surface rinsing/flushing or quenching fluid (e.g., DI water or a solution containing an alkaline etch quench, such as tetramethylammonium hydroxide).

In some embodiments, a wafer holder, the semiconductor wafer and the etch nozzles are located in a treatment container, and the method further comprises rinsing etching liquid from treatment container walls using a plurality of rinse nozzles. Some embodiments further comprise moving the semiconductor wafer between an etch chamber or subchamber and a rinse chamber or subchamber, such as by moving the wafer from one processing module to a subsequent module, or by moving the wafer to a different section within the etching module where rinsing is performed. Etching liquid is applied in the etch chamber or subchamber, the wafer is then typically coarsely rinsed in the etch chamber or subchamber, and then etching liquid is thoroughly rinsed from the semiconductor wafer in the rinse chamber or subchamber.

In some embodiments, the wafer holder, the semiconductor wafer, the etch nozzles and the rinse nozzle are located in a treatment container, and the method further comprises positioning a retractable splash shield in an active position (e.g., in a vertical up position around the wafer periphery, or in a horizontal closed position above the wafer) while applying the etching liquid to the semiconductor. In some embodiments, a vertical splash shield substantially surrounds the semiconductor wafer in the wafer holder and is located between the wafer holder and an outer wall of the treatment container to inhibit etching liquid from splashing onto the outer wall. During rinsing, the inner vertical movable splash shield is in a down (or inactive) position so that the vertical rinse shield is not proximate to the surface plane of the semiconductor wafer in the wafer holder.

Some embodiments comprise measuring or determining the average metal removal rate during etching. Examples of measuring techniques include optical absorption spectroscopy of the waste stream (e.g., an appropriately optimized wavelength, typically between 450 and 550 nm for the preferred etch chemicals of this invention) can be used for this purpose. Some embodiments further comprise measuring a metal thickness on the semiconductor wafer during etching using a non-wafer-contacting measuring device. Various methods include eddy current, reflection optics and acoustics.

In some embodiments, measuring metal thickness comprises immersing a plurality of electrodes in etching liquid in close proximity to the wafer surface of the rotating semiconductor wafer and determining electrical resistance between a plurality of electrodes. By passing an AC electrical signal, and using appropriate phase lock amplifiers, the in and out of phase response signals (for example, the measured in and out of phase voltages for a modulating sine wave current) between a set of electrodes arrayed over the wafer can be determined, from which the capacitance and resistance of various path lengths over the surface can be derived. This information can then allow one to calculate or calibrate the system for a particular electrode-set/wafer gap, electrode spacing, electrolyte, and metal film thickness, for deriving the metal thickness of an unknown film during an etching process.

Because the etch rate can be sensitive to small fluctuations in temperature, in some embodiments the temperature of the etching liquid is measured inline and just prior to reaching the wafer surface. Furthermore, in some embodiments, the concentration of etch chemicals (primarily the concentration of a bi-, tri-, and tetra-dentate amine and/or amino acid) is changed to achieve a constant target etch rate. In other embodiments, the temperature is controlled by passing one or more of the etch components (before or after inline mixing of the components) though an appropriately designed heat generating or heat exchanging device.

In some preferred embodiments, an etching liquid comprises a compound containing a bi-, tri- or tetra-dentate amine and/or carboxylate group, suitable for complexing copper, such as multifunctional amines or amino acids, and an appropriately selective oxidizing agent. In some preferred embodiments, the etching liquid further comprises pH-adjusting components, such as an acid or base at a concentration to modify the pH of the etching liquid to a value between about 8 and 10.5. A solution containing about 1.4%/wt of ethylenediamine, 1.4%/wt glycine, 0.06%/wt acetic acid, 0.025%/wt sulfuric acid, and 4% hydrogen peroxide is an exemplary preferred etching solution. Examples of other preferred etching solutions are described in co-owned and co-pending United States patent application having the title "Wet Etching Methods for Copper Removal and Planarization in Semiconductor Processing", filed Aug. 4, 2009, by Mayer et al., which is hereby incorporated herein by reference.

A basic embodiment of an apparatus for removing metal from a semiconductor wafer using localized wet etching comprises: a wafer holder for supporting and rotating a semiconductor wafer; and a plurality of etch nozzles. Use of a plurality of etch nozzles has a number of advantages, including, but not limited to: 1) allowing the control of the etching rate profile over the wafer; 2) applying different flow rates to different regions of the wafer; 3) applying different chemicals or chemical concentrations at various times during the process to different impact zones of the wafer; and 4) minimizing the total required amount of etchant (etching liquid) supplied to the wafer surface to achieve uniform etching (e.g., relative to a single nozzle that would spray the entire wafer simultaneously). A first etch nozzle is operable for applying a first flow pattern of etching liquid to form a first band-like impact zone of etching liquid on a rotating semiconductor wafer. A second etch nozzle is operable for applying simultaneously a second flow pattern of etching liquid to form a second, band-like impact zone of the etching liquid on the rotating semiconductor wafer that is spatially distinct from other impact zones. The first etch nozzle is operable for modulating the first flow pattern of etching liquid to selectively control a first cumulative etching rate in a first local etch region of the semiconductor wafer relative to a second cumulative etching rate in a second local etch region. Preferably but not necessarily, each of the first etch nozzle and the second etch nozzle is operable to apply a 3-dimensional flow pattern of etching liquid that extends beyond peripheral edges of a semiconductor wafer. In some embodiments, the first etch nozzle is operable for modulating the first flow pattern of etching liquid using one or a combination of the following techniques: by ceasing flow of etching liquid; by ceasing flow of etching liquid and then applying deionized water to the first impact zone; by ceasing flow of etching liquid and then applying an etching quenchant to the first impact zone; by changing a flow rate of etching liquid; by changing a composition of etching liquid; by changing a concentration of etching liquid; by changing the location of the impact zone, and, by changing a shape of the first flow pattern. In some embodiments, the first etch nozzle and the second etch nozzle are operable to apply etching liquid substantially normal to the surface of a semiconductor wafer, thereby maximizing the amount of convective mixing and defining a relatively small region of high impacting fluid.

In some embodiments, the first etch nozzle is operable to apply the first spray pattern to the first band-like impact zone at an angle in a range of about from 5° to 15° to the surface of a semiconductor wafer so that an inside edge of the first impact zone is offset from the center of the semiconductor wafer by a radial distance in a range of about from 5 mm to 25 mm. Tuning of this precise location of the high impact area, the angle of fluid flow, the wafer rotation rate and fluid flow rate and velocity has a significant influence on the etch rate of the very center of the wafer, and is critical in achieving optimal etch rate uniformity. Because the flow impact band is close to, but not directly over, the wafer center, the center region receives fluid that first hits the wafer, etches the surface for a short time, and then moves forward toward the center, carried by its flow momentum, after which it is drawn outward as it is accelerated outward by rotational shear-generated pumping action. Therefore, while other, more radially-outward positions pass under and out from the direct high-velocity spray of etching liquid in one or more impact zones, the central region only receives secondary fluid flow. While not being bound to our model described in more detail below, its is believed that the etch rate at the center is substantially time invariant, but generally is a slower rate than at wafer regions that pass under etching liquid flow patterns in the impact zones. It is believed the slower etch rate is due to the diminished level of convection and the presence of partially reacted etching liquid at the center. However, this lower rate of etching at the central region of the wafer is offset by the fact that it receives a continuous supply of etchant and etches at a substantially constant rate over time (e.g., during a single wafer rotation cycle). While this rate may be slightly less than the rate which occurs in the high impact zone, it is generally greater than at other locations at certain times in the rotation cycle, when the etchant is not being replenished with fresh high-velocity etchant. Hence, the lower continuous etch rate can be commensurate with the time-integral etch rate at other radial locations, where the etch rate cycles between high etch rates in the high-impact zone, and a lower rate, when not in the high-impact zone.

Some embodiments further comprise a nozzle arm for supporting the plurality of etch nozzles and for disposing the plurality of etch nozzles substantially above a rotating semiconductor wafer in the wafer holder during localized etching. In some embodiments, the nozzle arm is movable to a position in which the nozzle arm and the etch nozzles are not directly above a semiconductor wafer in the wafer holder. Some embodiments further comprise a treatment container in which the wafer holder, the etch nozzles and the nozzle arm are located, and the treatment container includes a nozzle-arm alcove to which the nozzle arm is movable so that the nozzle arm and the plurality of etch nozzles are not directly above the wafer holder. While in the alcove, any etch chemistry on the nozzles or on the nozzle arm is prevented from being scattered back on to the wafer; for example, from wafer rinse water or the like. In some embodiments, the nozzle arm is movable to an etching position in which a plurality of the etch nozzles are substantially aligned with a radius of a semiconductor wafer in the wafer holder. In some embodiments, the radial position of at least one of the plurality of etch nozzles relative to the center of a semiconductor wafer is adjustable. In some embodiments, the nozzle arm is movable in a direction perpendicular to a semiconductor wafer in the wafer holder to change the distance of the plurality of etch nozzles from the semiconductor wafer. In some embodiments, at least one of a plurality of the etch nozzles supported on the nozzle arm is independently adjustable from the other nozzles so that the distance between the at least one etch nozzle and a semiconductor wafer in the wafer holder is independently adjustable. In some embodiments each of the nozzles are formed as a number of long, thin (e.g., less than 1.5 mm in width) rectangular openings or slots that directs fluid substantially normal to the wafer surface. In a particularly preferred embodiment, the multiple nozzles are constructed to allow fluid to exit from the surface closest to the wafer in a thin rectangular jet, each nozzle being part of a single multi-nozzle-containing element. For example, the multi-nozzle containing element may have the general shape of a hemispherical plate, with the plate placed approximately parallel to and in close proximity over the wafer (e.g., within 10 to 50 mm). Furthermore, the element or plate may have two or more internal fluid-directing manifolds that feed chemicals, water, and quenchant to two or more of the slot nozzle openings independently. The plate can then be raised and lowered as required, and simultaneously can serve to block etchant from spraying upwards, outwards, or ending up in other undesirable locations in the reactor chamber, as well as allowing for efficient dispensing of fluids. Some embodiments of an apparatus, further comprise a rinse nozzle for rinsing the nozzle arm or plate and the etch nozzles. Some embodiments further comprise a rinse nozzle for rinsing the etch nozzles when substantially no etching liquid is flowing through the etch nozzles. Some embodiments further comprise a treatment container in which the wafer holder and the etch nozzles are located, a plurality of rinse nozzles for rinsing etching liquid from treatment container walls, and a rinse manifold for supplying the rinse nozzles with rinsing liquid.

Some embodiments further comprise a lower etch chamber; an upper rinse chamber that is at least partially isolated or isolate-able; a rinse nozzle for rinsing a semiconductor wafer in the upper rinse chamber; and a horizontal splash shield (stationary or activate-able, such as by using an iris-like shielding mechanism), between the lower etch chamber and the upper rinse chamber. The wafer holder is operable to move a semiconductor wafer between the lower etch chamber and the upper rinse chamber. Some embodiments further comprise a nozzle arm for supporting the plurality of etch nozzles and for disposing the plurality of etch nozzles substantially above a rotating semiconductor wafer in the lower etch chamber during localized etching. The nozzle arm is movable to a position in which the nozzle arm and the etch nozzles are not directly above a semiconductor wafer in the wafer holder. In some embodiments, the lower etch chamber includes a nozzle-arm alcove, and the nozzle arm is movable into the nozzle-arm alcove to a location in which the nozzle arm and the plurality of etch nozzles are not directly above the wafer holder. In some embodiments, the rinse nozzle is operable to rinse the nozzle arm and the etch nozzles in the lower etch chamber. Some embodiments further comprise a lower rinse nozzle that is operable to rinse the nozzle arm and the etch nozzles in the lower etch chamber.

Some embodiments of an apparatus further comprise: a treatment container in which the wafer holder and the etch nozzles are located; and a retractable vertical splash shield that is operable in an up (shielding, or active) position and in a down (or non-shielding inactive) position. The vertical splash shield in the up position substantially surrounds a semiconductor wafer in the wafer holder and is located between the wafer holder and an inner wall of the treatment container and serves to inhibit etching liquid from etch nozzles and from a spinning semiconductor wafer from splashing onto the inner wall. The vertical splash shield may consist of a reticulated bellows-like conical element, which can collapse to a relatively small vertical dimension when retracted. In some embodiments, the treatment container includes a nozzle-arm alcove to which the nozzle arm is movable so that the nozzle arm and the plurality of etch nozzles are not directly above the wafer holder. Some embodiments further comprise a rinse nozzle for rinsing a semiconductor wafer.

A basic embodiment of an etch-liquid delivery system for providing etching liquid through a plurality of etch nozzles used for localized etching of metal on a semiconductor wafer comprises: a plurality of etch nozzles, each of the etch nozzles being operable for applying etching liquid onto a semiconductor wafer; a plurality of delivery valves, each of the delivery valves having a delivery valve inlet and a delivery outlet; a plurality of nozzle tubes, each of the nozzle tubes connecting a delivery outlet of a delivery valve to a corresponding etch nozzle; and an etching-liquid supply connected to each of the delivery valve inlets.

Some embodiments further comprise at least one drain tube, each drain tube being connected to a drain outlet of a corresponding delivery valve. Each nozzle tube and corresponding etch nozzle form at least part of a nozzle flow path having a nozzle flow resistance to the etching liquid. Each drain tube forms at least part of a drain flow path having a drain flow resistance to the etching liquid. Each drain flow resistance is substantially equal to a corresponding nozzle flow resistance. A preferred etch-liquid delivery system is generally characterized in that switching flow of etching liquid through a delivery valve from an etch nozzle to a drain valve does not substantially affect a flow rate of etching liquid through another etch nozzle. Some embodiments further comprise a plurality of valve inlet tubes, wherein each valve inlet tube is connected at a first end to the etching liquid supply and at a second end to a corresponding delivery valve inlet. In some embodiments, the etching liquid supply comprises a supply tube that is connected to the valve inlet tubes. In preferred embodiments, the etching liquid supply comprises an inline mixing bowl connected to the supply tube, the inline mixing bowl being operable to form etching liquid immediately before the etching liquid flows through the supply tube. In some embodiments, the etching liquid supply comprises an inline mixing bowl and the delivery system further comprises a plurality of source lines and a plurality of flow meters. Each source line is operable for flowing an etching-liquid ingredient into the inline mixing bowl. The plurality of flow meters includes at least one control flow meter. Each of the flow meters is operable to measure flow of an etching-liquid ingredient in one of the source lines, and the control flow meter is operable to adjust the flow rate of a least one etching-liquid ingredient in at least one source line to maintain a desired concentration of the at least one etching-liquid ingredient in the inline mixing bowl. For example, the mixing in the mixing bowl enables the rapid and complete combining of: (1) a stream of concentrated (preferred isotropic copper complexing) etchant agent precursors with (2) a stream of an oxidizer (e.g., a solution of approximately 30% hydrogen peroxide in water) with (3) a stream of deionized water. One or more of the liquid streams may be independently controllable to allow for modulation of the etching rate. Some preferred embodiments of an etch-liquid delivery system further comprise a ligand source containing a ligand solution having a pH value in a range of about from 5 to 12, an oxidizer source, and a water source containing de-ionized water. Each of the source lines connects one of the sources to the inline mixing bowl. In some preferred embodiments, the ligand solution comprises one or more amine or amino acid species. Particularly suitable and preferred isotropic concentrated copper complexing agent precursors include bi-dentate, tri-dentate, and tetra-dentate amine and carboxylic containing complexing agents (e.g. glycine, ethylenediamine, diethylenetriamine) that are pH adjusted to a suitable alkaline pH between pH 8.5 and 12, for example between 9.5 and 11, using an optional pH-adjusting component. Examples of the optional pH adjusting component include relatively weak carboxylic acid (e.g. citric acid, acetic acid), a strong inorganic acid (e.g., sulfuric acid) or an organic or inorganic base (e.g., tetramethylammonium hydroxide, potassium hydroxide). Because the chemical etch mixture is generally inherently unstable, with decomposition times sometime as short as a 1-5 minutes, and because its highly desirable isotropic and smooth etching properties can be very temporal, inline mixing of the components followed by and immediate application of the mixture is desirable. Furthermore, decomposition products and instability are generally associated with the oxidizer, and when a decomposition product is in gaseous form (as when using hydrogen peroxide, which rapidly forms oxygen in alkaline solutions), appropriate means of continuously eliminating generated gas bubbles (such as using a series of high impact flow zone nozzles) may be desirable.

In some embodiments the apparatus further includes process monitoring elements to measure the temperature, pH, density or other chemical etch effecting of relevant variable in the mixing bowl or after the bowls outlets. In some embodiments, the data from the monitoring elements is use to determine how to modify the flow rates of one or more of the etch precursor elements (e.g. complexing concentrate, oxidizer, or water flow rates) so as to maintain consistency in chemical composition and etch rate behavior.

Other features, characteristics and advantages of embodiments in accordance with the invention will become apparent in the detailed description below.

BRIEF DESCRIPTION OF THE DRAWINGS

A more complete understanding of the invention may be obtained by reference to the drawings, in which:

FIG. 26 contains a process flow sheet of a generalized method in accordance with the invention for removing metal from a semiconductor wafer using localized wet etching.

DESCRIPTION OF THE INVENTION

Figure 1:
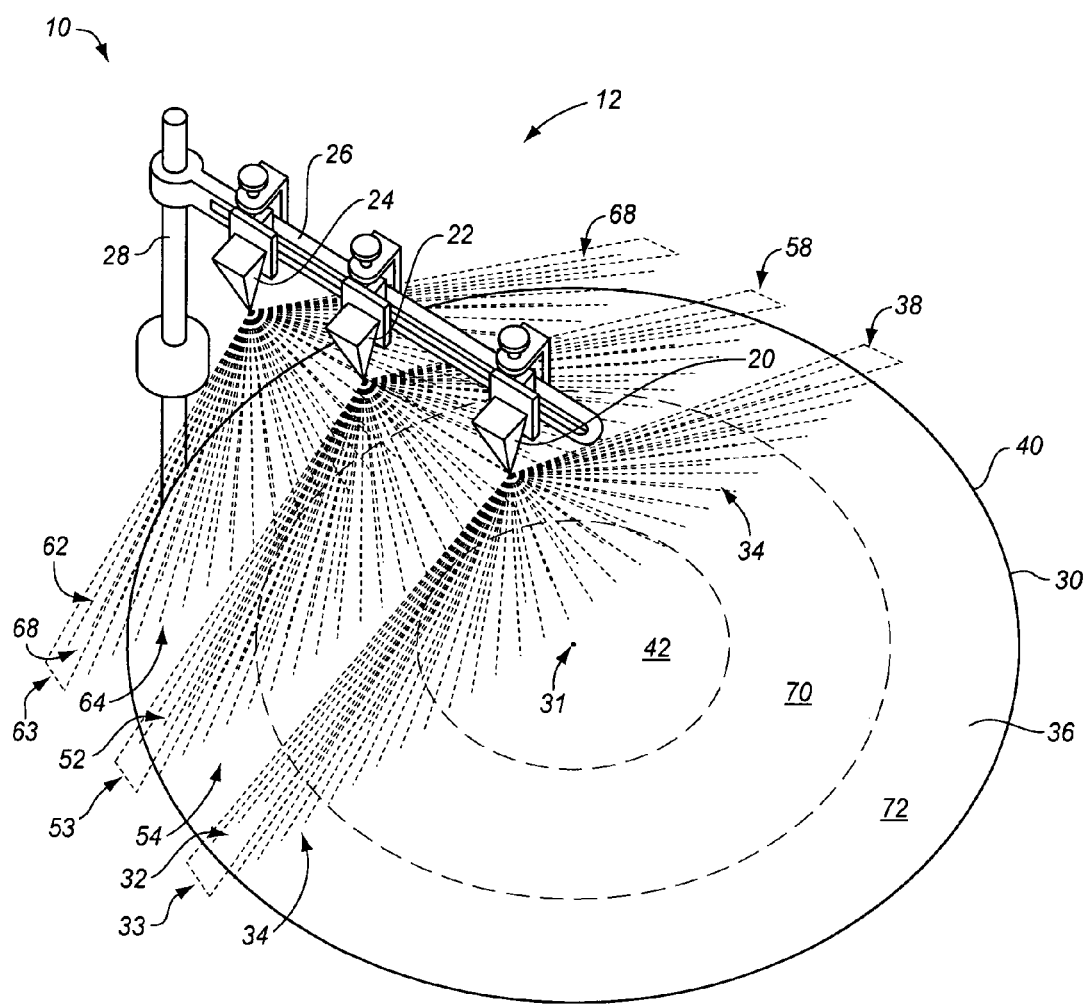
FIG. 1 depicts schematically a perspective view of a simplified system in accordance with the invention for performing localized etching of metal from the surface of a semiconductor wafer.

The invention is described herein with reference to FIGS. 1-26. It should be understood that the structures and systems depicted schematically in the figures serve explanatory purposes and are not precise depictions of actual structures, apparatuses, and systems in accordance with the invention. Furthermore, the embodiments described herein are exemplary and are not intended to limit the scope of the invention, which is defined in the claims below. For the sake of clarity, parts and elements of various embodiments having similar structure and function are identified using the same reference numerals in the figures below. It is understood that some methods in accordance with the invention and resulting structures do not necessarily include all of the processes and structures represented and discussed with reference to FIGS. 1-26. It is also understood that some methods in accordance with the invention and resulting structures also include processes and structures not represented or discussed with reference to FIGS. 1-26.

The terms "semiconductor wafer", "wafer", "substrate" and similar related terms herein generally refer to an entire workpiece as well as any object on which some material is deposited, removed or otherwise treated. In this disclosure, the also refer to the surface of a workpiece as it exists at a particular phase of fabrication and on which a particular fabrication process is being conducted.

In this specification, terms of orientation, such as "face-up", "above", "below", "up", "down", "top", "bottom", and "vertical" used to describe embodiments relate to the relative directions in the figures (e.g., FIGS. 1, 2, and 6-14), in which a semiconductor wafer defines a substantially horizontal plane. It is understood, however, that the spatial orientation of substrates and apparatuses in embodiments in accordance with the invention are not confined to those depicted in the drawings. For example, in some embodiments in accordance with the invention, the plane of the surface of a semiconductor wafer on which etching is conducted is substantially vertical and a plurality of etch nozzles are operable to spray etching liquid with a velocity having a substantially horizontal component onto the surface of the wafer. In some embodiments, therefore, one or more etch nozzles are disposed so that one or more lines perpendicular to the surface of the wafer would intersect one or more etch nozzles. The use of these same terms with respect to orientations relative to the Earths horizon are generally not meant to be implied or otherwise limiting.

The term "species" is used broadly to include an atom, a molecule, a molecular fragment or group, and their combinations and complexes.

The words "area" and "region" are used synonymously in this specification to refer to an area on a semiconductor wafer surface. Particularly, the terms "local etch region", "etch region" and related terms refer generally to a region on the surface of the semiconductor wafer that is less than the total area of the wafer surface and in which the cumulative amount of metal etching during a total etching time is substantially the same. In this specification, the term "cumulative etching rate" and related terms means the total thickness of metal removed from a particular point or a particular region on a semiconductor wafer divided by the total etching time. For example, if 2000 Å of metal is removed substantially uniformly from a local etch region during a total etching time of two minutes, then the cumulative etching rate in that local etch region is 1000 Å per minute. The cumulative etching rate in a local etch region is essentially an average etching rate measured over a total etching time, and may be very different from particular instantaneous etching rates in the local etch region during the total etching time, or even the average etching during a given wafer rotation cycle (when applicable).

The term "impact zone" and related terms is used to designate an area on the surface of a semiconductor substrate at which a flow pattern of etching liquid (or other liquid) from a particular etch nozzle impacts a semiconductor wafer that is moving relative to the flow pattern (e.g., typically by rotating). Since a wafer is rotating during localized etching in most typical embodiments in accordance with the invention, an impact zone is substantially an instantaneous impact zone, which results in showering a 360° swath on the wafer. An impact zone in accordance with the invention is associated with a particular etch nozzle and the particular flow pattern of liquid applied by the etch nozzle. It is understood that relative motion between etch nozzles and wafer is achievable by other techniques in addition to, or instead of, wafer rotation; for example, by rotating one or more nozzles, or by scanning the nozzles in a raster pattern fashion, or by moving the wafer in a raster pattern. An impact zone has no direct relation with any particular local etch region. A particular local etch region associated with a particular cumulative etching rate over the total etching time is influenced by a large number of factors, sometimes including the effects of liquid flow patterns from a plurality of etch nozzles and the relative fractional and cumulative time under the direct flow of a plurality of etch nozzles' impact zones.

The term "simultaneous" and related terms means that there is at least some overlap of the time periods in which one or more processes are occurring. For example, it does not mean that whenever a first method step is occurring (e.g., applying a first flow pattern of etching liquid to a first impact zone) that another step (e.g., applying a second flow pattern of etching liquid to a second impact zone) must occur during the entire time that the first step is occurring.

The terms "isotropic etching", "isotropic removal" and related terms are used in this specification in their usual sense to designate an etching process or other type of material removal operation in which the rate of the etching reaction or other material removal technique is substantially the same in any spatial direction, and generally etches in this manner largely independent of any particularly surrounding structures or pattern of material. The term "kinetically-controlled isotropic removal", "surface-kinetics-controlled isotropic etching" and related terms relate to metal removal techniques in which the material removal rate from a substrate surface is apparently controlled by the reaction kinetics of etching reactions rather than by diffusion processes from the etching solution to or from the surface. Kinetics-controlled etching is characteristically different from diffusion-controlled etching in that kinetics-controlled etching is generally independent of feature size, feature separation, feature density, position within a feature and other geometric factors. It also can have the properties of etching at a rate that is substantially invariant with respect to the particularly crystal orientation of a particular exposed substrate grain thereby avoiding surface roughening or faceting. In some embodiments, kinetics-controlled isotropic etching is more desirable than diffusion-controlled isotropic etching.

The terms "etching liquid", "etching solution", "etchant" and related terms are used substantially synonymously in this specification to refer generally to a liquid suitable for application to a semiconductor wafer using a spray nozzle or other liquid applicator to etch metal from the wafer surface in accordance with the invention. The terms "diluent", "quenching liquid", "quenchant" and similar terms are used broadly to refer to a fluid (usually a liquid, but in some embodiments a gel, a dispersion or a gas) used to rinse away, dilute or quench (i.e., deactivate) an etching liquid. An exemplary diluent is deionized water to dilute and to rinse away an etching liquid, and thereby to quench substantially a chemical etching reaction. In some embodiments, etching in one or more local etch regions is substantially slowed, stopped or otherwise terminated (e.g., by pH modulation, dilution, chemical quenching, change in temperature) for at least a portion of the total etching time. In some embodiments, quenching of etching reactions conducted using an etching solution comprising an oxidizing agent and an oxide-etching agent is effected by shifting the pH value. In some embodiments, application of a highly alkaline solution to an impact zone of a wafer to increase the pH above pH 12 effectively slows or can even stops etching altogether. In some embodiments, application of a highly acidic solution to an impact zone of a wafer to decrease the pH below pH 3 effectively slows or stops etching. In some embodiments, application of a solution containing a copper-complexing agent at a concentration of about 50 weight percent (wt %), or greater, effectively stops metal oxidation. U.S. patent application Ser. No. 11/602,128, filed Nov. 20, 2006, by Mayer et al., which is incorporated by reference, teaches systems and methods for diluting and quenching chemical etching reactions.

The term "topography" and related terms used in the specification refer principally to the topographic relief of a substrate, that is, to characteristics of surface relief such as surface contours, protrusions, planar field areas, feature cavities and recesses. This is in contrast to other uses of the word "topography" in the semiconductor arts that are related to the circuit patterns and their material compositions in integrated circuits.

The term "local etching", "localized etching", "local removal" and related terms refer to etching that is conducted in a region (or area) of a substrate that is less than the total substrate surface at any given time. It is understood that modulated chemical etching of metal in accordance with the invention typically results in fine-tuned metal etching across a substantial portion or the whole of a wafer surface.

The terms "move", "movement" and related terms are used in their normal sense to refer to several kinds of movement. In one sense, the terms refer to relative movement of a semiconductor wafer (or other substrate) with respect to a plurality of etch nozzles or with respect to a plurality of etching liquid flow patterns (e.g., sprays) directed at the wafer surface. Generally, in embodiments in accordance with the invention, such relative movement is accomplished by rotating a semiconductor wafer while etching liquid is being applied at any given moment by one or more etch nozzles. In some embodiments, however, relative movement of the wafer surface with respect to etching liquid being applied to it is achieved by relatively small periodic changes in the direction of etching liquid as it is sprayed or otherwise applied to the wafer surface in addition to or instead of wafer rotation. For example, in some embodiments one or more of a plurality of etch nozzles are moved periodically so that one or more instantaneous local impact zones of etching liquid on the wafer surface change periodically. The terms "move", "movement" and related terms also refer to gross movements of various elements of an apparatus, such as the movements of a wafer holder, a rinsing shield or a nozzle support arm. The terms also used in a broad sense to include relative movement. For example, "moving" a semiconductor wafer between an etch chamber and a rinse chamber also includes maintaining the location of the wafer while actually moving etch and rinse chambers. Similarly, rotating the wafer also includes holding the wafer stationary and rotating the nozzles around the wafer.

In this specification, the word nozzle as used in the terms "etch nozzle", "rinse nozzle" and related terms refers broadly to any type of nozzle or other device useful for spraying or otherwise applying liquid to a solid surface or surfaces. In this specification, the term "plurality of nozzles" and related terms refers to any device or group of devices capable of forming a plurality of liquid flow patterns, for example, a plurality of etching liquid sprays. Etch nozzles are operable to generate and to apply distinct patterns of etching liquid to distinct band-like impact zones on a rotating semiconductor wafer to control a cumulative etching rate (over a total etching time) in a first local etch region relative to the cumulative etching rate in at least a second local etch region. In some embodiments, an etch nozzle is used for applying a non-etching liquid, such as deionized water or etching quenchant, to an impact zone of a semiconductor wafer in addition to or instead of applying etching liquid. Typically, control of cumulative etching in one or more local etch regions is achieved by modulating the flow of etching liquid in at least one of the plurality of etch nozzles. Flow of etching liquid through a particular etch nozzle is modulated using one or a combination of various techniques; for example, including but not limited to: stopping or starting the flow of etching liquid through the nozzle; stopping or starting the flow of another liquid through the nozzle (e.g., deionized water or etch quenchant); changing the flow rate of liquid through the nozzle; changing the concentration and/or composition of etching liquid; changing the angle of incidence of a spray pattern to the wafer; and changing the shape and/or dimensions of a liquid spray pattern and its corresponding impact zone. Co-owned and co-pending U.S. patent application Ser. No. 11/602,128, filed Nov. 20, 2006, which is incorporated by reference, teaches systems and methods in which one or a plurality of nozzles is used to perform localized wet etching of copper or other metal from the surface of a semiconductor wafer. Etching solutions suitable for controlled etching in local etch regions in accordance with the present invention are disclosed in U.S. patent application Ser. No. 11/602,128, in U.S. patent application Ser. No. 11/888,312, filed Jul. 30, 2007, by Koos et al., and in United States patent application having the title "Wet Etching Methods for Copper Removal and Planarization in Semiconductor Processing", filed Aug. 4, 2009, by Mayer et al., which are incorporated herein by reference.

FIG. 1 depicts schematically a perspective view 10 of a simplified system 12 in accordance with the invention for performing localized etching of metal from the surface of a semiconductor wafer. System 12 includes three liquid spray nozzles: a center nozzle 20, a middle nozzle 22, and an edge nozzle 24. In this figure, the nozzles are shown as "wide angle fan nozzles" or "flat spray nozzles", that is, each nozzle creates a flow pattern in the shape of a wide triangle with a narrow width, the spray emanating from a small specially shaped nozzle orifice to create the flow pattern depicted. Suitable exemplary nozzles are commercially available from Spraying Systems Inc. of Wheaton, Ill. (e.g., VEEJET® series nozzles), and Lechler Corp. of St. Charles, Ill. Nozzles 20, 22 and 24 are supported on a substantially horizontal nozzle arm 26, which is connected to a vertical shaft 28. As depicted in FIG. 1, spray nozzles 20, 22, 24 are aligned substantially linearly above and substantially parallel to a radius of a rotating semiconductor wafer 30, which has a wafer center 31. Each of nozzles 20, 22, 24 is operable to apply etching liquid in a desired spray or other type of flow pattern to a selected impact zone of wafer 30 at a selected desired liquid flow rate and, in some embodiments, at a desired, adjustable angle of incidence to the wafer. In the embodiment depicted in FIG. 1, nozzle 20 generates a fan-shaped spray pattern 32 of etching liquid. Each of these "wide angle fan nozzles", sometime referred to as "flat spray nozzles", or V-shaped spray nozzles, creates a flow pattern in the shape of a wide triangle having a narrow width, the spray emanating from a small specially shaped nozzle orifice to create the flow pattern, as depicted. Typical flow rates for each of the individual nozzles range from about 50 to 500 ml/min. In some preferred embodiments, fan-shaped spray pattern 32 (or other flow pattern) has a finite width 33, typically in the range of about from 5 mm to 20 mm. Accordingly, in some preferred embodiments, spray pattern 32 is essentially 3-dimensional (3-D) and, therefore, forms a band-like pattern of etching liquid as it impacts wafer 30 (in contrast to an essentially one-dimensional (e.g., linear) impact zone that a 2-dimensional spray pattern might form). Spray 32 impacts wafer 30 in an impact zone 34 that extends substantially straight across top wafer surface 36 parallel to a wafer diameter, corresponding to a wide (band-like) chord of the circle formed by peripheral edge of wafer 40. Impact zone 34 has a finite width corresponding to width 33 of spray pattern 32. Accordingly, in some preferred embodiments, impact zone 34 has the form of a band having a width corresponding to width 33 of spray pattern 32; an exemplary width of impact zone 34 is in a range of about from 5 mm to 20 mm. As depicted in FIG. 1, impact zone 34 extends across wafer 30 as a band having a substantially rectangular shape with a length corresponding to the length of a chord across wafer 30 and a width corresponding to width 33. As depicted in FIG. 1, the trajectory of fan-shaped 3-D liquid spray 32 includes a peripheral portion 38 that extends beyond peripheral edge 40 of semiconductor wafer 30. A peripheral portion 38 of a liquid flow pattern in accordance with the invention is not always necessary, but is sometimes useful to ensure full development of a desired flow pattern as well as to facilitate etch process uniformity control. A peripheral portion 38 of the liquid flow pattern is also sometimes useful to ensure sufficient wetting (when desired) with etching liquid of the peripheral edge 40 of semiconductor wafer 30. A peripheral portion 38 of the liquid flow pattern is also sometimes useful to ensure sufficient wetting (when desired) by etching liquid of a peripheral region on the backside (not shown) of wafer 30 near peripheral edge 40. When semiconductor wafer 30 is rotating in accordance with the invention, fan-shaped spray 32 results in substantially complete wetting of wafer surface 36. In exemplary embodiments, semiconductor wafer 30 is rotated at a moderate speed in a range of about from 100 rotations per minute (rpm) to 500 rpm during etching, more specifically from about 150 to 300 rpm, for example 250 rpm. Excessively high speeds (e.g., greater than 500 rpm) should generally be avoided as they cause excessive fluid splashing and misting, significantly reduce the average fluid surface residence time, and are otherwise generally unnecessary for a truly isotropic etching process. It is understood that impact zone 34 on wafer 30 as depicted in FIG. 1 is continuously changing as wafer 30 rotates. In some embodiments, nozzle 20 is designed and located so that etching liquid spray 32 impinges rotating wafer 30 slightly offset from center 31. In some embodiments, nozzle 20 is designed and located so that etching liquid spray 32 impinges rotating wafer 30 at an angle of incidence to wafer 30 less than 90°. For example, in some embodiments, substantially rectangular impact zone 34 is located in range of about from 1 mm to 20 mm radially outwards from center 31 and liquid spray 32 impinges wafer 30 at an angle of about from 60° to 89°, preferably in a range of about from 75° to 85°. As a result, etching liquid impinges wafer 30 and is sufficiently scattered, or with the appropriate angle of incidence, has a sufficient momentum component in the horizontal direction to cause the etching liquid to move from impact zone 34 radially inward towards center 31, even though centripetal force generated by rotating wafer 30 tends to pull etching liquid radially outwards. This technique is utilized to avoid undesired extensive etching of metal in the immediate vicinity of center 31 that sometimes occurs when etching liquid is applied directly at center 31.

Application of etching liquid by nozzle 20 on or near a diameter chord (i.e., passing through center 31) of wafer 30 generally contributes strongly to metal etching in local etch region 42 proximate to wafer center 31. Without being bound to any particular theory, it is believed that a flow pattern 32 of etching liquid extending across wafer 30 at or proximate to center 31 creating a band-like impact zone having a finite width, as depicted in FIG. 1, enhances the etching rate of metal closer to center 31 relative to the etching rate of metal at locations radially farther outwards (e.g., proximate to peripheral edge 40) simply because etching liquid is impacting (e.g., showering) areas of the wafer surface near center 31 a greater percentage of the time than at radial positions closer to peripheral edge 40. The fractional dwell time, $T_D$, of a particular point on a wafer surface under a band-like spray pattern 34 during which the particular point is being impacted by etching liquid is approximated by the following equation:

$$T_D = 2 \operatorname{Arctan}(W/r)/\pi \qquad \text{Equation (1)}$$

In Equation (1), W is the radial width of the band (e.g., width 33 of impact zone 34 in FIG. 1, assuming the inside edge of the band is located at center 31), and r is the radial distance of the particular point from center 31. For points at a distance r less than W, the fractional dwell time is 50 percent; that is, the particular point on the rotating wafer is being showered with etching liquid 50 percent of the time. At wafer center 31, the fractional dwell time is 100 percent, assuming the edge of spray pattern 32 is on center 31. At wafer edge 40, when W=5 cm and r=150 cm, the fractional dwell time, $T_D$, is only about 20 percent of the time when the edge of spray pattern 32 is at or proximate to center 31. Without being bound to any particular theory, it is believed that the dwell time of a particular point on the surface of the wafer during localized etching in accordance with the invention is a significant factor influencing the cumulative etching rate at that particular point. As demonstrated by the etching data presented in the graphs of FIGS. 18-19, described in Example 1 below, when etching liquid is applied only by a center nozzle, that is, by a nozzle applying a band-like pattern of etching liquid cutting across the wafer at or near the center, the cumulative etching rate (based on the total etching time) at a region near the center of the wafer is significantly greater than the cumulative etching rate (based on total etching time) at a region near the peripheral edge. It is believed this phenomenon occurs at least partly because a region near the center of the wafer is being impacted with fresh etching liquid, as well as the surface fluids being well mixed (i.e., under condition of substantial flow convection) during a greater percentage of the total etching time than a region at the edge.

Nozzle 22 of system 12 generates a fan-shaped 3-D spray 52 having a finite width 53 that impacts wafer 30 in a band-like impact zone 54 that extends substantially straight across wafer surface 36 parallel to a wafer diameter. An exemplary width 53 of fan-shaped 3-D spray 52 and band-like impact zone 54 is in a range of about from 5 mm to 20 mm. As depicted in FIG. 1, the trajectory of fan-shaped liquid spray 52 includes a peripheral portion 58 that extends beyond the peripheral edge 40 of semiconductor wafer 30. Similarly, nozzle 24 of system 12 generates a fan-shaped 3-D spray 62 having a width 63 that impacts wafer 30 in a band-like impact zone 64 that extends substantially straight across wafer surface 36 parallel to a wafer diameter. As depicted in FIG. 1, the trajectory of fan-shaped liquid spray 62 includes a peripheral portion 68 that extends beyond the peripheral edge 40 of semiconductor wafer 30. An exemplary width 63 of fan-shaped 3-D spray 62 and band-like impact zone 64 is in a range of about from 5 mm to 20 mm. In the embodiment of system 12 depicted in FIG. 1, some of the etching liquid initially deposited by nozzle 20 in impact zone 34 contributes substantially to the cumulative etching rates in etch regions radially outwards from center etch region. Some of this fluid is transported to more radially outward regions on the wafer, and is then stirred and mixed with fresh fluid arriving later from the same nozzle and/or from one or more other nozzles. Nevertheless, application of etching liquid by nozzle 22 contributes to enhanced etching of metal in local etch region 70 in the middle radial area of wafer surface 36, while not contributing substantially to etching in radially inward areas (or etch regions). Similarly, application of etching liquid by nozzle 24 contributes to enhanced etching of metal in local etch region 72 in the outer radial area of wafer surface 36, while typically not contributing substantially to etching in etch regions located radially inward from local etch region 72. It is understood that the different cumulative etching rates in two or more different local etch regions may be influenced by flow patterns generated by two or more etch nozzles. In some embodiments, only one flow pattern is modulated to influence and to control cumulative etching rates. In some embodiments, two or more flow patterns are modulated either simultaneously or sequentially during a total etching time to control cumulative etching rates in two or more local etch regions.

Each of local etch regions 42, 70, 72 is described and conceptualized herein as having a substantially definite area in which a substantially uniform cumulative local etching rate is achieved at the end of the total etching time. In reality, the boundaries of local etch regions in accordance with the invention are not always sharply defined, and the instantaneous etch rate at any given moment and the cumulative etch rate in a local etch region are not perfectly uniform across the region. Nevertheless, by modulating flow of etching liquid through one or more of the plurality of etch nozzles during an etching process, etching of metal from a substrate having a given initial thickness profile is tailored to achieve a desired end profile. In principle, as the number of etch nozzles is increased in a system such as system 12, the boundaries between local etch regions become more discrete and the uniformity of flow dwell time, etchant concentration and cumulative etching rate within each local etch region increases.

It has been determined that the flow pattern of etching liquid (or other liquid) applied using an etch nozzle to an impact zone at the surface of the semiconductor wafer generally influences to a greater or lesser degree the instantaneous etching rate, and thereby the cumulative etching rate, in a plurality of local etch regions. Numerous variables influence a flow pattern of liquid from an etch nozzle, including: etching liquid composition; liquid spray pattern out of a nozzle; location of the etch nozzle relative to a wafer; location of liquid impact zone on the wafer surface; angle of incidence of the etching liquid at the wafer surface; flow rate of etching liquid out of a nozzle; and rotational speed of the wafer. A feature of embodiments in accordance with the invention is that local etching of metal in a plurality of local etch regions is controlled to achieve fine-tuning of metal etching across the entire surface of a semiconductor wafer. As described in more detail below, it is believed that one or more nozzles, in addition to a center nozzle, applying a spray pattern of etching liquid to impact zones radially outwards from the center of a wafer, between the center and the edge of a wafer, increases the total dwell time of local regions under a high impact zone away from the center without increasing the dwell time in center regions. It is also believed that one or more additional spray patterns of etching liquid in high fluid flow impact zones radially outwards from the center serve to agitate etching liquid in outer regions, and to replenish and to refresh the etching liquid in outer regions of the wafer, thereby enhancing the etching rate for the period of time that the fluid is under the high impact flow, as well for some time thereafter. By modulating the flow pattern of etching liquid through center nozzle 20 during etching operations (e.g., by stopping flow of etching liquid through center nozzle 20 for a portion of the total etching time), while maintaining the flow patterns of etching liquid through other nozzles 22, 24, it is possible in some embodiments to modulate (e.g., decrease) the instantaneous and cumulative (i.e. time integrated average) etching rate of metal in center local etch region 42 relative to the instantaneous and cumulative etching rates in other regions of the wafer. Similarly, by modulating the flow pattern of etching liquid through edge nozzle 24 during etching operations (e.g., by increasing the flow rate or concentration of etching liquid through edge nozzle 24 for a portion of the total etching time), while maintaining the flow patterns of etching liquid through other nozzles 20, 22, it is possible in some embodiments to modulate (e.g., increase) the cumulative etching rate of metal in edge local etch region 72 relative to the cumulative etching rates in center and middle local etch regions 42, 70 of the wafer.

As depicted in FIG. 1, impact zones 34, 54, 64 are separate, non-intersecting zones. In some embodiments (not depicted), two or more distinct impact zones may overlap; that is, the flow patterns may intersect and/or the impact zones formed by etching liquid impacting the wafer may overlap, but not substantially enough to interfere with the capacity to modulate one or more flow patterns and, thereby, to control different cumulative etching rates in different local etch regions.

In preferred embodiments, nozzle arm 26 is movable in a direction perpendicular to the surface of semiconductor wafer 30, that is, in a vertical direction when semiconductor wafer 30 is oriented horizontally. In preferred embodiments, each of nozzles 20, 22, 24 is designed and selected to produce a desired liquid flow pattern, for example, a desired spray pattern. As depicted in FIG. 1, each of nozzles 20, 22, 24 produce a 3-D fan-shaped flow pattern of etching liquid that impacts wafer 30 to produce a substantially rectangular band across the wafer surface. In some embodiments, one or more of the plurality of nozzles produces a flow pattern different from the flow patterns depicted in FIG. 1; for example, an arc-shaped flow pattern that impacts a semiconductor wafer to form an arc-shaped band-like impact zone, or a band similar to that shown in FIG. 1, but with half the extent (i.e., passing though the wafer center but not extending completely across the wafer). In some embodiments, nozzle arm 26 is movable to a "fully retracted" position in which nozzle arm 26 and etch nozzles 20, 22, 24 are not directly above semiconductor wafer 30.

Figure 2:
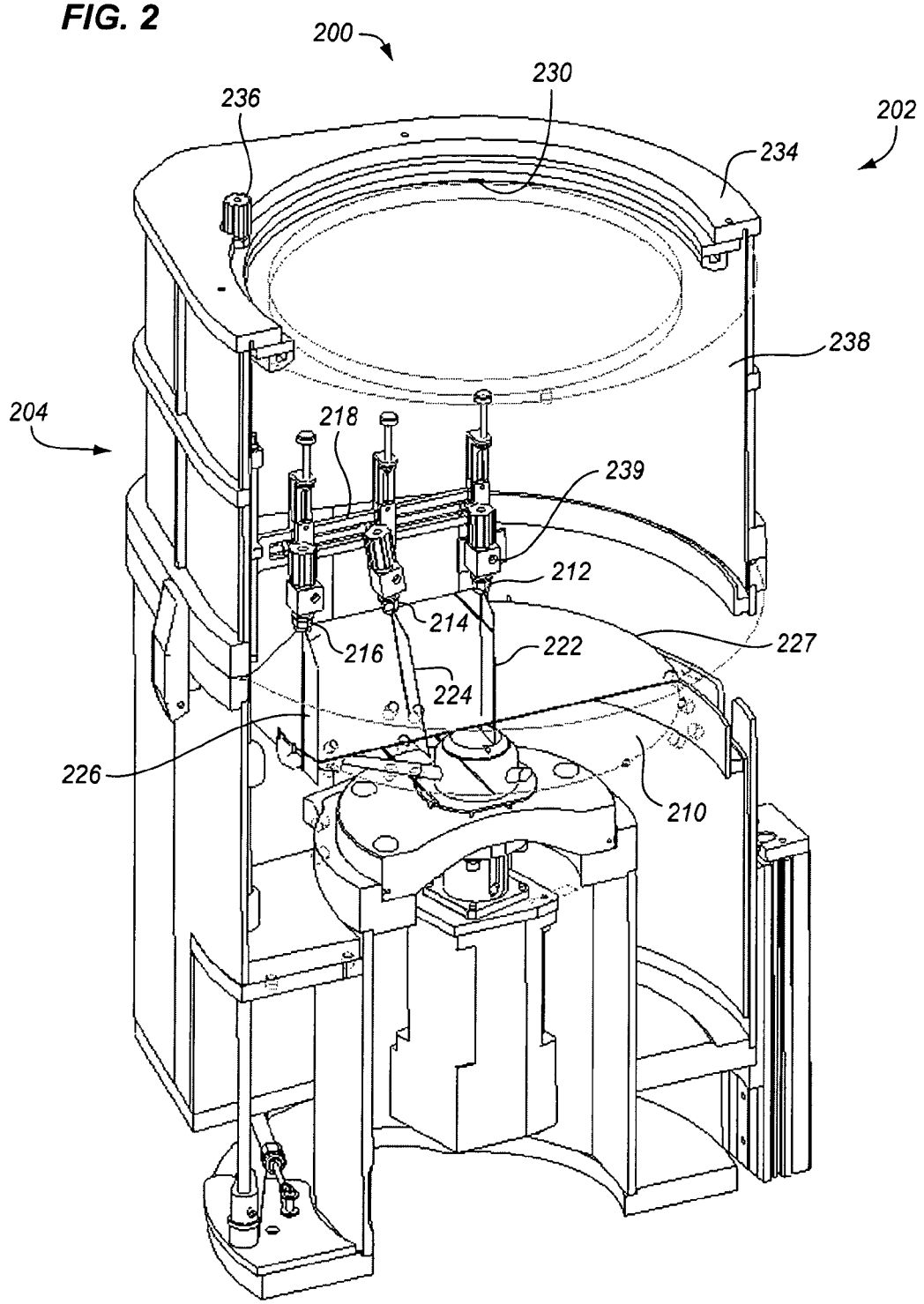
FIG. 2 depicts schematically a perspective cutaway view of an etching apparatus suitable for fine-tuning the thickness of a metal layer on a semiconductor wafer by localized etching in accordance with the invention.

FIG. 2 depicts schematically a perspective cutaway view 200 of etching apparatus 202 suitable for fine-tuning the thickness of a metal layer on a semiconductor wafer by localized etching in accordance with the invention. For the sake of clarity, some details of components of apparatus 202 are not included in FIG. 2. One of ordinary skill in the art, however, will understand how to implement embodiments in accordance with the invention using known components. Apparatus 202 includes a treatment container 204 and a wafer holder (not shown in detail) located in treatment container 204 for holding a semiconductor wafer 210. The wafer holder is operable to rotate a semiconductor wafer. Apparatus 202 further includes a plurality of etch nozzles; namely, center etch nozzle 212, middle etch nozzle 214 and edge etch nozzle 216. Apparatus 202 also includes a nozzle arm 218 for supporting etch nozzles 212, 214, 216. Nozzle arm 218 is operable to dispose etch nozzles 212, 214, 216 substantially directly above a rotating semiconductor wafer in said wafer holder to perform localized wet etching of metal at a plurality of local etch regions. An etch-liquid delivery system (not shown in FIG. 2) is operable to provide flow of etching liquid to each of a plurality of etch nozzles 212, 214, 216. Etch nozzles 212, 214, 216 are each operable to apply a flow pattern of etching liquid to a separate impact zone of rotating semiconductor wafer 210. By selectively controlling the flow pattern of etching liquid from each of a plurality of the etch nozzles, the cumulative etching rate in one local etch region is selectively controlled relative to the cumulative etching rate in one or more other local etch regions. Typically, the flow of etching liquid from at least one of etch nozzles 212, 214, 216 is modulated during etching.

As depicted in FIG. 2, center etch nozzle 212 is used to generate a liquid spray pattern 222 that is applied to a central impact zone of a rotating semiconductor wafer 210, whereby the central impact zone includes at least a local area of wafer 210 that is proximate to the center of wafer 210. Similarly, middle etch nozzle 214 is used to generate a liquid spray pattern 224 that is applied to a middle impact zone of a rotating semiconductor wafer 210, whereby the middle impact zone includes at least a local area of wafer 210 that is between the center and the peripheral edge of wafer 210. Similarly, edge etch nozzle 216 is used to generate a liquid spray pattern 226 that is applied to an edge impact zone of a rotating semiconductor wafer 210, whereby the edge impact zone includes at least a local area of wafer 210 that is proximate to the peripheral edge 227 of wafer 210. Etch nozzle 214 is depicted in view 200 in FIG. 2 having an angular orientation relative to wafer 210 such that spray pattern 224 impinges wafer 210 at an angle less than 90°. In preferred embodiments, one or more of etch nozzles 212, 214, 216 are adjustable up and down within nozzle holders 239, enabling control and modulation of the corresponding flow pattern of liquid. In preferred embodiments, nozzle arm 218 is adjustable up and down along an axis perpendicular to the horizontal plane of wafer 210, enabling control and modulation of corresponding flow patterns of liquid. In view 200 in FIG. 2, etch nozzles 212, 214, 216 are disposed in an etching position in which the nozzles are substantially above semiconductor wafer 210. It is understood that in some embodiments, one or more etch nozzles, for example, edge etch nozzle 216, in an etching position may be aligned slightly beyond peripheral edge 227 of wafer 210 but able to apply a liquid spray pattern to wafer 210.

Apparatus 202 also includes a rinse nozzle (not shown in FIG. 2) for rinsing remnants of etching liquid from nozzle arm 218 and etch nozzles 212, 214, 216 after etching operations. Apparatus 202 further includes rinse manifold 230 located in top 234 of treatment container 204 and connected to manifold inlet 236. Manifold inlet 236 is connectable to a rinsing liquid source (not shown). Rinse manifold 230 conducts rinsing liquid to wall rinsing nozzles (not shown) The wall rinsing nozzles serve to rinse remnants of etching liquid from inside wall 238 of container 204, usually after etching operations and before and during rinsing of nozzle arm 218 and etch nozzles 212, 214, 216. In some embodiments, one or more rinse nozzles are operable to rinse remnants of etching liquid from semiconductor wafer 210 after etching operations.

Figure 3:
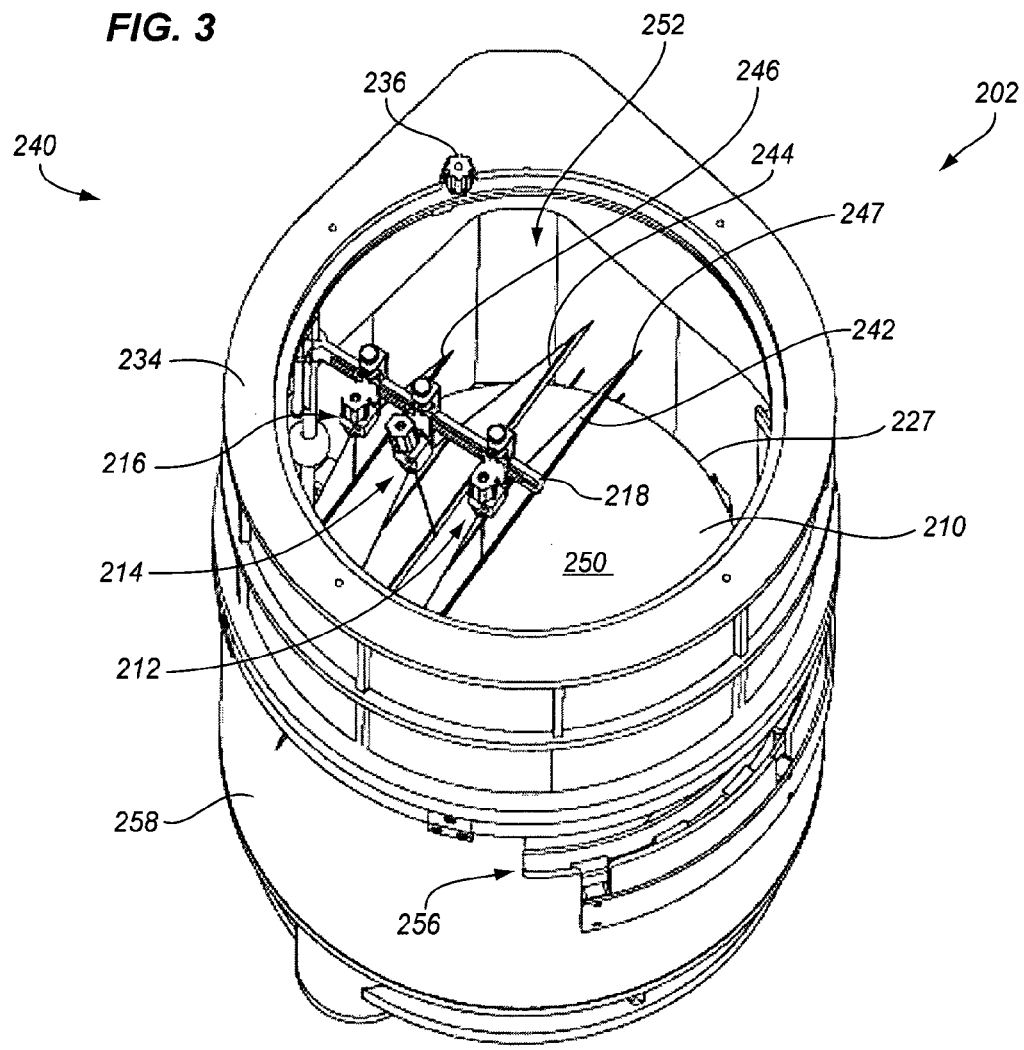
FIG. 3 depicts schematically a top perspective view of the apparatus of FIG. 2 during etching operations.

FIG. 3 depicts schematically a top perspective view 240 of apparatus 202 during etching operations. FIG. 3 depicts spray pattern 242 of etching liquid generated by center etch nozzle 212. Spray pattern 242 is approximately fan-shaped and impacts a central impact zone that cuts across wafer 210 proximate to the center of wafer 210. Middle etch nozzle 214 generates fan-shaped etching liquid spray pattern 244 that impacts a middle impact zone that cuts across wafer 210 between the center and the peripheral edge of wafer 210. Edge etch nozzle 216 generates fan-shaped etching liquid spray pattern 246 that impacts an edge impact zone that cuts across wafer 210 proximate to its peripheral edge 227. In some embodiments, spray patterns 242, 244 and 246 do not extend beyond the peripheral edge 227. In some embodiments, as depicted in FIG. 3, spray patterns 242, 244 and 246 have peripheral portions 247 that extend beyond peripheral edge 227 of wafer 210. Since wafer 210 is rotating during etching operations in accordance with the invention, etching liquid from spray pattern 242 located proximate to the center of wafer 210 wets virtually the entire top surface 250 of wafer 210. By modulating the flow pattern of etching liquid through center nozzle 212 during etching operations (e.g., by stopping flow of etching liquid through center nozzle 212 for a portion of the total etching time), while maintaining the flow patterns of etching liquid through other nozzles 214, 216, it is possible in some embodiments to modulate (e.g., decrease) the cumulative etching rate of metal in the center local etch region relative to the cumulative etching rates in other regions of the wafer. Similarly, by modulating the flow pattern of etching liquid through edge nozzle 216 during etching operations (e.g., by increasing the flow rate or concentration of etching liquid through edge nozzle 216 for a portion of the total etching time), while maintaining the flow patterns of etching liquid through other nozzles 212, 214, it is possible in some embodiments to modulate (e.g., increase) the cumulative etching rate of metal in an edge local etch region relative to the cumulative etching rates in center and middle local etch regions of the wafer.

Figure 4:
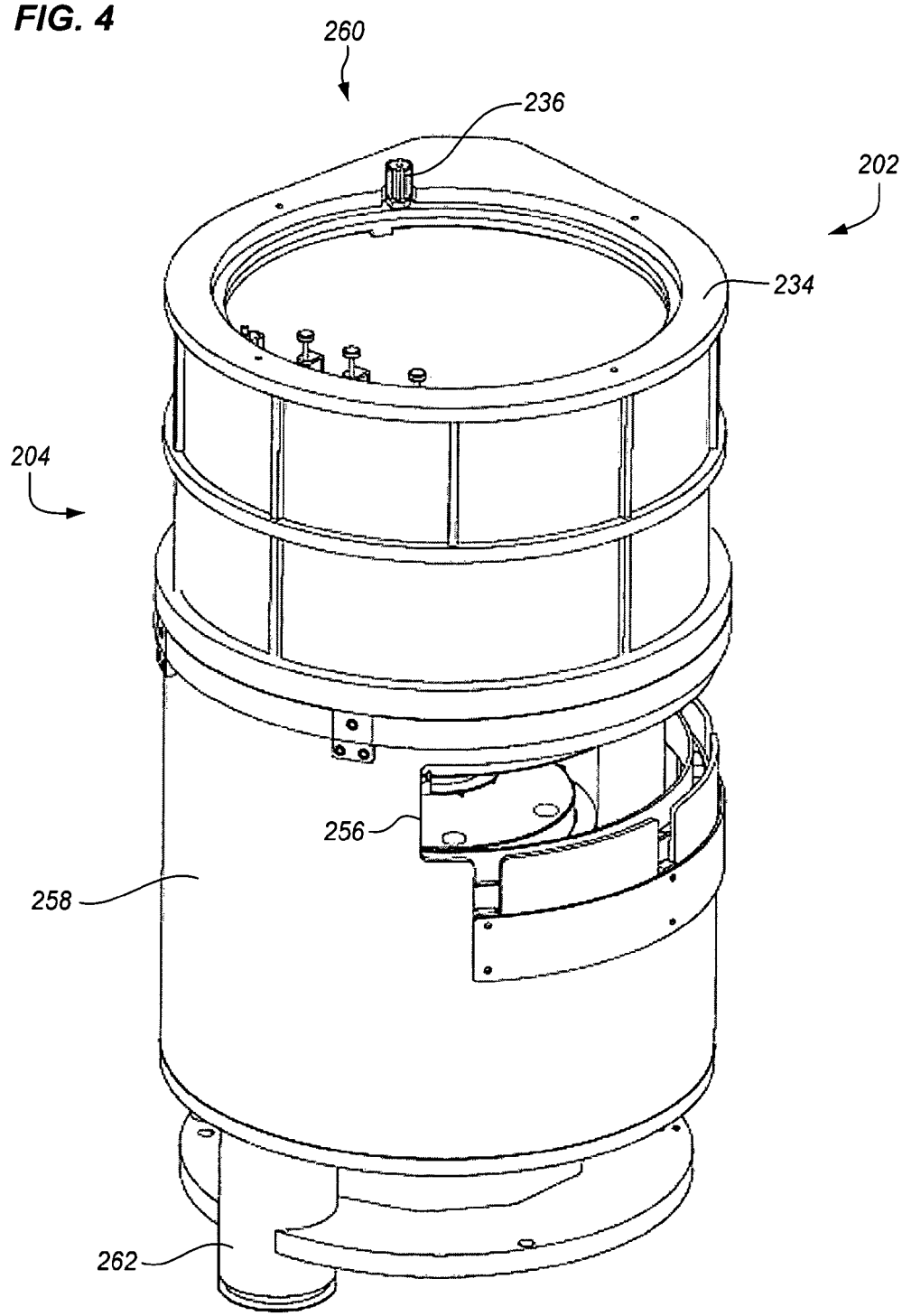
FIG. 4 depicts schematically a view of the apparatus of FIG. 2 that shows principally exterior features of the treatment container.
Figure 5:
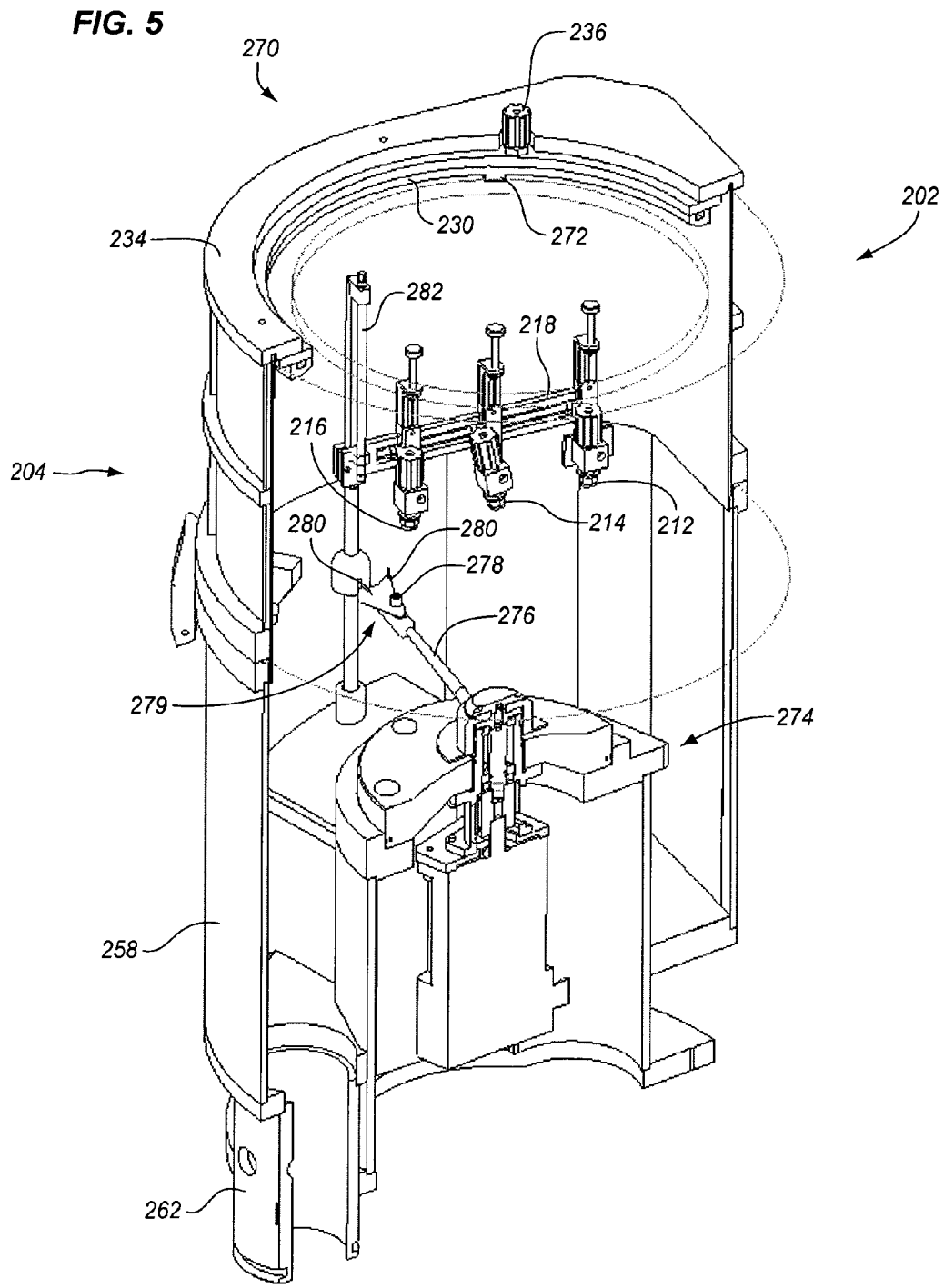
FIG. 5 depicts schematically another perspective cutaway view of the etching apparatus of FIG. 2.

As depicted in FIG. 3, nozzle arm 218 and etch nozzles 212, 214, 216 are disposed in an etching position in which the etch nozzles are located substantially above semiconductor wafer 210. View 240 in FIG. 3 depicts a nozzle-arm alcove 252 to which nozzle arm 218 is movable so that said nozzle arm and etch nozzles 212, 214, 216 are not directly above said wafer holder. View 240 also depicts wafer loading window 256 located in wall 258 of treatment container 204. Loading window 256 includes a door (not shown) that is opened during wafer-loading and removal, and closed during etching and rinsing operations. FIG. 4 depicts schematically a view 260 of apparatus 202 that shows principally exterior features of treatment container 204. As depicted in FIG. 4, treatment container 204 of apparatus 202 includes wafer loading window 256 in container wall 258. Apparatus 202 further includes liquid drain 262 that serves to collect and drain etching liquid and rinsing liquid out of treatment container 204 and carry them to a disposal system (not shown). In the collection area just above the chamber bottom and liquid drain 262 is a waste treatment element (not shown). This element is a region though which at least a portion of the spent etching liquid passes and is useful in accelerating etching liquid decomposition (primarily the oxidizer). Examples of elements included in this waste treatment element are an oxidizer decomposition catalyst (e.g., a high surface-area platinum on a porous zirconia substrate), and a element containing a suitable transition metal plate or porous hopper of transition metal pellets (e.g., iron or copper spheres). The function of the waste treatment element is to facilitate in the decomposition and stabilization of any unstable etch solution prior to exiting drain 262. FIG. 5 depicts schematically a cutaway view 270 of apparatus 202. As depicted in view 270, apparatus 202 includes a wall rinsing nozzle 272 connected to wall rinsing manifold 230. Apparatus 202 includes wafer holder assembly 274. Wafer holder assembly 274 comprises a wafer holder that includes a set of three wafer support arms 276 and a set of three corresponding wafer support nubs 278. Each support nub 278 is attached to a distal end 279 of a support arm 276. Support arms 276 and support nubs 278 are designed so that a semiconductor wafer may be placed onto and supported by nubs 278. The surfaces of the nubs in contact with the bottom side of a wafer are designed to provide sufficient friction so that a wafer spinning at relatively fast rotation rates (e.g., 200-400 rpm) is held securely. In exemplary embodiments, the wafer holder is designed so that wafer support nubs 278 contact the bottom of a semiconductor wafer in a range of about from 0.5 cm to 5 cm radially inward from the peripheral edge of the wafer. Apparatus 202 also includes one or more wafer alignment pins 280 located at distal end 279 of support arms 276. Alignment pins 280 serve to maintain correct alignment of a wafer in a wafer holder and also to prevent a wafer from spinning off a wafer holder in the unlikely event that a spinning wafer overcomes the friction provided by support nubs 278 and begins to slip. In preferred embodiments, alignment pins 282 do not contact peripheral edge 227 of wafer 210 (FIG. 3) during the normal course of etching operations. In preferred embodiments, apparatus 202 is operable to achieve wetting with etching liquid of the extreme peripheral edge 227 of wafer 210 (FIG. 3) and even a small peripheral surface area of the bottom of wafer 210 near peripheral edge 227, by the flow of etch liquid passing over the peripheral edge and traversing slightly inwards on the bottom of the wafer, driven by the liquid's momentum and held by surface tension forces. Wetting the peripheral areas of wafer 210 is useful for removing metal-containing layers (e.g., copper metallization layers, seed layers, barrier layers, adhesion layers) from surface areas of wafer 210 proximate to peripheral edge 227. As depicted in view 270 in FIG. 5, apparatus 202 further includes vertical shaft 282 to which nozzle support arm 218 is mounted. In preferred embodiments, nozzle support arm 218 is movable up and down vertical shaft 282 so that the vertical distance between nozzles 212, 214, 216 and wafer 210 may be adjusted. In apparatus 202, nozzle support arm 218 may be rotated about vertical shaft 282 to move support arm 218 and nozzles 212, 214, 216 into a non-etching position in which nozzles 212, 214, 216 are not directly above the wafer holder or a semiconductor wafer located in the wafer holder.

Figure 6:
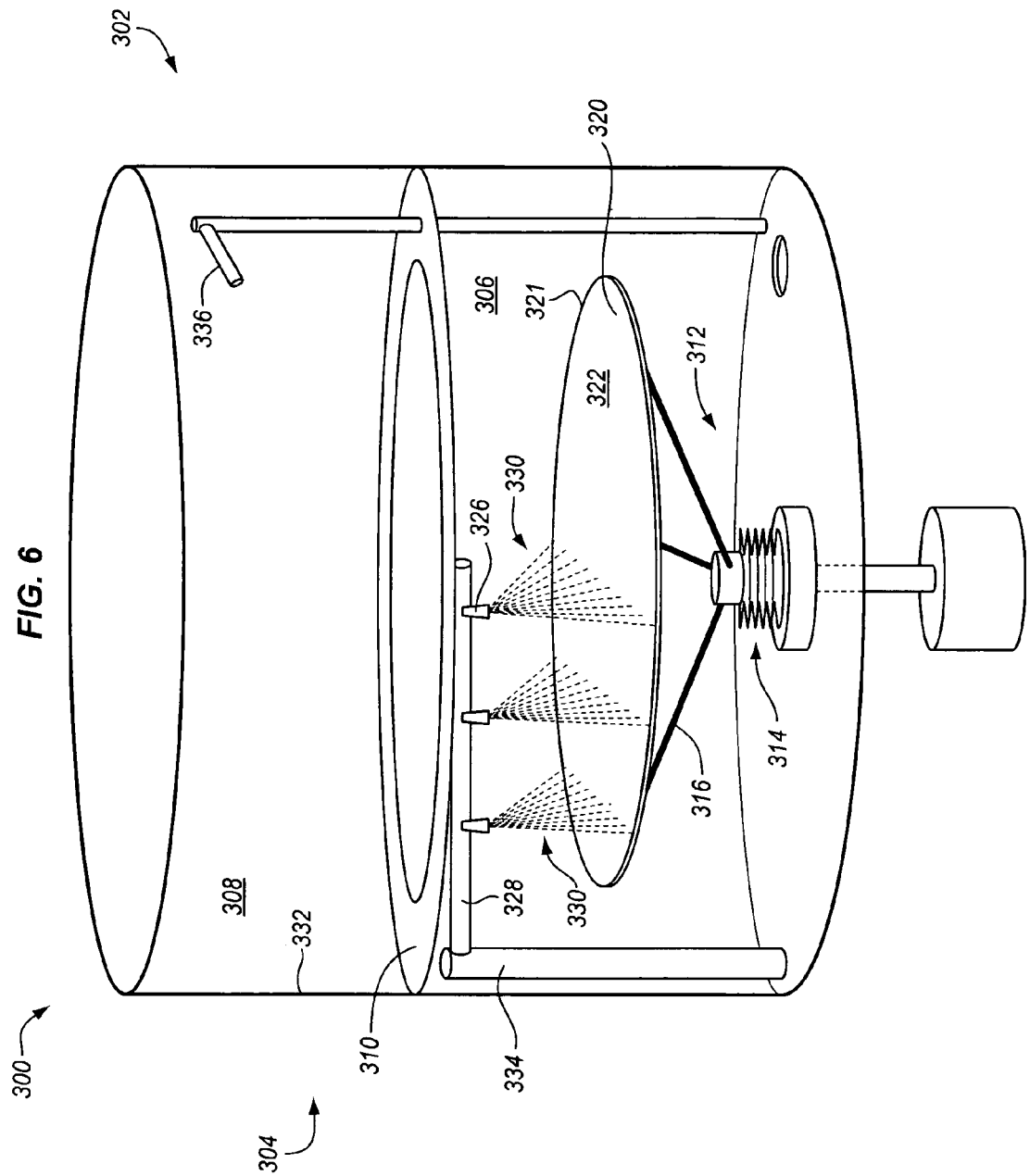
FIG. 6 depicts a view of an apparatus in accordance with the invention having a lower etch chamber and an upper rinse chamber suitable for localized etching of metal from a semiconductor wafer and thereafter for rinsing etching liquid from the wafer and drying the wafer.

FIG. 6 depicts a view 300 of an apparatus 302 in accordance with the invention suitable for etching metal from a semiconductor wafer and thereafter rinsing etching liquid from the wafer and drying the wafer. Apparatus 302 includes treatment container 304 having a lower etch chamber 306 and an upper rinse chamber 308. Apparatus 302 further includes a horizontal splash shield 310 located between lower etch chamber 306 and upper rinse chamber 308. Apparatus 302 includes wafer holder assembly 312, which comprises adjustable shaft 314, wafer support arms 316 and wafer support nubs (not shown). Wafer holder assembly 312 is operable to hold a semiconductor wafer 320 having peripheral wafer edge 321 and a top wafer surface 322. During etching operations in accordance with the invention, wafer holder assembly 312 is operable to rotate a semiconductor wafer 320. Apparatus 302 includes a plurality of etch nozzles 326 assembled on nozzle support arm 328. During etching operations as depicted in FIG. 6, apparatus 302 is operable to dispose etch nozzles 326 in an etching position in which etch nozzles 326 are substantially directly above wafer surface 322. As depicted in FIG. 6, during etching operations, each of etch nozzles 326 is operable to provide a 3-D spray pattern 330 that impinges wafer surface 322 in a band-like local impact zone, as explained above with reference to FIG. 1. Etch nozzles are operable to generate and to apply distinct patterns of etching liquid (or other liquid) to distinct band-like impact zones on a rotating semiconductor wafer 332 to control a cumulative etching rate (over a total etching time) in a first local etch region relative to the cumulative etching rate in at least a second local etch region. Typically, control of cumulative etching in one or more local etch regions is achieved by modulating the flow of etching liquid in at least one of the plurality of etch nozzles. Flow of etching liquid through a particular etch nozzle is modulated using one or a combination of various techniques; for example, including but not limited to: stopping or starting the flow of etching liquid through the nozzle; stopping or starting the flow of another liquid through the nozzle (e.g., deionized water or etch quenchant); changing the flow rate of liquid through the nozzle; changing the angle of incidence of the spray pattern to the wafer; and changing the shape and/or dimensions of a liquid spray pattern and its corresponding impact zone. During etching of metal from semiconductor wafer 320 in accordance with the invention, horizontal rinse shield 310 serves to inhibit etching liquid in lower etch chamber 306 from splashing onto inside walls 332 of upper rinsing chamber 308. Nozzle support arm 328 is attached to vertical shaft 334. Apparatus 302 further includes rinsing nozzle 336 located in upper rinsing chamber 308.

Figure 7:
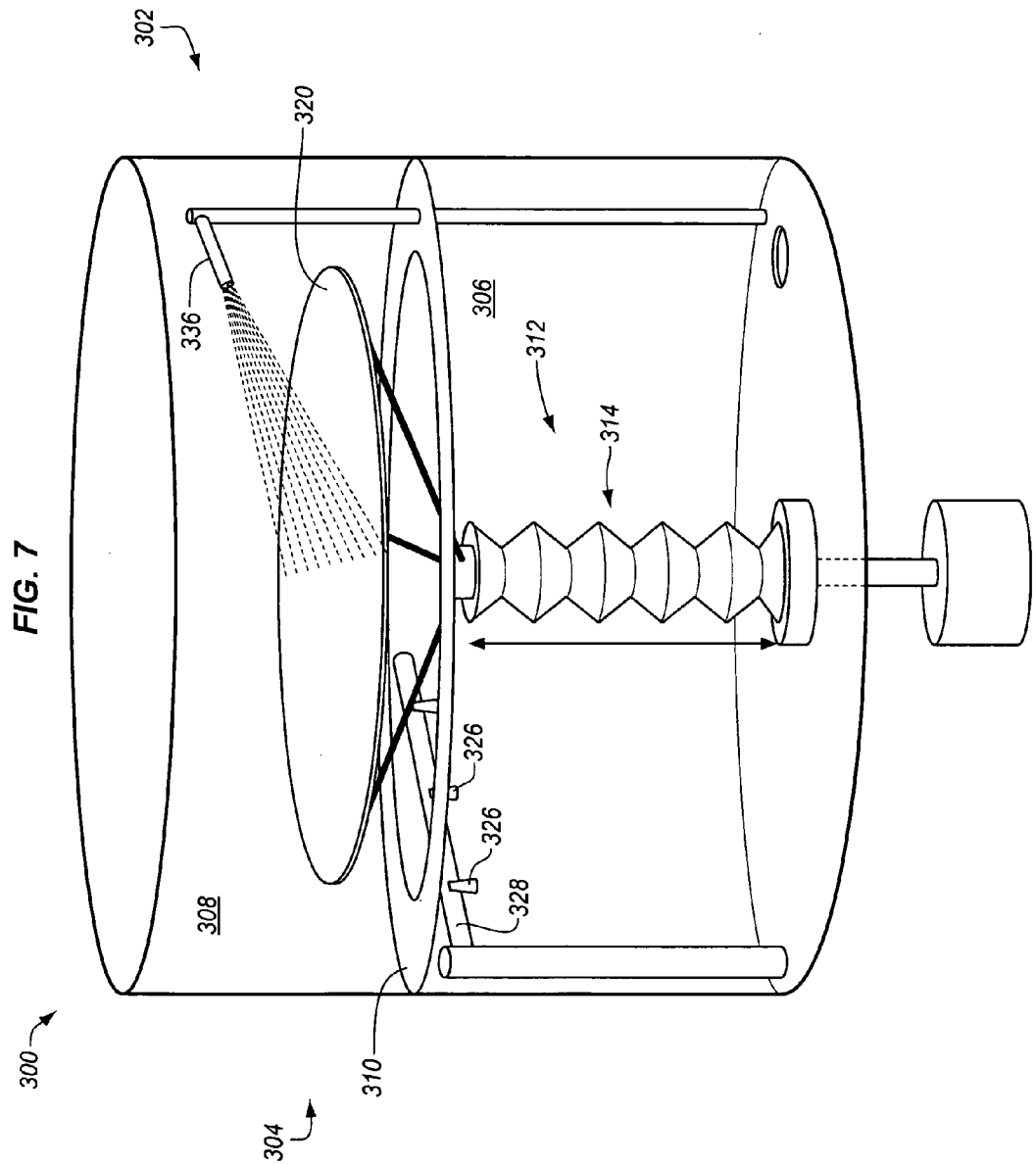
FIG. 7 depicts the apparatus of FIG. 6 during rinsing operations in accordance with the invention.

FIG. 7 depicts apparatus 302 during rinsing operations in accordance with the invention. As depicted in FIG. 7, after etching in accordance with the invention, apparatus 302 is operable to move etch nozzles 326 by rotating nozzle support arm 328 about vertical shaft 334 into a non-etching position in which support arm 328 and etch nozzles 326 are not directly (vertically) above wafer 320. Preferably, a rinsing nozzle is used to rinse support arm 328 and etch nozzles 326 after etching operations have ceased and before moving nozzle support arm 328 and nozzles 326 into the non-etching position. In some embodiments, rinse nozzle 336 is used to rinse nozzle support arm 328 and nozzles 326 in lower etch chamber 306. In some embodiments, apparatus 302 includes one or more other rinsing nozzles (not shown) operable for rinsing remnants of etching liquid from support arm 328 and etch nozzles 326 after etching operations have stopped. Depending on the particular etching chemistry, examples of suitable rinsing liquids include deionized water, dilute acids, or dilute bases, dilute solutions of amines, amino-acids, or combinations and sequences of these. After moving nozzle support arm 328 and etch nozzles 326 into the non-etching position, adjustable shaft 314 of wafer holder assembly 312 is extended vertically upwards so that semiconductor wafer 320 is moved from lower etch chamber 306 into upper rinsing chamber 308. Then, rinse nozzle 336 is used to apply rinsing liquid (e.g., deionized water) onto top surface 322 of wafer 320 to rinse remnants of etching liquid from wafer 320. In some embodiments, wafer holder assembly 312 is operable to rotate wafer 320 at a high rotation speed (e.g., 400-600 rpm) to remove and to dry rinsing liquid from wafer 320. Some embodiments of apparatus 302 also include one or more fans, sources of flowing and drying gasses, or heating-element drying aids (e.g., infrared heating element) (not shown) to dry wafer 320 before wafer 320 is removed from treatment container 304 for further processing.

One of ordinary skill in the art will understand that some embodiments in accordance with the invention are similar to apparatus 302, but comprise an etch chamber and a rinse chamber arranged differently; for example, an upper etch chamber and a lower rinse chamber, an etch chamber located next to a rinse chamber and having a horizontally movable wafer holder and a vertically opening and shutting separation wall. In some embodiments, the etch chamber and the rinse chamber are integrated within a single treatment container as an apparatus 302. In some embodiments, the etch chamber and the rinse chamber are essentially two separate chambers, but may have one common wall. In some embodiments, a rinse shield similar to horizontal rinse shield 510 is movable instead of (or in addition to) wafer holder 312, so that the horizontal rinse shield is moved relative to the wafer height between etching and rinsing operations.

Figure 8:
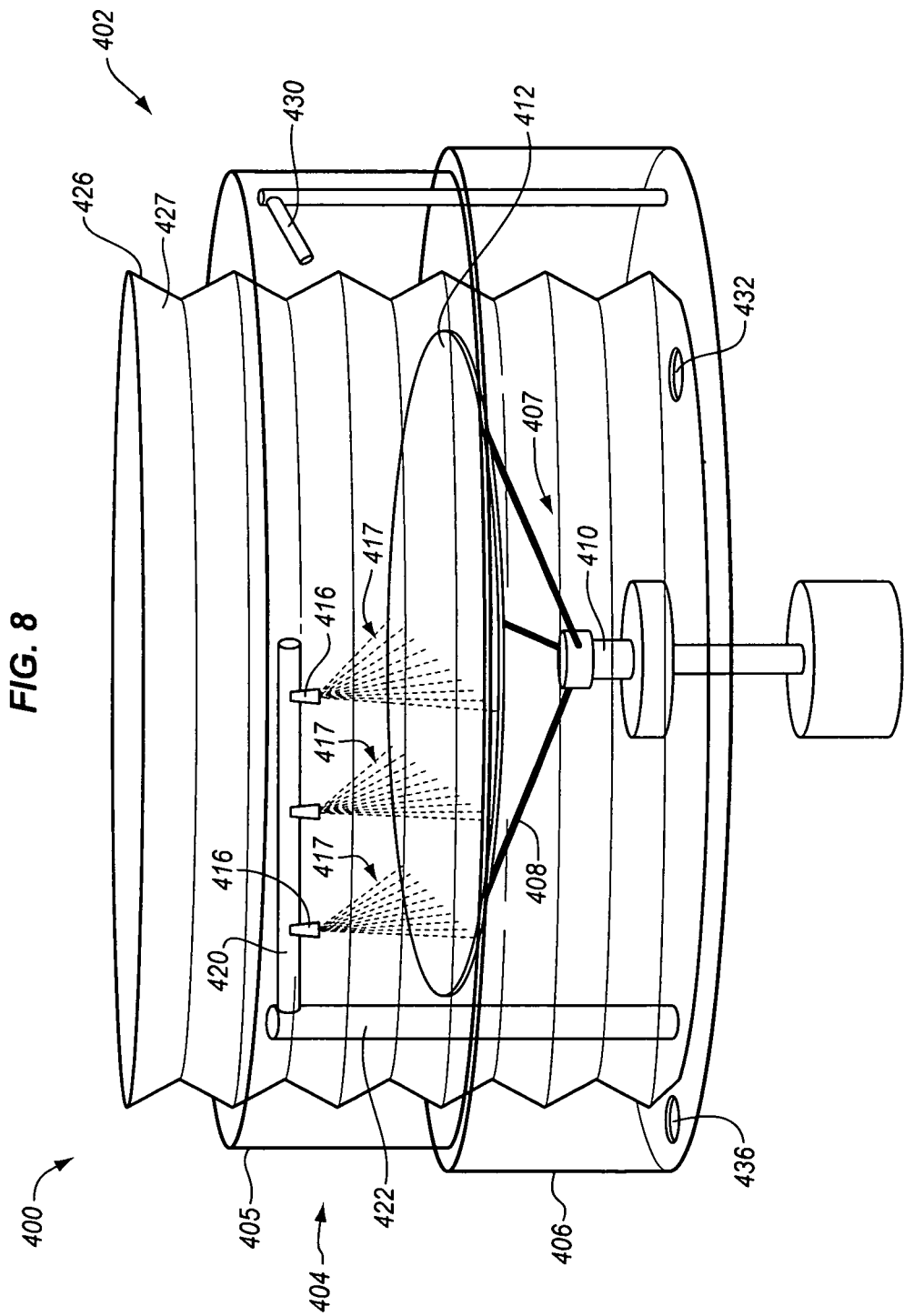
FIGS. 8-14 depict schematically an apparatus having an inner rinse shield in sequential stages of etching metal and rinsing etching liquid in accordance with the invention.

FIGS. 8-14 depict schematically an apparatus 402 for etching metal and rinsing etching liquid from a semiconductor wafer in accordance with the invention. Apparatus 402 includes treatment container 404 in which metal etching and rinsing operations are conducted. As depicted in view 400 in FIG. 8, treatment container comprises retractable outer splash shield 405 and lower wall 406. In view 400, outer splash shield 405 is depicted in an up (or active) position. Apparatus 402 further includes a wafer holder 407 comprising three wafer support arms 408 that are attached to rotate-able shaft 410. Wafer holder 407 serves to hold a semiconductor wafer 412 and to rotate it. Apparatus 402 further includes a plurality of etch nozzles 416 in accordance with the invention. Etch nozzles 416 are operable to apply a plurality of distinct flow patterns of etching liquid to a plurality of spatially distinct impact zones on a rotating semiconductor wafer to control a cumulative etching rate in a first local etch region relative to the cumulative etching rate in at least a second local etch region. As explained above with reference to FIG. 1, at least a first etch nozzle is operable to provide a first flow pattern of etching liquid to a first local impact zone of semiconductor wafer 412, and at least a second etch nozzle is operable to provide a second flow pattern of etching liquid to at least a second local impact zone different from the first local impact zone. The flow pattern of etching liquid (and/or other liquid, e.g., deionized water and quenchant) through each of etch nozzles 416 may be selected and controlled in such a way during etching of metal from the surface 418 of wafer 412 to control the cumulative etching rate in each of a plurality of local etch regions on wafer surface 418. Etch nozzles 416 are supported on nozzle support arm 420, which is connected to vertical shaft 422. Apparatus 402 further includes a retractable inner splash shield 426 that is operable in an up (or active) position and in a down (or inactive) position. FIG. 8 depicts inner splash shield 426 in an up (active) position in which splash shield 426 substantially surrounds semiconductor wafer 412 in wafer holder 407. Inner splash shield 426 has a substantially cylindrical shape that is substantially concentric with wafer 412 and wafer holder 407. The vertical wall 427 of inner splash shield 426 is located between wafer holder 407, on one side, and outer splash shield 405 and lower wall 406 of treatment container 404. In an up position as depicted in FIG. 8, splash shield 426 serves to inhibit etching liquid from etch nozzles 416 and from a spinning semiconductor wafer 412 from splashing onto the inside surfaces of outer splash shield 405 and lower wall 406 during etching operations. Apparatus 402 further includes rinsing nozzle 430. Rinsing nozzle 430 is operable to rinse semiconductor wafer 412 with rinsing liquid (e.g., deionized water) during rinsing operations to remove remnants of etching liquid from wafer 412. In some embodiments, rinsing nozzle 430 or one or more additional rinsing nozzles (not shown) serve to rinse etch nozzles 416 and nozzle support arm 420 with rinsing liquid. Apparatus 402 further includes inner drain 432 located at the bottom 434 of treatment container 402 within a radius of substantially cylindrical vertical shield wall 427. Inner drain 432 serves to conduct etching liquid and rinsing liquid out of treatment container 404. Apparatus 402 further includes outer drain 436 located at the bottom 434 of treatment container 404 between substantially cylindrical vertical shield wall 427 and inside wall 429 of treatment container 404. Outer drain 436 serves primarily to conduct rinsing liquid out of treatment container 404.

Figure 9:
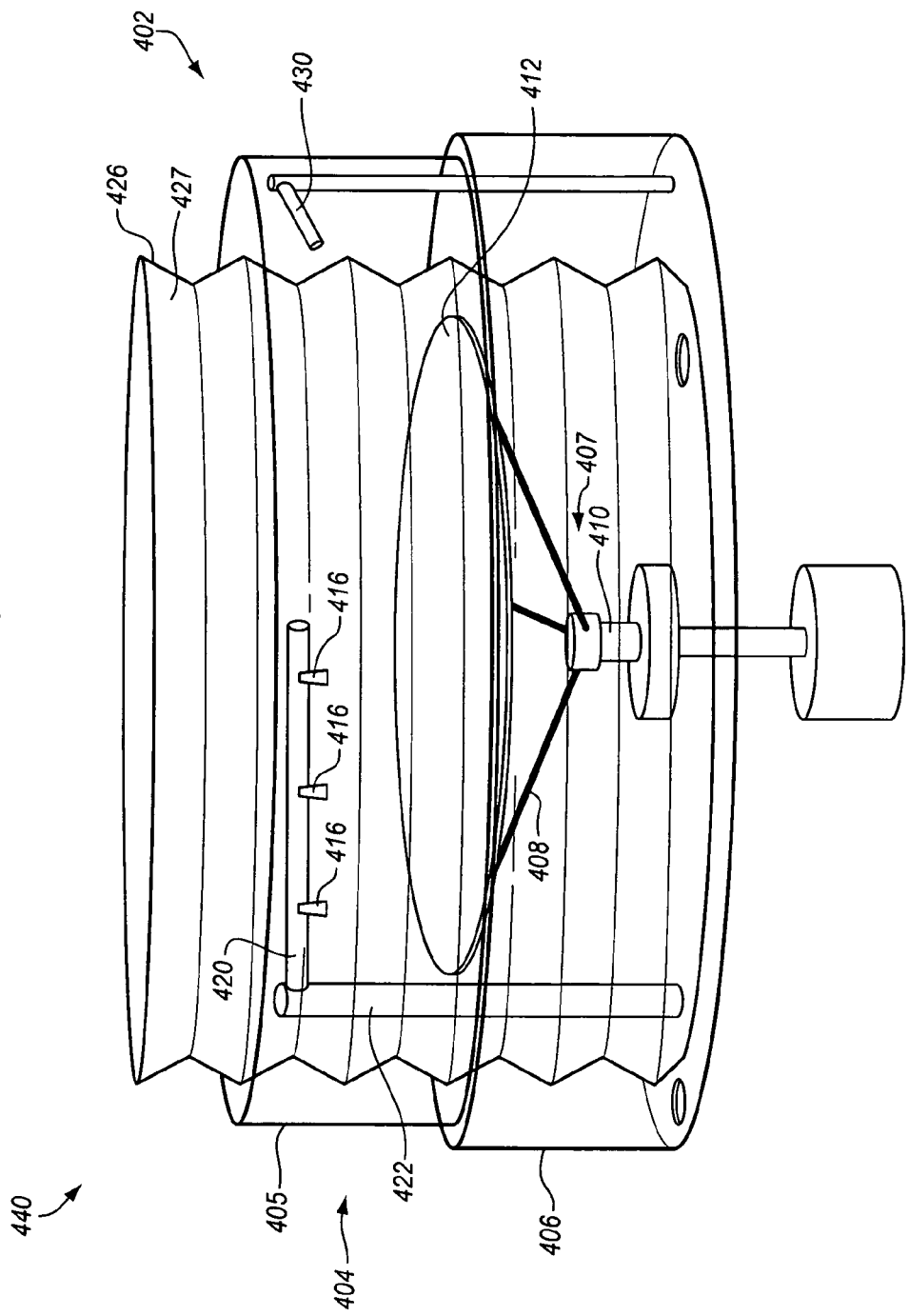
Figure 10:
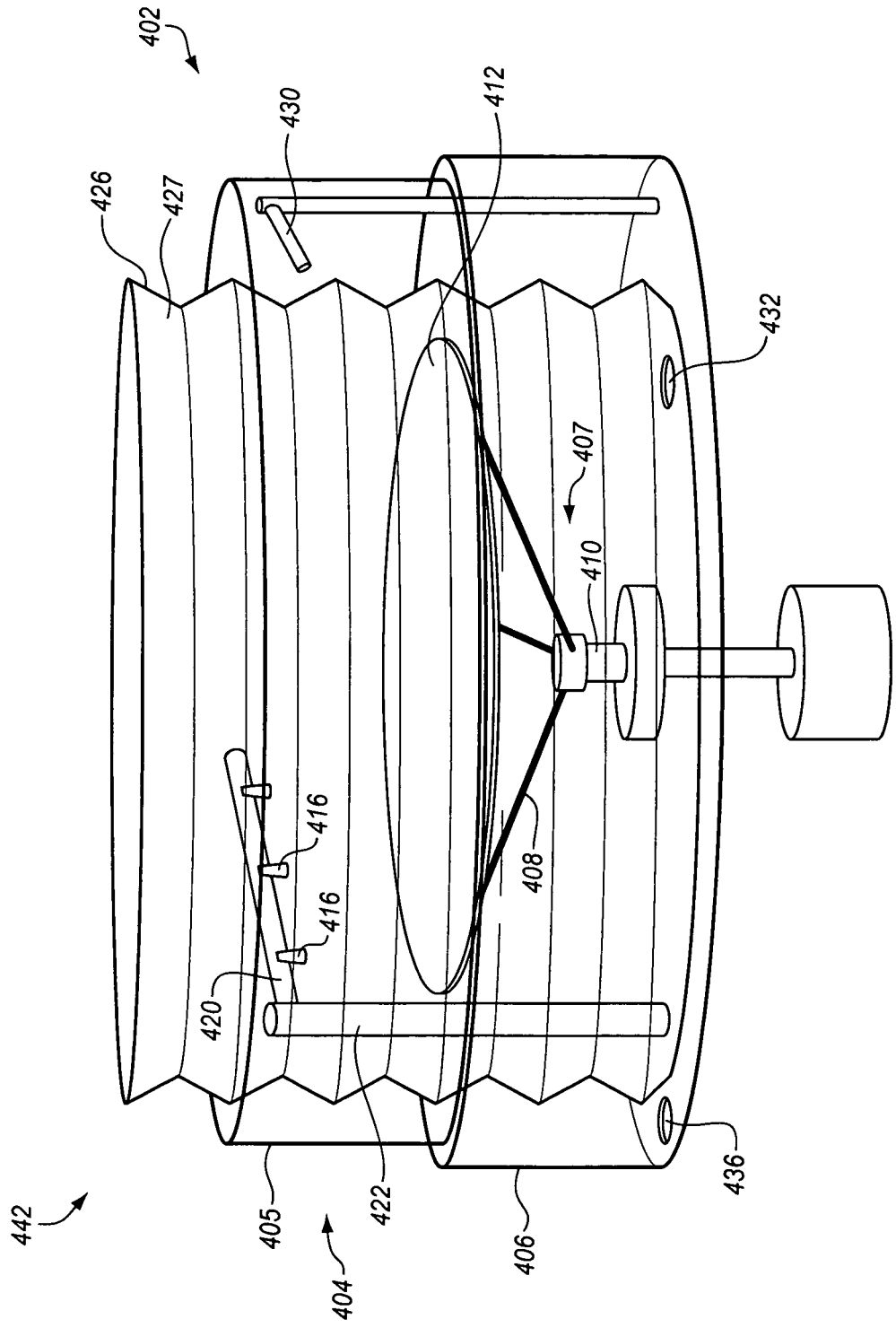
Figure 11:
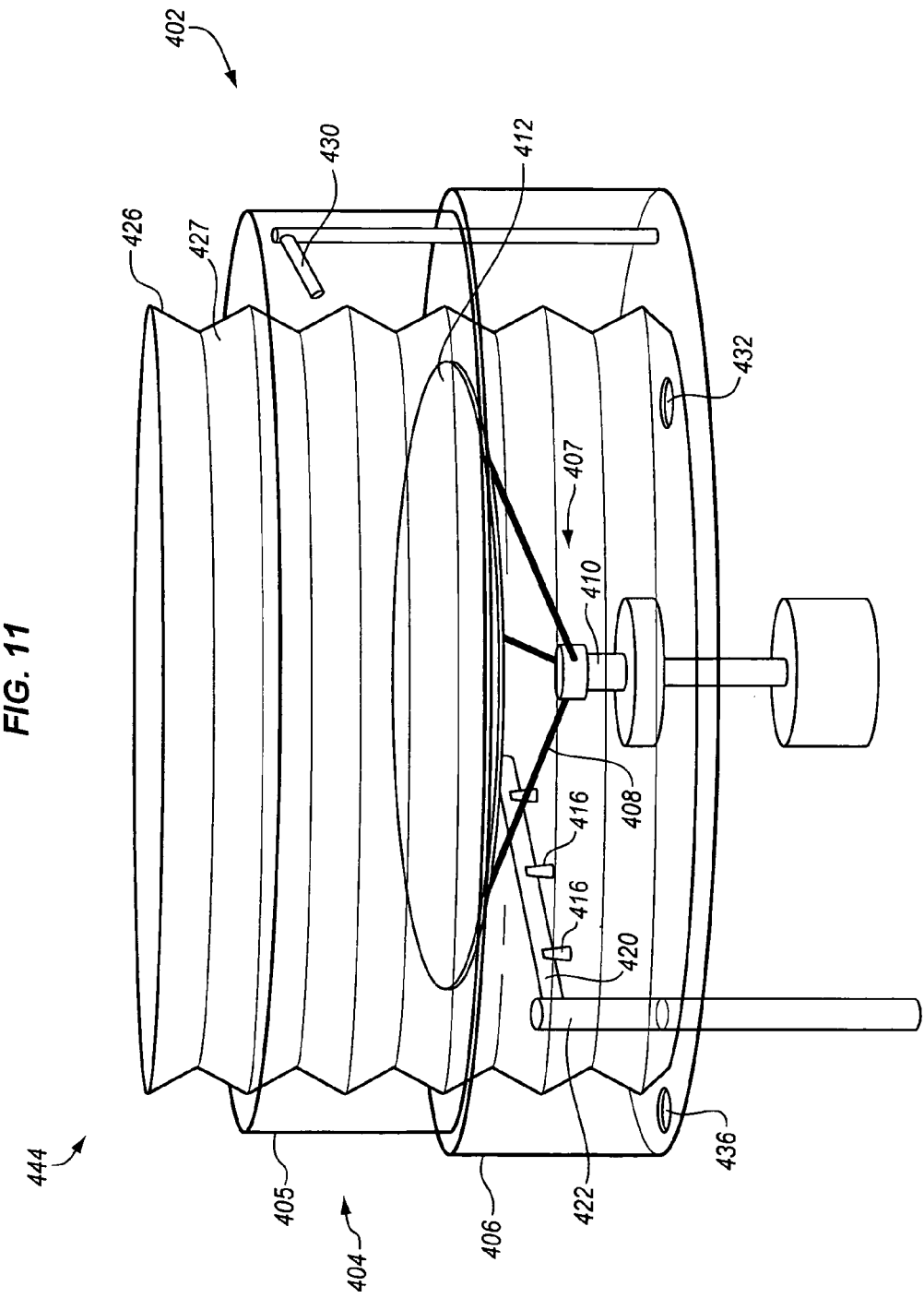
Figure 12:
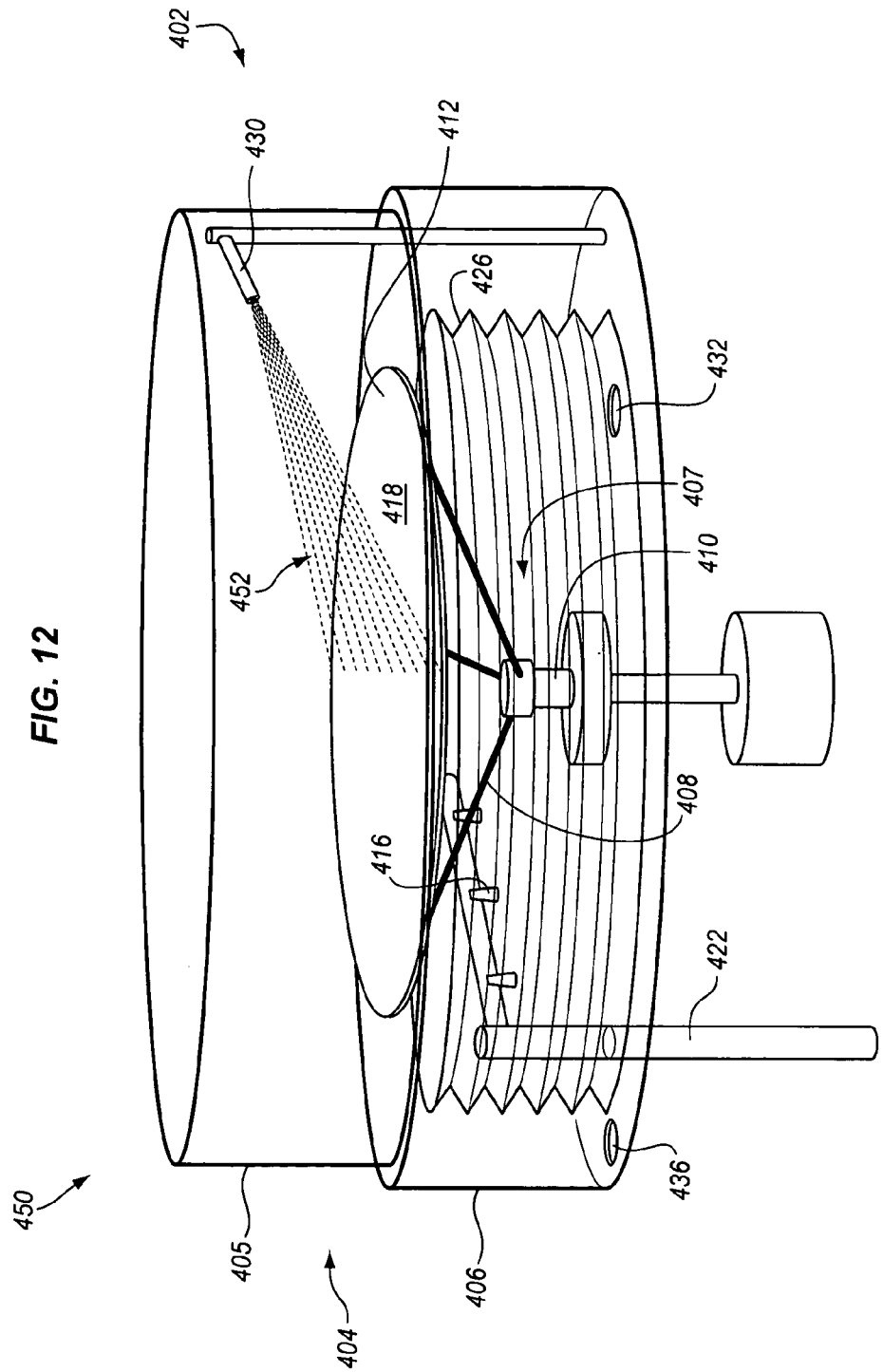
Figure 13:
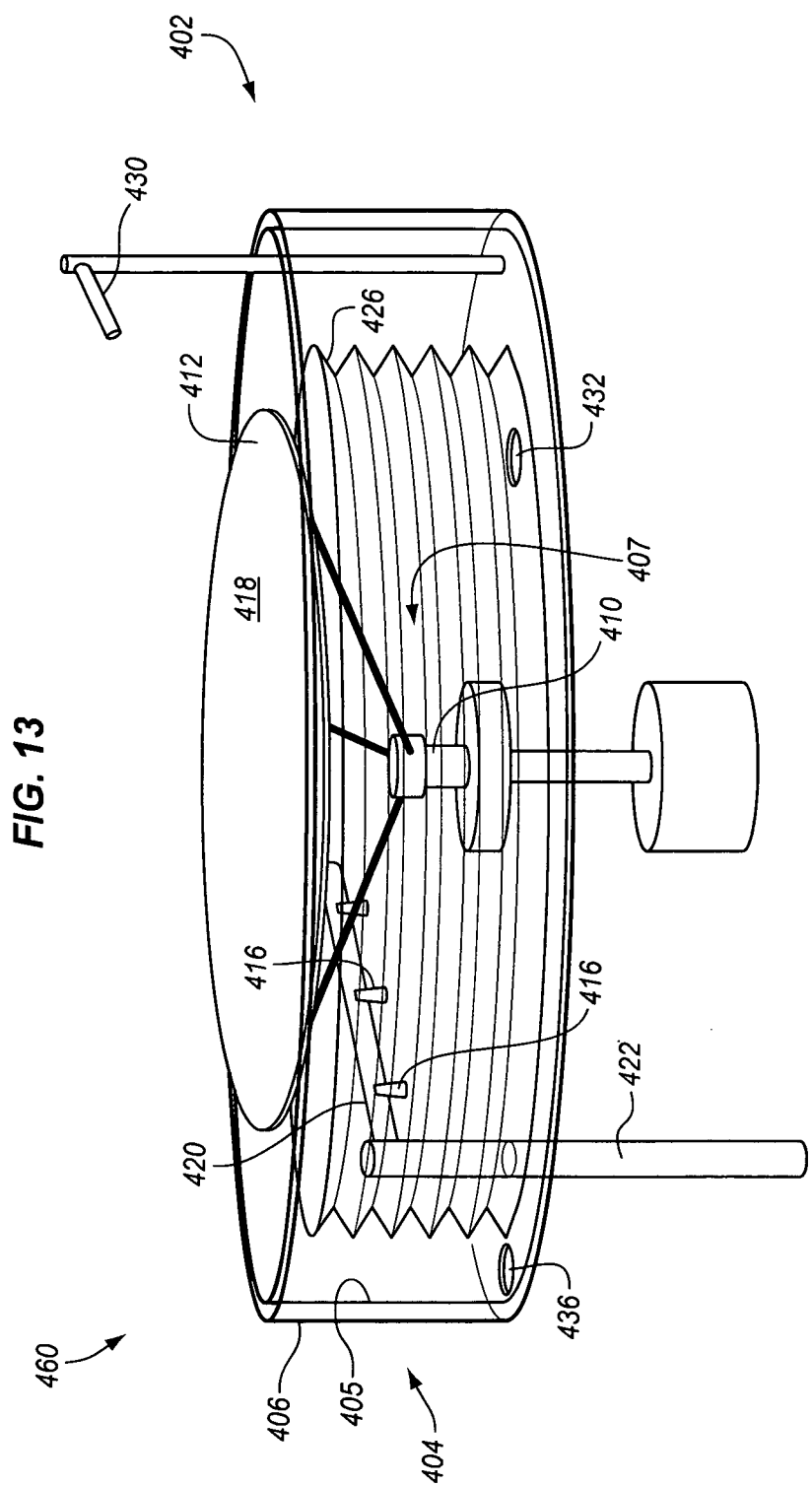
Figure 14:
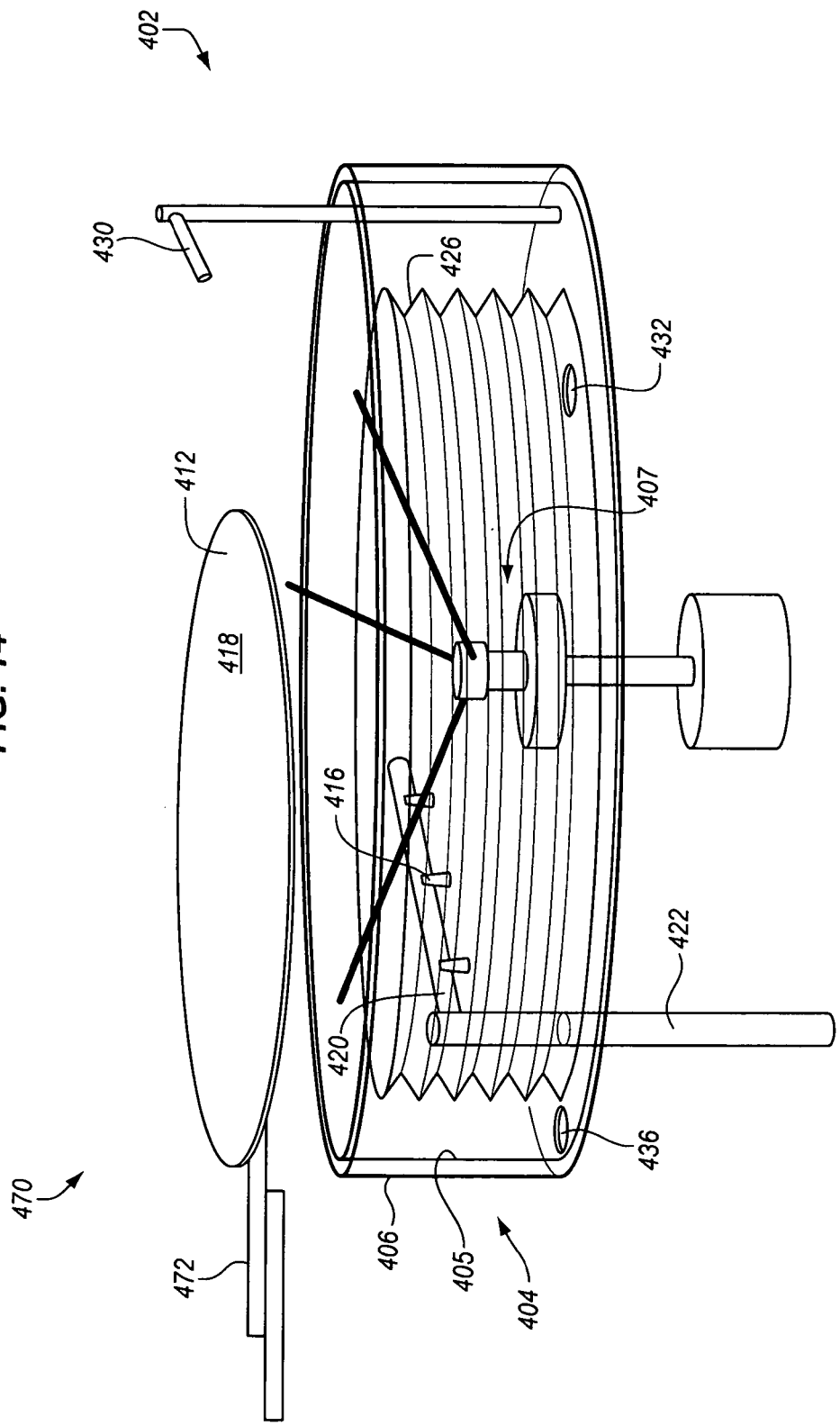

FIG. 9 depicts schematically a view 440 of apparatus 402 during a processing stage immediately after etching. Flow of etching liquid has ceased in all of etch nozzles 416. Etch nozzles 416 and nozzle support arm 420 are still located substantially directly above semiconductor wafer 412. In some embodiments of methods in accordance with the invention, a rinse nozzle applying rinsing liquid (not shown) is used to rinse remnants of etching liquid from etch nozzles 416 and nozzle support arm 420. FIG. 10 depicts schematically a view 442 of apparatus 402 in which etch nozzles 416 and nozzle support arm 420 have been rotated about vertical shaft 422 into a non-etching position in which etch nozzles 416 and nozzle support arm 420 are not directly above semiconductor wafer 412. FIG. 11 depicts schematically a view 444 of apparatus 402 in which vertical shaft 422 has been lowered so that etch nozzles 416 and nozzle support arm 420 are located in treatment container 404 below the plane of semiconductor wafer 412. FIG. 12 depicts schematically a view 450 of apparatus 402 during rinsing operations in which rinsing nozzle 430 is used to apply rinsing liquid to top surface 418 of semiconductor wafer 412 to rinse remnants of etching liquid off semiconductor 412. Retractable vertical rinse shield 426 has been lowered into an inactive position. In some embodiments, spinning and drying (e.g., using fans blowing warm air) are conducted after rinsing to dry semiconductor wafer 412 before removing it from treatment container 404. During rinsing and drying, outer splash shield 405 serves to inhibit splashing of rinsing liquid outside of treatment container 404. FIG. 13 depicts schematically a view 460 of apparatus 402 after rinsing and drying operations. Outer rinse shield 405 has been lowered to a down position to allow removal of semiconductor wafer 412 from apparatus 402. FIG. 14 depicts schematically a view 470 of apparatus 402 during removal of semiconductor wafer 412 out of apparatus 402 using a robot arm 472.

Figure 15:
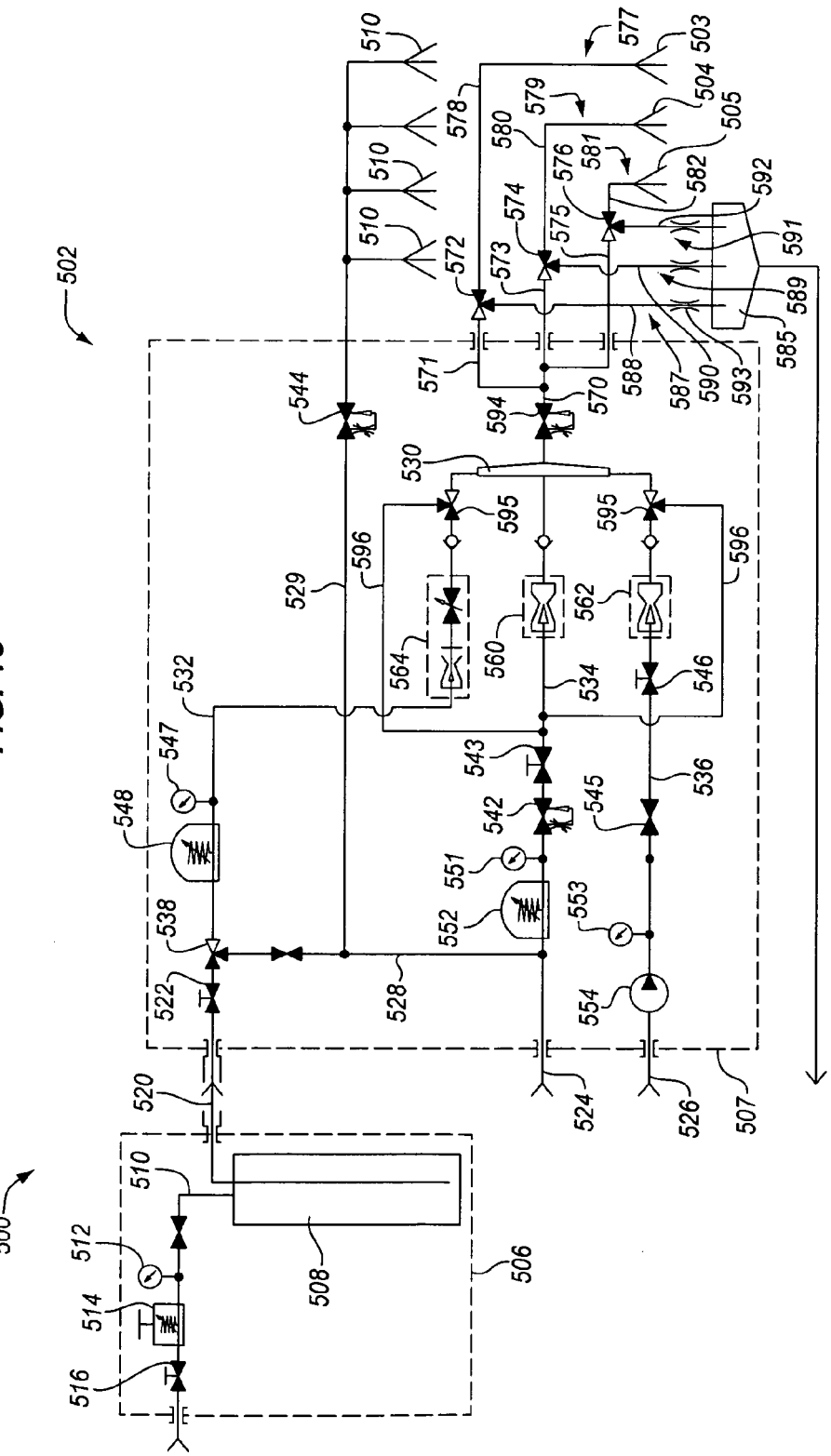
FIG. 15 depicts a flow diagram of an etching liquid delivery system for providing a chemically unstable etching liquid of desired composition at selected flow rates to a plurality of etch nozzles used for local etching in accordance with the invention.

FIG. 15 depicts a flow diagram 500 of etching liquid delivery system 502 in accordance with the invention for providing a chemically unstable etching liquid of desired composition at selected flow rates to a plurality of etch nozzles used for localized etching in accordance with the invention. Liquid delivery system 502 is designed to deliver etching liquid to three etch nozzles: center etch nozzle 503, middle etch nozzle 504 and edge etch nozzle 505. System 502 is also designed to deliver deionized water to chamber rinse nozzles 510. Although system 502 is described in this specification for delivering an etching liquid solution consisting essentially of ethylenediamine (EDA), hydrogen peroxide, sulfuric acid and deionized water to three etch nozzles, it is understood that embodiments in accordance with the invention are useful for delivering chemically unstable etching liquids having other compositions to etching apparatus in accordance with the invention having two, three or more etch nozzles used for local etching.

Delivery system 502 includes a ligand supply section 506, which supplies concentrated ligand (concentrated metal complexing agent), and a liquid mixing section 507. In some embodiments, liquid mixing section 507 is designed in modular form and is connected by tubing to ligand supply section 506. A ligand supply section 506 includes ligand supply tank 508 in which a concentrated ligand solution consisting essentially of one or more ligands (complexing agents) such as EDA or glycine, one or more pH adjusters, such as citric acid, acetic acid or sulfuric acid ($H_2SO_4$), and deionized water is housed, pressurized and/or otherwise prepared for delivery prior to being used in mixing section 507. Some embodiments include one or more other ligands in addition to or instead of EDA or glycine. Some embodiments use an acid different from acetic, citric, or sulfuric acid as part of the ligand solution. It is noteworthy that mixing concentrated pH-adjusting acid such as sulfuric acid with concentrated basic amine like EDA is highly exothermic. Accordingly, a mixture of EDA or other bi-, tri-, or tetra-dentate amine with a carboxylic acid or other acid like sulfuric acid should be done with some deionized water in order to prevent a fire or explosion. However, some embodiments in accordance with the invention include utilizing the heat of acid/base reaction (neutralization) and the heat of dissolution of a ligand or acid to raise the final etch solution temperature and thereby enhance the rate of local etching in accordance with the invention. Accordingly, one or more of the following heat-generating mixing events can be performed shortly prior to etching and the heat generated during mixing could be utilized: dissolution of the complexing agent in water, addition of a pH adjustor to the solution of complexing agent, and mixing of a solution of a complexing agent with a solution of an oxidizing agent. In some embodiments, the ligand solution is made by mixing a bi-, tri- or tetra-dentate amine (e.g., ethylene diamine, diethylenetriamine, tetraethylenetriamine, etc.) and an amino acid (such as serine or glycine or other amino acid/glycine derivative), in which cases an acid is not always necessary to adjust the pH value of the ligand solution.

In system 502, deionized water flows into ligand supply tank 508 through water supply line 510, which includes pressure valve 512, manual pressure regulator 514 and manual two-way valve 516. The flow of ligand solution from ligand supply tank 508 into mixing section 507 through ligand supply line 520 is enabled and shut off by two-way manual valve 522. Deionized water is supplied to mixing section 507 through DI supply line 524, and hydrogen peroxide (e.g. 30%/wt hydrogen peroxide in water, or other suitable dissolved oxidizing agent) is supplied to mixing section 507 through oxidizer supply line 526. During rinsing of the wafer, chamber, or nozzles' exterior, deionized water flows to rinse nozzles 510 through water line 528 and rinse line 529 with rinse valve 544 open. During etching operations, ligand solution flows to an inline mixing bowl 530 through ligand supply line 532, deionized water flows to mixing bowl 530 through water supply line 534, and hydrogen peroxide flows to mixing bowl 530 through oxidizer supply line 536. Preferred etching solutions typically are chemically unstable and decompose quickly after being formed. A benefit of inline mixing in accordance with the invention is the ability to mix ligand (complexing agent) and oxidizer constituents to form the etching liquid solution immediately before (e.g., within 2 minutes, preferably within about a minute) the etching liquid is flowed through nozzles and applied to a semiconductor wafer. During etching, three-way valves 538 and 539 are open to flow of ligand solution through ligand supply line 532 into mixing bowl 530. Water supply line includes valves 542, 543 which are open during etching, while valve 544 in rinse supply line 529 is closed during etching. Similarly, valves 545, 546 in oxidizer supply line 536 are open during etching. Pressure gauge 547 and pressure regulator 548 in ligand supply line 532 are used to regulate flow of ligand solution to mixing bowl 530 during etching. Similarly, pressure gauge 551 and pressure regulator 552 in water supply line 534 are used to regulate flow of deionized water to mixing bowl 530 during etching. Pressure gauge 553 and pump 554 in oxidizer line 536 are used to control the flow of hydrogen peroxide (or other oxidizing agent) to mixing bowl 530 during etching.

Exemplary flow rates into online mixing bowl 530 during etching operations include: 1.3 liters per minute (L/min) deionized water; 200 milliliters per minute (mL/min) to 300 mL/min $H_2O_2$; and 20 mL/min to 100 mL/min of ligand concentrate solution held in container 508. It has been determined that the etching rate achieved using an etching liquid solution as described herein containing a ligand and an oxidizing agent is strongly dependent on ligand concentration as well as on pH value. To control ligand concentration, system 502 firstly uses flow meter 560 to measure the flow rate of deionized water in water supply line 534 to mixing bowl 530, and it uses flow meter 562 to measure the flow rate of oxidizing agent in oxidizer supply line 536. Having measured the flow rates of deionized water and oxidizing agent into mixing bowl 530, system 502 uses this information and flow controller 564 to control the flow of ligand concentrate solution into online mixing bowl 530 to an appropriate value, thereby controlling the ligand concentration in the etching liquid solution that flows out of mixing bowl 530 into etching liquid supply tube 570. Etching liquid supply tube 570 is connected through center valve inlet tube 571 to three-way center valve 572, through middle valve inlet tube 573 to three-way middle valve 574, and through edge valve inlet tube 575 to three-way edge valve 576. System 502 includes three nozzle flow paths, each nozzle flow path beginning at an outlet of one of three-way valves 572, 574, 576, and ending at the outlet of an etch nozzle. Accordingly, center nozzle flow path 577 comprises center nozzle tube 578 and center nozzle 503, middle nozzle flow path 579 comprises middle nozzle tube 580 and middle nozzle 504, and edge nozzle flow path 581 comprises edge nozzle tube 582 and edge nozzle 505. System 502 also includes three drain flow paths, each drain flow path beginning at a second outlet of one of three-way valves 572, 574, 576, and ending in drain 585. Center drain flow path 587 comprises center drain tube 588, middle drain flow path 589 comprises middle drain tube 590, and edge drain flow path 591 comprises edge drain tube 592. As explained above, in some embodiments of an etching apparatus in accordance with the invention, modulation of etching rates in local etch regions is effected by ceasing flow of etching liquid through one or more etch nozzles for a certain amount of time during etching operations, while maintaining a substantially constant flow rate of etching liquid through one or more other etch nozzles. To maintain a substantially constant flow rate of etching liquid through a nozzle flow path after flow of liquid through one or more other nozzle flow paths is switched on or off, the total pressure drop through etching liquid supply tube 570 should be nearly constant. For a given range of etching liquid flow rates, a given pressure drop is caused by the flow resistance in each nozzle flow path 577, 579, 581. Accordingly, each drain flow path 587, 589, 591 is designed to have a flow resistance substantially equal to the flow resistance of the corresponding nozzle flow path. In other words, for a given range of flow rates through center nozzle flow path 577, center drain flow path 587 is designed to cause the same pressure drop when liquid flow is switched using center valve 572 between nozzle flow path 577 and drain flow path of 587. Similarly, for a given range of flow rates through middle nozzle flow path 579, middle drain flow path 589 is designed to cause the same pressure drop when liquid flow is switched using middle valve 574 between nozzle flow path 579 and drain flow path of 589. Similarly, for a given range of flow rate through edge nozzle flow path 581, edge drain flow path 591 is designed to cause the same pressure drop when liquid flow is switched using edge valve 576 between nozzle flow path 581 and drain flow path of 591. Some embodiments include orifice plates 593 in one or more drain tubes 588, 590, 592 to adjust pressure drop in a drain flow path so that it matches pressure drop in the corresponding nozzle flow path.

During rinsing operations using rinse nozzles 510, pneumatic valve 594 in etching liquid supply tube 570 is closed and pneumatic valve 544 is opened. System 502 is flushed with deionized water by switching three-way valves 595 to flush bypass lines 596. Similarly, concentrated ligand supply line 532 is flushed by switching three-way valve 538 to receive deionized water from water line 528.

Example 1

Copper was removed from 300 mm semiconductor wafers using localized wet etching in accordance with the invention. Using conventional techniques, a seed layer was formed on each wafer, then a layer of copper was electroplated onto the seed layer. The wafer was etched without delay and with high-temperature thermal annealing. The etching solution after all components were combined and mixed consisted essentially of: $H_2O_2$ at 1.06 molar concentration and glycine at 0.066 molar concentration in deionized water having a pH value of 8.9. The etching rate typically associated with the etching solution is about 1000 Å per minute. Etching liquid was applied to the semiconductor wafers using an apparatus in accordance with the invention having a center nozzle and an edge nozzle. During etching operations, flow of etching solution liquid through a particular nozzle was either on or off. When flow through the center nozzle was switched on, the etching liquid flow rate through that nozzle was approximately 500 mL/min. When flow through the edge nozzle was switched on, the etching liquid flow rate though that nozzle was approximately 600 mL/min. The center nozzle produced a fan-shaped 3-D spray pattern that extended across the wafer and that impacted the wafer in a substantially rectangular impact zone parallel to a wafer diameter and located about 20 mm radially outwards from the center of the 300 mm wafers. The center band-like impact zone formed by the center spray pattern had a radial width of about 10 mm. The edge nozzle produced a fan-shaped 3-D spray pattern that extended across the wafer and that impacted the wafer in a substantially rectangular impact zone parallel to a wafer diameter and located about 100 mm radially outwards from the center of the 300 mm wafers. The edge band-like impact zone formed by the edge 3-D spray pattern had a radial width of about 10 mm. The center and edge nozzles had an impact tilt angle with respect to the wafer surface of between 82 to 87 degrees.

Figure 16:
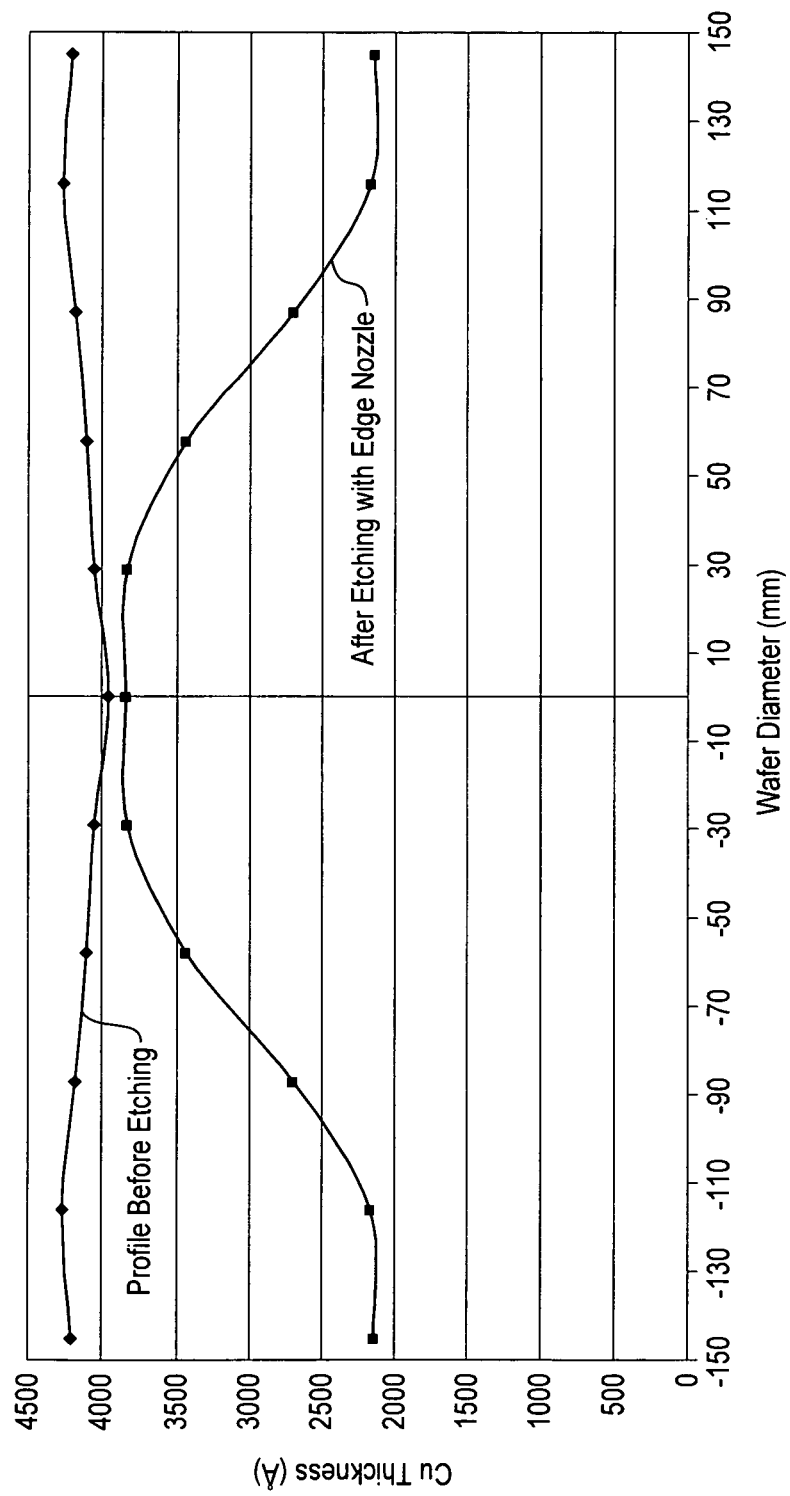
FIG. 16 contains a graph in which the copper thickness profile in angstrom units is plotted as a function of radial location on the wafer from measurements made both before and after etching using only an edge nozzle.
Figure 17:
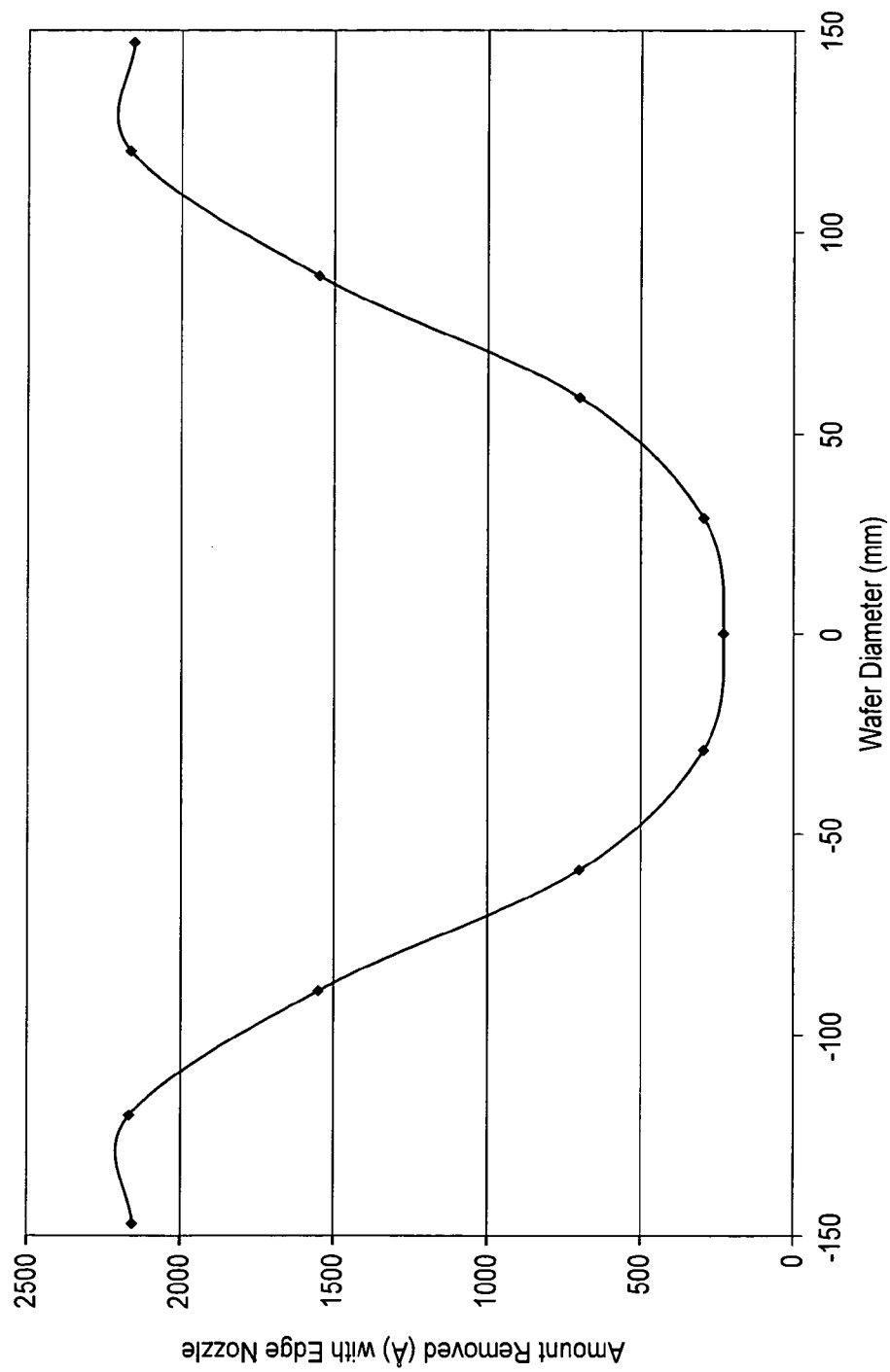
FIG. 17 contains a graph in which the amount of copper removed by etching using only the edge nozzle is plotted as a function of radial position.

To study the effects of applying etching solution using only the edge nozzle, localized etching was performed by flowing etching liquid through the edge nozzle 100% of the total etching time of about two minutes and flowing no etching liquid through the center nozzle 100% of the etching time. The thickness profile of the copper layer across the wafer was measured before and after etching. FIG. 16 contains a graph in which the copper thickness profile in angstrom units is plotted as a function of radial location on the wafer from the measurements made both before and after etching. The copper thickness profile before etching shows a "dished" profile in which center thickness is about 3900 Å and maximum thickness about 115 mm from the center is about 4300 Å. The profile from data measured after etching with only the edge nozzle shows that copper thickness at the edge of the wafer radially outwards from about 115 mm was reduced about 2000 Å to a final thickness of about 2200 Å. In contrast, the thickness of copper at the center of the wafer was reduced only about 200 Å to a final thickness of about 3800 Å. The data was processed to calculate the amount of copper removed as a function of radial position. FIG. 17 contains a graph in which the amount of copper removed by etching using only the edge nozzle is plotted as a function of radial position. Among other things, the data indicate that the etch rate at the center was only about 10% of the maximum etch rate near the peripheral edge of the wafer. The data suggest that localized edge etching in accordance with the invention has the potential of providing nearly 100 percent compensation of dished profiles.

Figure 18:
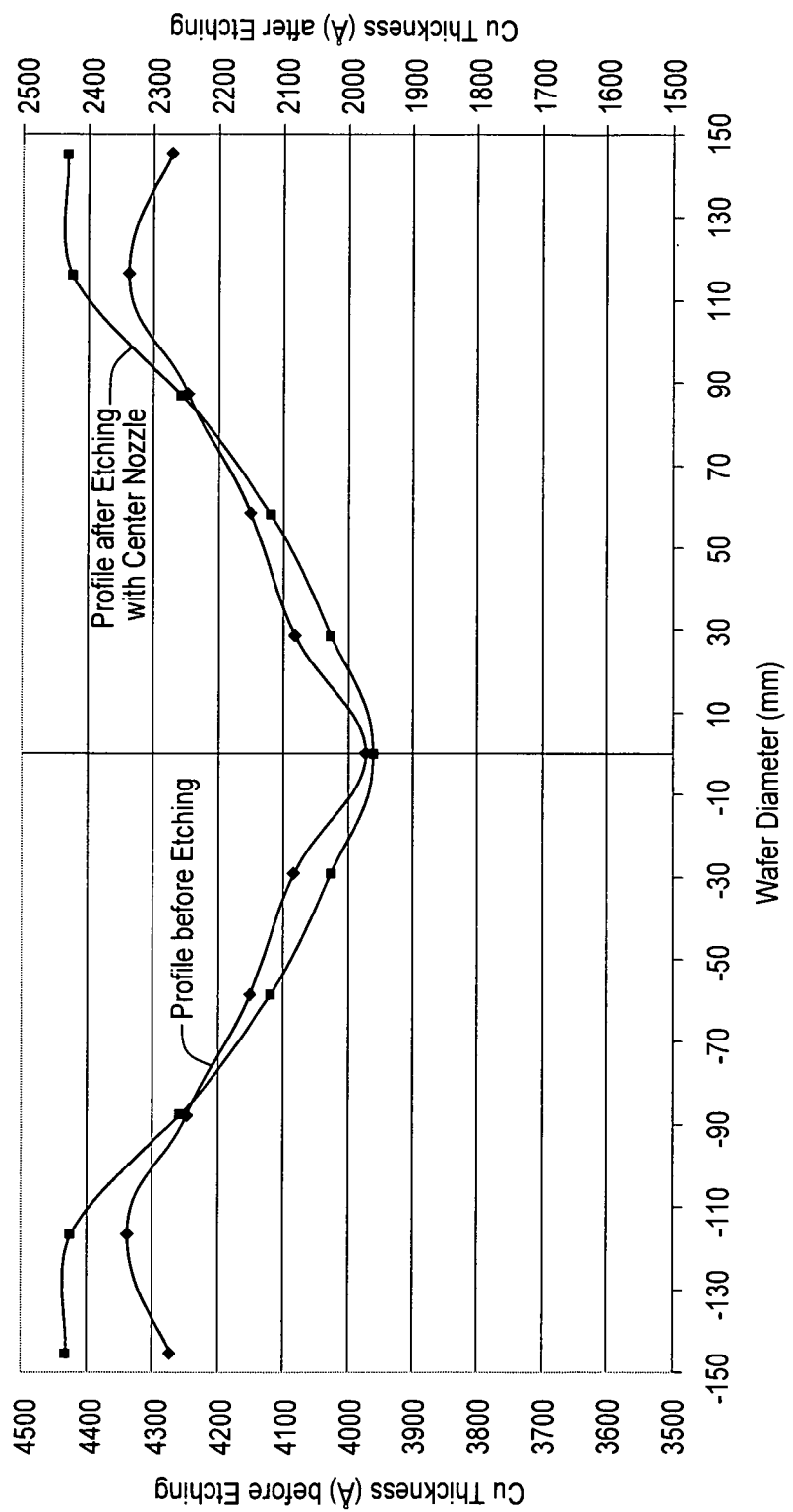
FIG. 18 contains a graph in which the copper thickness profile in angstrom units is plotted as a function of radial location on the wafer from measurements made both before (values on left axis of graph) and after etching (values on right axis of graph) using only a center nozzle.
Figure 19:
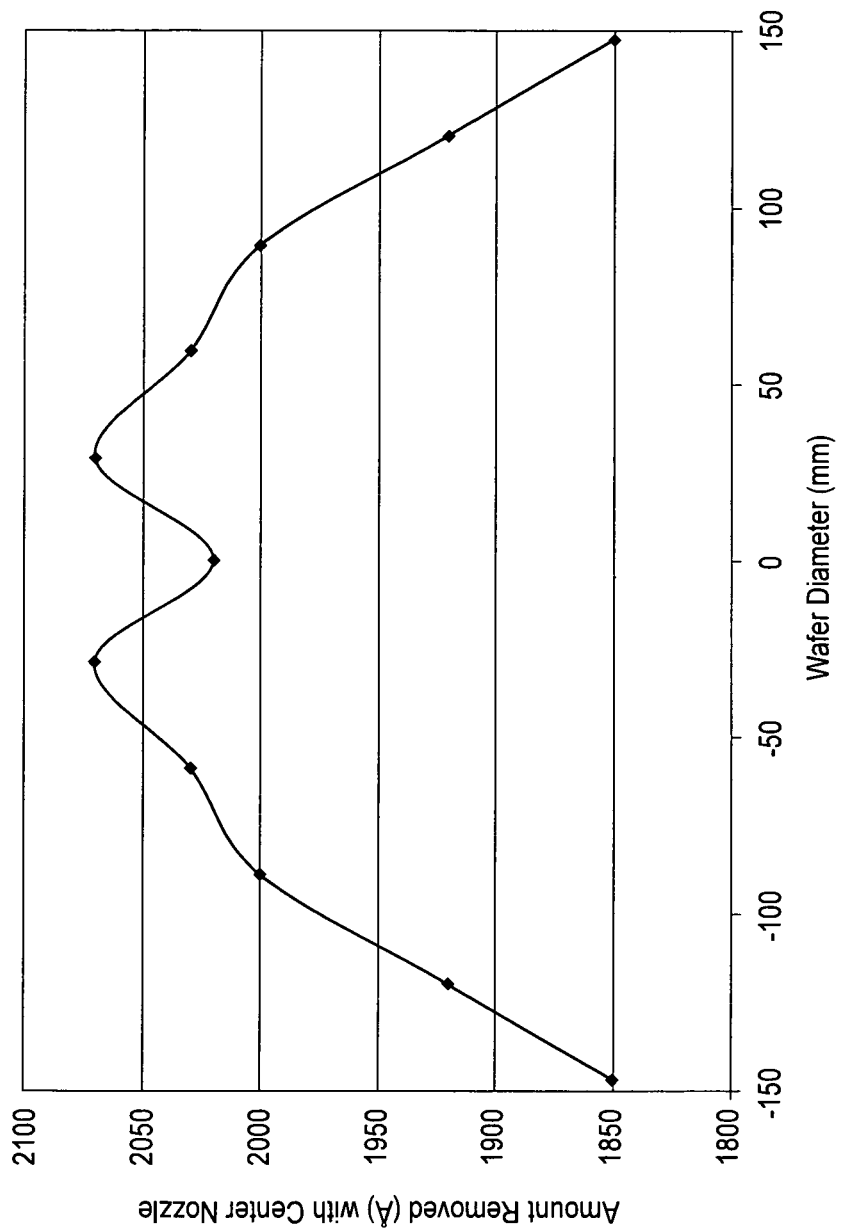
FIG. 19 contains a graph in which the amount of copper removed by etching using only the center nozzle is plotted as a function of radial position.

To study effects of applying etching solution using only the center nozzle, localized etching was performed by flowing etching liquid through the center nozzle 100% of the total etching time of about two minutes and flowing no etching liquid through the edge nozzle 100% of the etching time. The thickness profile of the copper layer across the wafer was measured before and after etching. FIG. 18 contains a graph in which the copper thickness profile in angstrom units is plotted as a function of radial location on the wafer from the measurements made both before (values on left axis of graph) and after etching (values on right axis of graph). The copper thickness profile before etching shows a "dished" profile in which center thickness is about 4000 Å and maximum thickness about 115 mm from the center is about 4400 Å. The profile from data measured after etching with only the center nozzle shows that copper thickness at the edge of the wafer radially outwards from about 115 mm was reduced about 1900 Å to a final thickness of about 2400 Å. In contrast, the thickness of copper at the center of the wafer was reduced about 2050 Å to a final thickness of about 1950 Å. The data was processed to calculate the amount of copper removed as a function of radial position. FIG. 19 contains a graph in which the amount of copper removed by etching using only the center nozzle is plotted as a function of radial position. The data indicate that the etch rate at the center was about five percent (5%) to ten percent (10%) greater than the slowest etch rates near the peripheral edge of the wafer. It is appreciated that this difference can be increased or decreased by modulating the etch chemical and process parameters, but the data suggest that localized center etching in accordance with the invention under etching conditions similar to this example has the potential of providing about 5% to 10% compensation in reducing edge-thick nonuniform profiles. The data also show that substantial etching occurred at the edge of the wafer even though etching solution applied to a center impact zone (e.g., similar to impact zone 34 in FIG. 1) was actually hitting a particular point near the peripheral edge of the wafer (e.g., at a radial distance of 130 mm from the center) about 20 percent of the time, compared to about 50 percent of the time or more at or near the center (e.g., at a radial distance of 10 mm or less). This fact indicates the particular utility and synergy of the design of the hardware coupled with the preferred isotropic etches disclosed herein.

Figure 20:
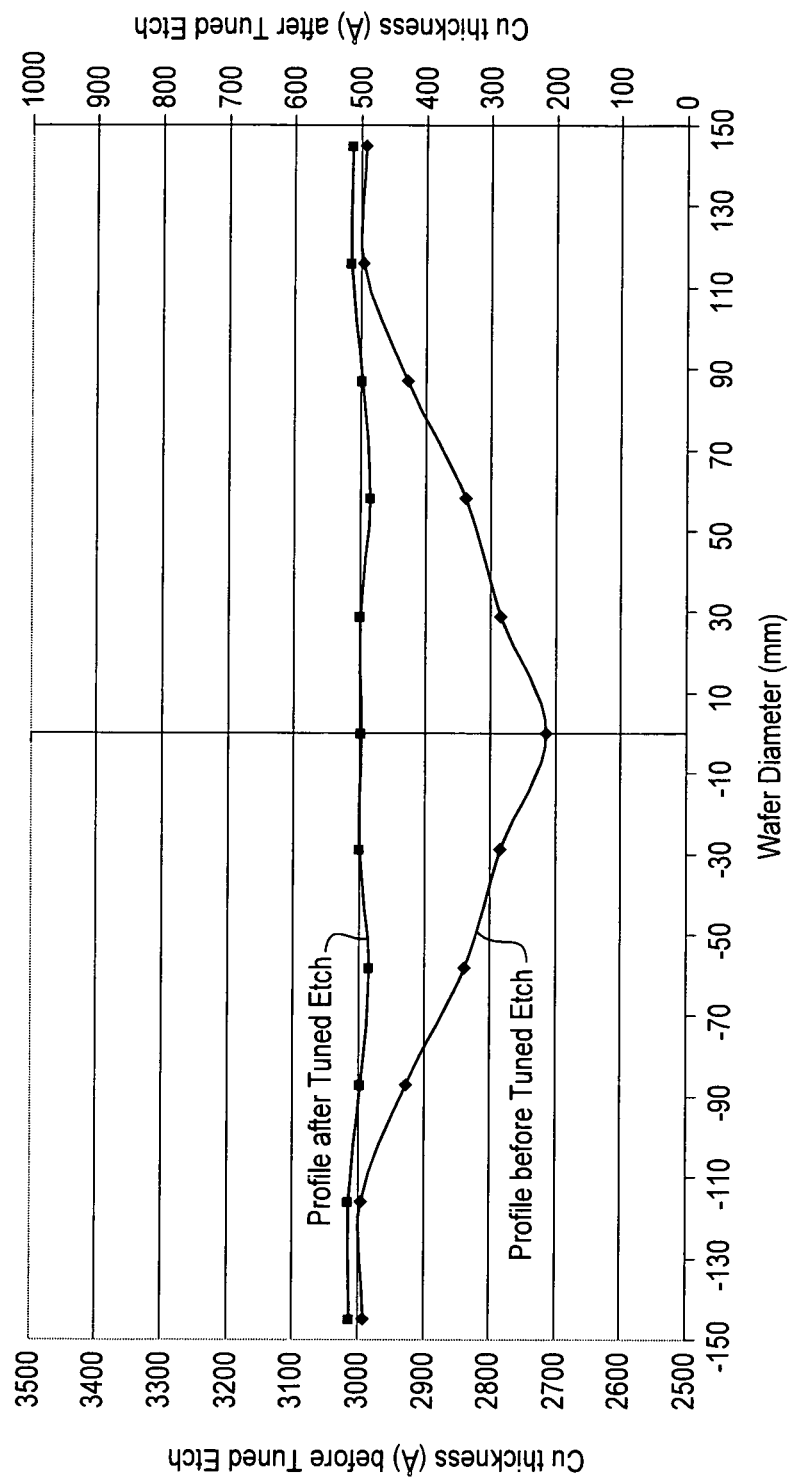
FIG. 20 contains a graph in which the copper thickness profile in angstrom units is plotted as a function of radial location on a wafer from measurements made both before etching (values on left axis of graph) and after etching using a plurality of nozzles in accordance with the invention (values on right axis of graph)

To study effects of modulating metal removal in accordance with the invention by applying etching solution using both the center and edge nozzles, localized etching was performed by flowing etching liquid through the center nozzle 92% of the total etching time of about 1.5 minutes and flowing etching liquid through the edge nozzle 100% of the total etching time. The thickness profile of the copper layer across the wafer was measured before and after etching. FIG. 20 contains a graph in which the copper thickness profile in angstrom units is plotted as a function of radial location on the wafer from the measurements made both before (values on left axis of graph) and after etching (values on right axis of graph). The copper thickness profile before etching shows a "dished" (center thin) profile in which center thickness is about 2720 Å and maximum thickness about 140 mm from the center is about 3000 Å. The average thickness was 2944 Å with a range of 242 Å, resulting in a thickness range nonuniformity of 8.9 percent (242/2720*100=8.9%). The profile from data measured after etching shows that copper thickness at the edge of the wafer radially outwards from about 130 mm was reduced about 2500 Å to a final thickness of about 500 Å. In contrast, the thickness of copper at the center of the wafer was reduced about 2200 Å to approximately the same final thickness of about 500 Å. The thickness profile after etching had an average thickness of 507 Å with a range of about 40 Å, resulting in a thickness range nonuniformity of 7.9 percent. Hence, the exemplary process was able not only to reduce the total non-uniformity range in absolute values, but also was able to reduce the thickness range percent of the remaining amount of metal. This implies that the combined plate and etch process achieved a result that was superior to that which would be obtained by simply plating the metal with the same deposition rate profile to the same final thickness (507 Å in this case).

The data presented in the graph of FIG. 20 demonstrate the utility of embodiments in accordance with the invention for removing metal at selected relative cumulative etching rates in different local etch regions of a semiconductor wafer. For example, with a semiconductor wafer having a metal layer of uniform thickness, the metal layer can be partially or completely removed while avoiding undesired removal of metal from embedded metal features. With a semiconductor wafer having a metal layer with nonuniform thickness, the cumulative etching rate in different local etch regions may be controlled to reduce or to eliminate thickness nonuniformities. Embodiments in accordance with the invention are particularly useful for etching relatively thick metal layers; for example, the etching of copper overburden deposited in damascene plating processes utilized to fill TSVs (through-silicon-vias). After modulated etching ("fine tuning"), the thickness profile of the copper layer in the graph of FIG. 20 had a nonuniformity of 7.9 percent. More importantly, however, the absolute difference in layer thicknesses was substantially reduced after modulated etching in accordance with the invention. For example, a hypothetical thick layer on a wafer might have an average thickness of about 4000 Å before etching, with a minimum thickness of 3900 Å and a maximum thickness of 4100 Å. The absolute difference in thicknesses of 200 Å is relatively small compared to the average thickness. If ideal 100% globally uniform isotropic etching were used to remove most of the metal, resulting in a metal layer having an average thickness of 500 Å, the absolute thickness difference of 200 Å would persist. The same absolute thickness difference of 200 Å would represent a large 40 percent of the average thickness, and would render the wafer potentially unsuitable for some preferred processing techniques. As demonstrated by the data presented in FIG. 20, however, modulated localized etching in accordance with the invention enables fine tuning of etching in a plurality of local etch regions to achieve a desired final thickness profile.

The data in the graph of FIG. 20, when compared with the data in FIGS. 16-19, also indicate that the contribution to etching rate at various radial positions on the semiconductor wafer of etching liquid from the center nozzle and the edge nozzle are not linearly additive; i.e., local etching across the diameter of a semiconductor wafer resulting from using a plurality of etch nozzles in accordance with the invention may not usually be predicted simply by adding the etch rates associated with individual nozzles. On the other hand, without being bound to any particular theory, it is believed that the nonlinearity of etching attributable to each of a plurality of etch nozzles in each of a plurality of local etch regions provides flexibility for modulating etching in various local etch regions across the diameter of a wafer. Without being bound to any particular theory, it is believed that the dwell time of a particular point on the surface of the wafer during localized etching in accordance with the invention is a significant factor influencing the cumulative etching rate at that particular point. It is also believed that an increase in liquid convection and liquid mixing in etching liquid covering a particular area (i.e., region) of the wafer surface increases the instantaneous etching rate in that area. This is particularly true when the etching liquid comprises an isotropic etching solution, as utilized in preferred embodiments in accordance with the invention. Since the etching rate associated with isotropic etching is typically kinetically controlled, rather than diffusion controlled, increasing fluid convection in an isotropic etching liquid generally increases the etching rate. As demonstrated by the data presented in the graphs of FIGS. 18-20, when etching liquid is applied only by a center nozzle, that is, by a nozzle applying a band-like pattern of etching liquid cutting across the wafer at or near the center, the cumulative etching rate over the total etching time at a region near the center of the wafer is significantly greater than the cumulative etching rate over the total etching time at a region near the peripheral edge. It is believed this phenomenon occurs at least partly because a region near the center of the wafer is being impacted with etching liquid during a greater percentage of the total etching time than a region at the edge. On the other hand, it is believed that applying a spray pattern of etching liquid to one or more impact zones radially outwards from the center of a wafer, between the center and the edge of a wafer, increases the total dwell time of local regions away from the center without significantly increasing the dwell time in center regions. It is also believed that one or more additional spray patterns of etching liquid in impact zones radially outwards from the center serve to agitate etching liquid in outer regions, to increase liquid convection in the etching liquid covering a particular region being impacted with liquid, and to replenish and to refresh the etching liquid in outer regions of the wafer, thereby enhancing the instantaneous etching rates and thereby the cumulative etching rates. The ability using embodiments in accordance with the invention to control and to modulate the cumulative etching rate in a plurality of local etch regions provides flexibility not available using other techniques. For example, hypothetically it would be possible to apply isotropic etching liquid substantially uniformly across the entire surface area of a semiconductor wafer using one big showerhead nozzle or many smaller nozzles. Presumably, the result would be uniform etching of metal across the entire surface of the wafer at uniform instantaneous etching rates. This would require the consumption of much more etching liquid than typically used in embodiments in accordance with the invention. More importantly, it would not enable etching of a nonuniform profile to achieve a uniform profile, as is possible using the invention. Also, it would not enable real-time modulation of the etching rate in localized areas to compensate inadvertent irregular etching characteristics, as is possible using the invention. Furthermore, it would not enable selective control of cumulative etching rate in local etch regions to customize a desired final profile, as is possible using embodiments in accordance with the invention.

In methods in accordance with the invention utilizing a system having a plurality of etch nozzles, at least two general approaches for modulating etching in a plurality of etch regions are useful to obtain a desired metal thickness profile. One approach is useful when all of a large number of incoming semiconductor wafers have a metal layer (e.g., a copper layer) having substantially the same thickness profile before etching, and substantially the same thickness profile after etching is desired. In such cases, a protocol is developed through testing in which the flow patterns of etching liquid (and other liquids, if used) through each of a plurality of etch nozzles is modulated as necessary to obtain the desired end profile. A hypothetical exemplary protocol for a system having three nozzles in a given configuration using a given etching liquid solution at a given flow rate through each nozzle provides that etching liquid flows through the center nozzle 70% of the total etching time, through the middle nozzle 80% of the time, and through the edge nozzle 100% of the etching time. Another approach that allows greater fine tuning of etching in a plurality of etch regions involves real-time measurement of metal thickness across the wafer using one or more sensors. Examples of sensors suitable for measuring metal thickness during etching operations include an optical sensor, and eddy current sensor, and an electrical resistance sensor. Measurement of the wafer average instantaneous metal removal rate and cumulative amount of metal removed can be made by measuring the amount of dissolved metal in the waste stream as a function of time, for example, via an optical adsorption photometric measurement, an electrochemical measurement, or an electrolyte resistance measurement. Some embodiments include combining both general control approaches; that is, developing a general protocol used for etching each wafer, and then fine tuning the etching process of each individual wafer using real-time metal thickness measurements to modulate flow patterns of liquid through one or more of the plurality of etch nozzles. Although modulation of etching in local etch regions is described in this specification mainly as a result of switching on and off a constant flow of etching liquid through a particular nozzle, it is understood that modulation of etching in some embodiments is achieved using one or more techniques for controlling and modulating liquid flow patterns, chemical concentrations, and application of chemical quenching species, as mentioned above.

Co-owned and co-pending United States patent application having the title "Wet Etching Methods for Copper Removal and Planarization in Semiconductor Processing", filed Aug. 4, 2009, by Mayer et al., which is incorporated herein by reference, teaches compositions of etching liquids and etching liquid precursor concentrates useful in embodiments in accordance with the present invention. In some embodiments, etching of copper-containing metal is performed using particular wet etching solutions containing an oxidizing agent and a ligand (i.e., complexing agent), such as in Example 1, above. It was unexpectedly discovered that the nature of complexing agent is of particular importance when isotropic etching characteristics without significant pitting or roughening are desired. Etching compositions were developed that provide high etch rates (e.g., at least about 1,000 Å/min, preferably at least about 2,000 Å/min, e.g. at about 4,000 Å/min) in the pH range of between about 5-12, preferably between about 6-10.

Significantly, in many embodiments, etching in a local etch region occurs at substantially similar rates in all directions; that is, the etch is isotropic. For example, etching within recessed features (or copper-filled lines) of different sizes can occur at substantially the same or similar rates. Further, in some embodiments, different surfaces within the recessed features in a local etch region are etched at substantially the same or similar rates, e.g., etching at the corners of the formed recessed features occurs at the same rate as etching at the feature bottoms. In embodiments in accordance with the invention of localized etching, etching with the described compositions also occurs within a local etch region at a substantially uniform instantaneous etch rate. The etching is preferably non-grain specific; for example, it does not occur at substantially higher rates at grain boundaries, and therefore does not result in undesired faceting. The etch rate is preferably feature size and pitch independent. Further, the isotropic etching compositions provide reduced pitting and surface roughness and afford smooth oxide-free surfaces having high reflectivity.

In contrast, well known and conventional copper etching compositions, e.g., etching compositions having low pH of less than about 5 such as mixtures of peroxide and acids, nitric acid based etches (typically without added oxidizer), ferric sulfate based copper etches, and etches of containing and based on ammonium persulfate, commonly are diffusion controlled and exhibit anisotropic behavior, with etch rates within smaller features being substantially greater than etch rates within larger features. Further, high pitting and surface roughness are observed with the use of conventional etching compositions.

The unusual isotropic behavior of the etching compositions described herein is attributed to the rate-limiting reaction occurring at the copper surface. Without being bound by a particular theory, it is believed that in the pH range of about 6-12, copper oxide is being formed at the copper surface and is immediately solubilized and removed by the complexing agent of the copper etching composition. It is noted that advantageously, etching compositions in some embodiments described herein do not form a layer of copper oxide resident on copper surface, but instead afford a smooth oxide-free copper surface having high reflectivity (e.g., reflectivity greater than 120% after 5,000 Å etch). Thus, if any oxide is being formed during the etching reaction, it is immediately removed in situ, such that an additional oxide-removing operation is not always required. It is understood, however, that in some embodiments, isotropic etching compositions form a layer of oxide resident on the surface, which may be removed in a subsequent separate cleaning operation.

Etching liquids useful in embodiments in accordance with the invention are not limited by the advantageous features described above, and these features need not be simultaneously exhibited by a particular etching liquid composition. For example, some etching solutions may exhibit very good isotropic behavior but may be relatively slow (e.g., exhibiting etching rates in a range of 100-1000 Å/min). Other compositions may provide very fast etching rates, e.g., greater than 3,000 Å/min, but are not necessarily perfectly isotropic. These compositions are within the scope of the invention. Nevertheless, it is particularly advantageous that compositions that exhibit both high etching rates (e.g., rates of greater than 1,000 Å/min) and very good isotropic behavior are described herein.

In some embodiments, isotropic etching liquids are aqueous solutions that include an oxidizing agent (e.g., a peroxide, a persulfate, a permanganate, ozone, an Fe3+ salt, etc.) and a bi-dentate, tri-dentate or quadridentate ligand (or complexing agent). Mixtures of complexing agents can also be used. Preferably, the complexing agent has at least one amino group, for example, containing at least one amino group and at least one carboxylic group, or from two to four amino groups without a carboxylic groups. The other coordinating group or groups may include a variety of coordinating moieties, e.g., a carboxylate and/or another amino group. Examples of suitable complexing agents include without limitation amino acids, diamines, triamines, and tetramines. In some embodiments, complexing agents having phosphonic groups are excluded from the scope of the invention.

Hydrogen peroxide is a preferred oxidizing agent in some embodiments due to its high solubility and low cost, although other oxidants, such as ozone ($O_3$), can also be used. It is understood, that dioxygen, which may be dissolved in the etching solution exposed to an ambient atmosphere, has an insufficient oxidation potential and suffers from poor kinetics on many metal surfaces such as copper, and for that and other reasons is not regarded as an oxidant for the purposes of this invention. Additionally, it is noted that the compositions described herein are wet etching solutions and are distinct from CMP slurries in that they do not contain abrasive particles (e.g. silica, alumina), or corrosion inhibitors (e.g. thiourea, benzotriazol).

As mentioned, the nature of complexing agents was found to be of particular importance. For example, simple unidentate ligands, such as ammonia, and large carboxylate-rich multidentate ligands, such as ethylenediaminetetraacetic acid (EDTA), were found to afford low etch rates and to lead to tarnish surface and surface oxide formation. In a preferred embodiment, the copper etching solution is substantially free of ammonia and its salts, from EDTA and its salts, and from ligands having denticities greater than four.

Unexpectedly, unlike EDTA and ammonia, many amino acids and diamines, such as glycine and ethylenediamine (EDA), were found to provide excellent etch rates (in some cases in excess of 2 micrometers per minute (μm/min), while maintaining isotropic behavior, low surface roughness, and no residual surface oxide.

"Amino acids" as used herein include both biologically occurring (natural) and unnatural amino acids, and refer to molecules having at least one carboxylic group and at least one amino group. Amino acids may be optionally substituted with a variety of substituents. In a preferred embodiment, amino acids include a non-substituted primary amino group, although in other embodiments, amino acids may be N-derivatized.

Glycine, DL-alanine, beta-alanine, serine, DL-methionine, and DL-valine were found to be suitable complexing agents for isotropic etching. Results for amino acids having bulkier substituents, such as leucine, glutamine, aspartic acid, tyrosine, cystine, and N-methylated amino acid sarcosine, showed lower etch rates.

Examples of typical etching compositions comprising amino acids include compositions having a pH of between about 6-10, an amino acid (e.g., glycine) and $H_2O_2$. High etch rates were observed at $H_2O_2$:glycine molar ratio of about 1:2. Buffering agents, corrosion inhibitors, and pH adjustors (such as tetramethylammonium hydroxide) can be added to the compositions as needed.

In some embodiments, diamines, triamines, and tetramines are used as complexing agents, of which diamines and triamines are preferred. These can be derivatized at nitrogen (e.g., can be N-alkyl substituted) or at other positions. Examples include ethylenediamine (EDA, $H_2NCH_2CH_2NH_2$), N-methylethylenediamine ($CH_3NHCH_2CH_2NH_2$), diethylenetriamine ($H_2NCH_2CH_2NHCH_2CH_2NH_2$), tetraethylenetriamine ($H_2NCH_2CH_2NHCH_2CH_2NHCH_2CH_2NH_2$) and tris(2-aminoethyl)amine (tren, $N(CH_2CH_2NH_2)_3$). Compositions containing mixtures of diamines and/or triamines and/or amino acids can also be used.

Diamine-containing etching compositions afford high etch rates and lead to smooth metal surfaces having high reflectivity. Triamine-containing and tetramine-containing compositions are also suitable for isotropic etches. Because polyamines typically provide solutions with high pH, in some embodiments acidic pH adjustors are added to the etching solution to reduce the pH to a preferred range. For example, in some solutions containing a diamine and/or a triamine, it is preferable to adjust pH to a value in a range of about from 5 to 12, more typically in a range of about from 6 to 10 by an acidic pH adjustor. Unexpectedly, not every acid is suitable to serve as a pH adjustor in these etching systems. Suitable pH adjustors include amino acids (e.g., glycine) which can also serve as an auxiliary complexing agent, carboxylic acids (particularly monobasic carboxylic acids; e.g., acetic acid, propionic acid), and sulfuric acid. In contrast, carbonic and phosphoric acids tend to form copper salts of limited solubility, and are less preferred, while hydrochloric acid appears to interfere with the isotropic etching mechanism. Typically, amino acids and acids that form highly soluble copper salts are preferred pH adjustors.

While pH adjustment of basic polyamine-containing solutions is preferred, in some embodiments, diamines, triamines and tetramines are used without such pH adjustment to achieve high etching rates.

When an amino acid is used as the major complexing agent of the etching solution, addition of basic pH adjustor is occasionally required to bring the pH of the etching solution to an optimum level. For example, tetramethylammonium hydroxide can be used as a basic pH adjustor.

Concentrations of complexing agents and oxidizer, as well as pH and temperature of etching solutions, are useful variables for modulating the etching rates and isotropic behavior of the wet etches.

The temperature of etching solutions can range widely, e.g., from about 0° C. to about 70° C. Typically, etching is performed at temperatures of from about 20° C. to 30° C. In some embodiments it is preferable to conduct etching above room temperature (above 25° C., e.g., at about 45° C.) to achieve reduced pitting and improved etch rate.

The concentrations of the complexing agent, the oxidizing agent and the pH adjustor can be varied depending on the specific application of the etchant, the amount of metal that needs to be removed, the surface roughness that can be tolerated, and other factors. In some preferred embodiments, an etching solution comprises: one or more bidentate, tridentate and quadridentate complexing agents at a molar concentration (moles per liter, M) in a range of about from 0.01M to 6M; and an oxidizing agent at a concentration in a range of about from 0.2M to about 12 M. The etching solution generally has a pH value in a range of about from 5 to 12, more typically in a range of about from 6 to 10, and preferably from about 7 to about 10.5. An etching solution may also include one or more pH-adjustors, such as acids selected from the group including sulfuric acid, an alkylsulphonic acid (e.g., methanesulphonic acid), a carboxylic acid (e.g., acetic acid), and an amino acid (e.g., glycine).

The etching rate strongly depends on the concentration of the complexing agent and to a lesser degree on a concentration of the oxidant. Generally, a higher etch rate is achieved at pH values in a range of about from 5 to 9, whereas better isotropic behavior (e.g., lower roughness) is achieved at pH values in a range of about from 7 to 12. These values, of course, can exhibit slight variation depending on the nature of complexing agent used. When both high etching rates and highly isotropic behavior is important, etching is typically performed at a pH in a range of about from 7 to 9.5 for example, from about 8.5 to 9.

Because the etching rate typically significantly drops when pH is increased, in some embodiments the etching reaction can be rapidly quenched at high pH. For example, if etching needs to be stopped, a basic pH adjuster may be supplied into the system to increase the pH of the etchant; for example, to pH greater than about 10-12. For example, a solution of TMAH can be added to the etchant to stop the reaction, or the flow of etching liquid can be stopped and replaced with a quenchant.

Examples of suitable etching compositions include but are not limited to solutions consisting essentially of:

(a) glycine, hydrogen peroxide and TMAH;
(b) EDA and hydrogen peroxide;
(c) EDA, hydrogen peroxide and acetic acid;
(d) EDA, hydrogen peroxide and glycine;
(e) EDA, hydrogen peroxide and sulfuric acid;
(f) N-methyl EDA, hydrogen peroxide and, optionally, an acidic pH adjustor (e.g., amino acid, sulfuric acid, or a carboxylic acid);
(g) Diethylenetriamine, hydrogen peroxide and optionally an acidic pH adjustor (e.g., amino acid, sulfuric acid, or a carboxylic acid).

While in many embodiments the solutions may include other materially significant components, in some embodiments, the etching solutions consist essentially of water, a complexing agent selected from the group consisting of amino acids, diamines, and triamines, an oxidizer, and, optionally, a pH adjustor.

An exemplary isotropic etching liquid well suited for etching copper using localized etching in accordance with the invention consists essentially of: ethylenediamine at a concentration of 5.7 mL/L; and $H_2O_2$ (4%) adjusted to a pH of about 9.5 with a combination of glycine, acetic acid, and sulfuric acid.

Figure 21:
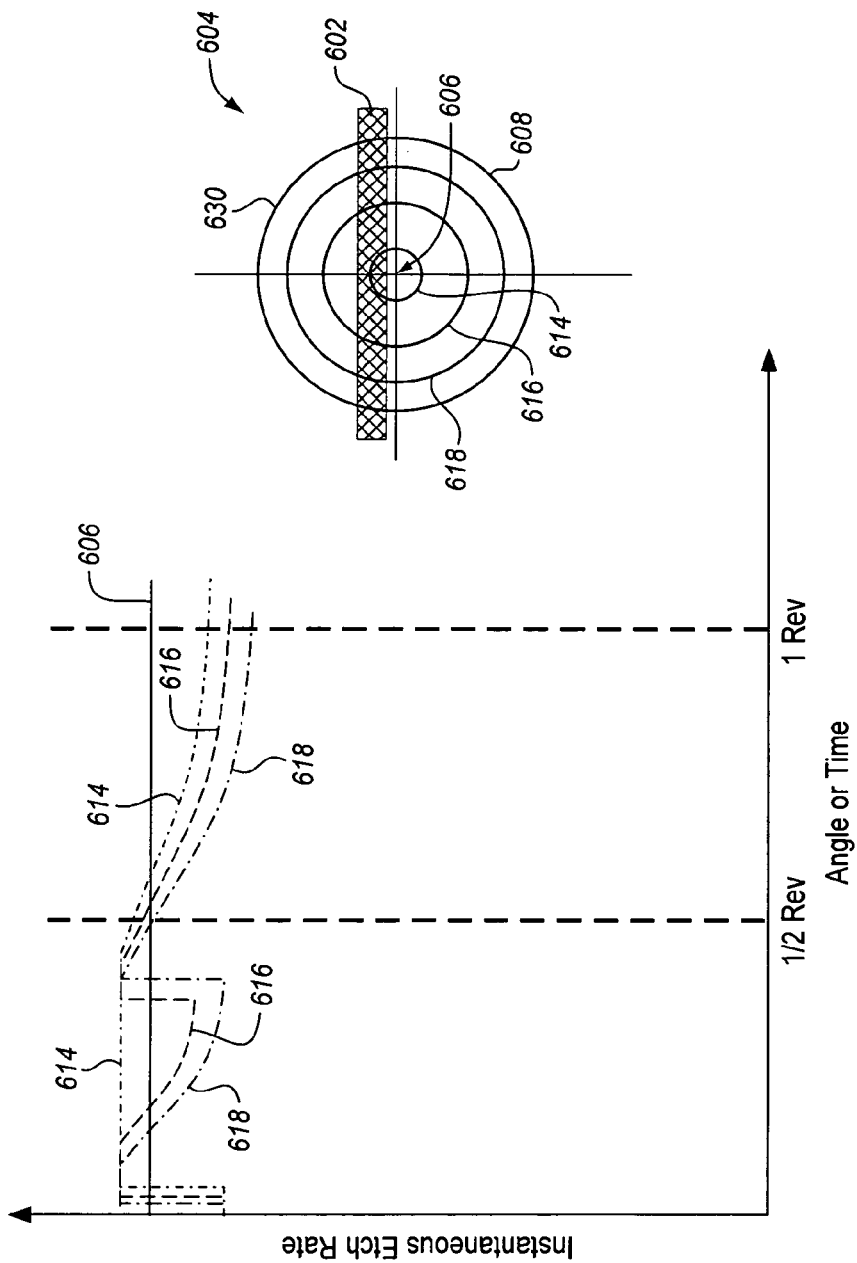
FIG. 21 depicts schematically isotropic etching in a process using a single, high impact zone nozzle located close to but slightly off the wafer center.

Without being bound to particular theories, a description of phenomena associated with practicing embodiments in accordance with the invention is presented here with reference to FIGS. 21-25. FIG. 21 depicts schematically isotropic etching in a process using a single, high impact zone nozzle located close to but slightly off the wafer center, as described above. Fluid in impact zone 602 makes initial contact with a wafer surface 604 at a location slightly off of the center 606 of wafer 608. Radial location 606, located at wafer center 606, has a substantially constant instantaneous rate of etching, indicated on the accompanying graph by the substantially constant-value horizontal line labeled 606. The substantially constant (constant during each rotation cycle) etch rate represented by line 606 is less than the maximum instantaneous etch rate 612 at radial locations 614, 616, 618. A point at radial location 614 of wafer 608 is close to center 606 and coincident with a region that enters the high-impact zone only once during wafer rotation (i.e., it does not exit the zone and re-enter it at the opposite hemisphere along the line perpendicular to the zones orientations). A point at radial location 614 has a varying instantaneous etch rate represented by the curve labeled 614. The instantaneous etch rate represented by curve 614 has a maximum value corresponding to its dwell time in impact zone 602 during slightly less than one-half of the time of rotation, and then the rate decays along curve 614 as the point on the wafer rotates out from under the impact zone 602 during its slightly greater than 180-degree rotation outside zone 602, before re-entering the high impact zone on the subsequent rotation. This sequence occurs over and over in rapid sequence during the etching process (e.g., 5 times a second with a 300 rpm rotation rate). Radial location 616 is further removed from the center than radial location 614 and at a radius greater than the width of impact zone 602. Accordingly, a point at radial location 616 enters and exits high impact zone 602 twice during a wafer rotation, once on each side of impact zone 602. Its instantaneous etch rate represented by curve 616 reaches the maximum value of curve 614 when the point at 616 is in the high impact zone 602, and decreases along curve 616 after rotating out of high impact zone 602. Then, however, each point at radial location 616 recovers the maximum etch rate as it re-enters impact zone 602 on the opposite side of the zone, and then its etch rate finally diminishes for a slightly longer period of time along curve 616 before the cycle repeats itself. The instantaneous etch rate at a point at radial location 618 has a pattern similar to points at location 616, but because the point is located further from the center and closer to wafer edge 630, the maximum etch rate in impact zone 602 has a shorter duration, and the durations of diminishing etch rate outside zone 602 are longer, as represented by curve 618 in the graph.

Figure 22:
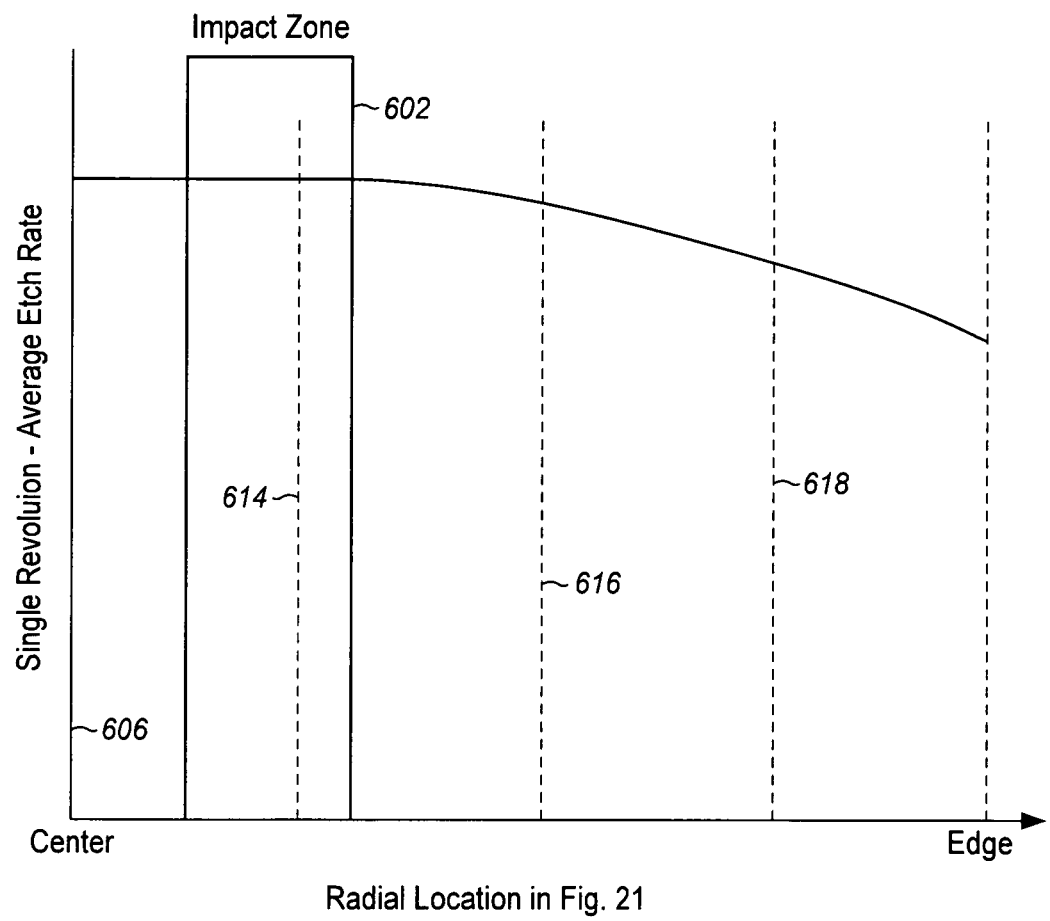
FIG. 22 is a schematic of the time-averaged etch rate over one complete rotation cycle (the integral of the etch rate over the cycle time) for all locations on the wafer depicted in FIG. 21.

FIG. 22 is a schematic of the time-averaged etch rate over one complete rotation cycle (the integral of the etch rate over the cycle time) for all locations on the wafer. The rate is fairly uniform at the center (wafer center 606 of FIG. 1). This fairly good uniformity occurs despite the fact that fluid is supplied to the wafer in a relatively small single high-impact zone or band covering only a small fraction (perhaps only 10% or less) of wafer surface 604. Of course, by changing some parameters such as the zone width, rotation rate, etching liquid flow rate and concentration, and thereby the maximum etch rate and rate of etch decay when not in the high impact zone, the rate of removal as a function of diameter can be modulated. When a surface-kinetics-controlled isotropic etch is used, the rate of etch-rate decay (i.e., decrease with time) after moving out of the high impact zone is generally small compared to the decay of etch rate in a diffusion-controlled etch process. This makes the surface-kinetics-controlled isotropic etching process less susceptible to radial nonuniformities because the rate of the isotropic process is substantially dependent on the concentration of etch reactants at the surface (kinetics-limited), which concentration generally far exceeds any diffusion-controlled limitations.

Figure 23:
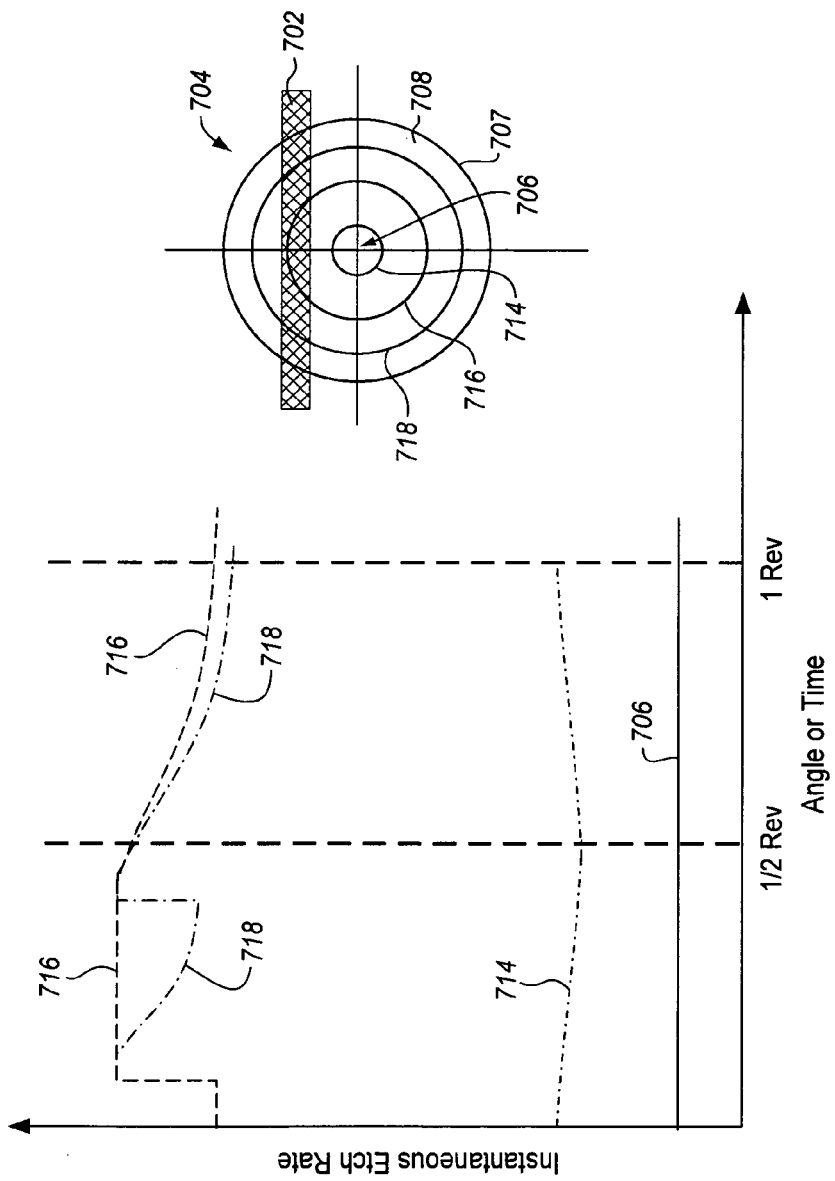
FIG. 23 depicts schematically a qualitative example of the etch rate at various radial locations resulting from a single nozzle applying etching liquid to an impact zone about midway between the center and the edge of the wafer.

FIG. 23 depicts schematically a qualitative example of the etch rate at various radial locations resulting from a single nozzle applying etching liquid to an impact zone 702. Liquid impact zone 702 is located on wafer surface 704 approximately midway between wafer center 706 and peripheral edge 707 of wafer 708. For description purposes, the etching liquid composition delivered to impact zone 702 is assumed to be identical (e.g., not diluted or concentrated) to the etching liquid which would produce the results shown in FIG. 21. The curves on the graph of FIG. 23 depict the instantaneous etch rates at four radial locations of wafer 708 corresponding to the locations discussed with reference to FIGS. 21-22. Near and at wafer center 706, etch rate is relatively constant and very low, as represented by the horizontal line labeled 706 in the graph. If no secondary spray (liquid splashed or splattered from impact zone 702) reached this location, the etch rate would be zero. Nevertheless, the distance of center 706 from high impact zone 702 is constant, and is expected to receive a constant (though small) amount of secondary etching liquid. Similarly, a point at radial location 714 has a relatively low etch rate represented by curve 714, but because radial location 714 is closer to impact zone 702 than wafer center 706, it typically receives a slightly greater amount of secondary flow, and therefore has an average etch rate higher than region 706. The etch rate at a point at radial location 714 is expected to oscillate over the rotation cycle, because at some time in the cycle it is further from zone 702 than region 706, and its etch rate is decaying during the time that it receives less secondary flow. Radial location 716 is similar to radial location 614 in FIG. 21 because a point at radial location 716 enters and exits impact zone 702 only once in a rotation cycle. The duration of time in impact region 702 of a point at radial location 716 is also significantly longer than the duration of a point at radial location 614 in impact zone 602. The instantaneous etch rate at a point at radial location 716 is represented on the graph in FIG. 23 by curve 716. Finally, radial location 718 is similar to radial location 616 in FIG. 21 because it enters and exits the high impact zone twice a cycle. The instantaneous etch rate at a point at radial location 718 is represented on the graph in FIG. 23 by curve 718.

Figure 24:
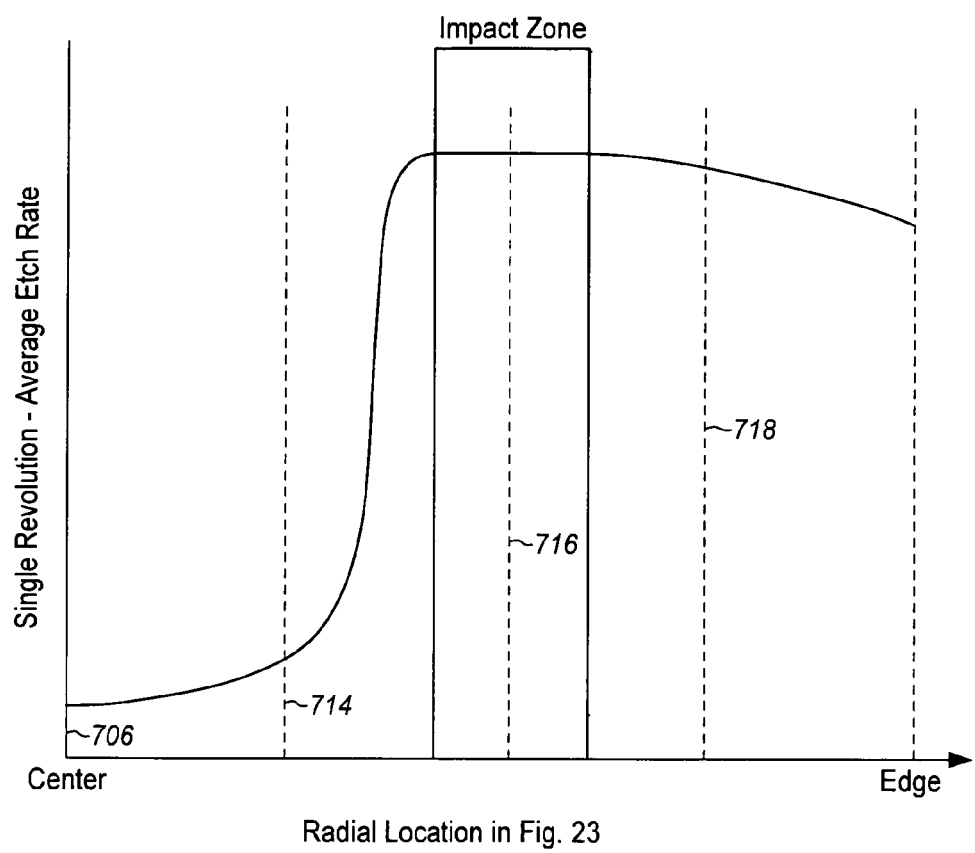
FIG. 24 is a schematic of the time-averaged etch rate over one complete rotation cycle (the integral of the etch rate over the cycle time) for all locations on the wafer of FIG. 23.

FIG. 24 is a schematic of the time-averaged etch rate over one complete rotation cycle (the integral of the etch rate over the cycle time) for all locations on wafer 708 of FIG. 23. At radial locations near the center, the average etch rate is low. The maximum average etch rate is at radial locations corresponding to the radial location of etching liquid impact zone 702. The average etch rate at radial locations radially outward from impact zone 702 is significantly greater than at the center, but less than the maximum average rate.

Figure 25:
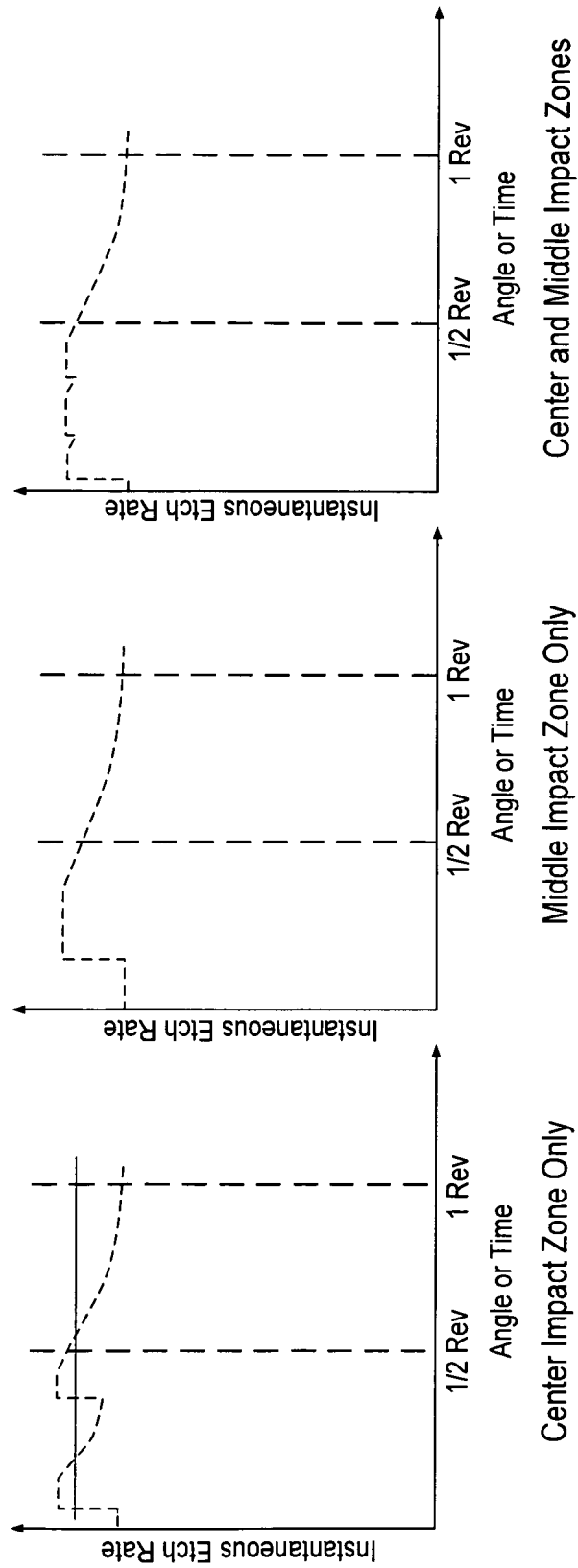
FIG. 25 depicts schematically the instantaneous etch rate at a point on a rotating wafer in three different etching situations.

In a process in which etching liquid is applied to a wafer in two or more etch-liquid impact zones simultaneously, it is believed that the maximum etch rate when a point on the wafer is inside an impact zone is largely unaffected by the presence of etching liquid from the additional impact zones. However, the decay of the instantaneous etch rate at a point after its exits a first impact zone is interrupted when (if) it enters a second impact zone; that is, the instantaneous etch rate is "reset" to the maximum or similarly high etch rate, as it enters a second high impact zone. This resetting of the etch rate to the maximum high impact value occurs at a time that is shifted from the first impact zone, and thereby increases the total time-averaged etch rate at that particular location. For example, FIG. 25 depicts schematically the instantaneous etch rate at a point on a rotating wafer in three different etching situations. The point is located at a midway radial location, corresponding to radial location 616 and 716 on wafers 608, 708 discussed above with reference to FIGS. 21, 23, respectively. In the first situation, etching liquid is applied only to an impact zone near the center of the wafer, such as impact zone 602 in FIG. 21. The point at radial location 616, 716 enters and exits the impact zone twice each rotation. Accordingly, the instantaneous etch rate is represented by a curve similar to curve 616 of FIG. 21. In the second situation, etching liquid is applied only to an impact zone about midway between the center and edge of the wafer, such as impact zone 702 in FIG. 23. The point at radial location 616, 716 enters and exits the impact zone only once each rotation. Accordingly, the instantaneous etch rate is represented by a curve similar to curve 716 of FIG. 23. In the third situation, etching liquid is applied both to an impact zone near the center of the wafer, such as impact zone 602 in FIG. 21, and to a midway impact zone, such as zone 702 in FIG. 23. As a result, the point at radial location 616, 716 is present in either one or the other impact zone for a greater portion of the rotation cycle. As explained above, the decay of the instantaneous etch rate at the point after its exits the first impact zone is interrupted when it enters the second impact zone; that is, the instantaneous etch rate is "reset" to the maximum or similarly high etch rate, as it enters the second high impact zone. As depicted in the corresponding graph in FIG. 26, the instantaneous etch rate is at or near the maximum value a greater portion of the rotation cycle, which results in a higher time-averaged etch rate during each rotation. This principle is applicable to other locations on the wafer. The use of additional nozzles (for example, further out from the wafer center) to apply etching liquid in additional impact zones and modulation of the etching liquid applied in one or more impact zones (e.g., by modulating flow rate, concentration or composition) provides the capacity for controlling and modulating the time-averaged rate at each radial location during the course of the total etching time, thereby providing the capacity for controlling and modulating the cumulative etch rate for the total etching time at each radial location in accordance with the invention. One of ordinary skill in the art will understand that on a rotating wafer as discussed with reference to FIGS. 21-25, the time-averaged etch rate is substantially the same at any particular radial distance on the wafer, and the cumulative etch rate achieved over the entire etching time is also substantially the same. Although the discussion of FIGS. 21-25 described phenomena occurring at particular radial locations, one of ordinary skill in the art will understand that the principles involved can be extrapolated to apply to discrete local etch regions corresponding approximately to each of the radial locations discussed.

FIG. 26 contains a process flow sheet of a generalized method 800 in accordance with the invention for removing metal from a semiconductor wafer using localized wet etching. Step 810 includes rotating a semiconductor wafer in a wafer holder. In other embodiments, relative motion between a semiconductor wafer and a plurality of etch nozzles is achieved using one or more other techniques instead of or in addition to rotating the wafer. Step 820 includes applying a first flow pattern of etching liquid to a first band-like impact zone of the rotating wafer. Generally, the flow pattern of etching liquid impacts the rotating wafer to form an instantaneous impact zone that extends completely across the wafer, and even extends beyond the edges of the wafer. For example, impact zone 34 depicted in FIG. 1 is a substantially rectangle-shaped impact zone that bisects the wafer similar to a chord that bisects a circle, except that the band-like impact zone has a finite width. Similarly, edge impact zone 64 depicted in FIG. 1 bisects wafer 30. It is understood that other flow patterns in accordance with the invention form impact zones that have shapes and dimensions different from those described with reference to FIG. 1, and some impact zones in accordance with the invention do not completely bisect a wafer, that is, they do not necessarily extend all the way across a semiconductor wafer. Step 830 includes simultaneously applying a second flow pattern of etching liquid to a second band-like impact zone using a second etch nozzle. Step 840 includes modulating the first flow pattern of etching liquid to selectively control a first cumulative etching rate in the first local etch region of the wafer relative to a second cumulative etching rate in a second local etch region. As described in more detail above, the term "modulating the flow pattern" of etching liquid from a particular etch nozzle and related terms are used in a broad sense to include changing one or more variables such as flow pattern shape, etching liquid flow rate, etching liquid concentration, angle of incidence of the etching liquid, and others.

In some embodiments, it is practical to use metal adding and removal planarization techniques in combination with localized wet etching. For example, in some embodiments copper layers may contain recesses with aspect ratios that are too high for practical planarization by isotropic local etching alone. In these cases, additional planarization techniques, such as additional anisotropic electroplating (via additive agents, or via electrochemical mechanical deposition), electroplanarization (e.g., electrochemical removal of unwanted metal or electrochemical deposition into unwanted recesses) and/or CMP may be used. These can be performed prior to or subsequent to localized wet etching, depending on the process needs.

The particular systems, designs, methods and compositions described herein are intended to illustrate the functionality and versatility of the invention, but they should not be construed to limit the invention to those particular embodiments. Systems and methods in accordance with the invention are useful in a wide variety of circumstances and applications to remove metal from semiconductor wafers, especially from wafers having metal features embedded in one or more dielectric layers of an electronic device. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the systems, methods, devices and compositions described in the claims below and by their equivalents.

The invention claimed is:

1. A method of removing metal from a semiconductor wafer using localized wet etching, comprising:
rotating a semiconductor wafer in a wafer holder;
applying a first flow pattern of wet etching solution to a first band-like impact zone of said rotating semiconductor wafer using a first etch nozzle during at least a portion of a total etching time;
simultaneously applying a second flow pattern of wet etching solution to a second band-like impact zone of said rotating semiconductor wafer using a second etch nozzle during at least a portion of said total etching time, wherein said first impact zone and said second impact zone are spatially distinct from each other; and
selectively controlling a first cumulative etching rate in a first local etch region of said semiconductor wafer relative to a second cumulative etching rate in a second local etch region by modulating said first flow pattern of wet etching solution.

2. The method of claim 1, wherein:
said first impact zone and said second impact zone do not overlap.

3. The method of claim 1, wherein:
at least one of said first band-like impact zone and said second band-like impact zone has a substantially arced shape and extends completely across said semiconductor wafer substantially concentric with the wafer center.

4. The method of claim 1, wherein:
each of said first etch nozzle and said second etch nozzle applies a three-dimensional flow pattern of wet etching solution that extends beyond peripheral edges of the semiconductor wafer.

5. The method of claim 1, wherein:
said first etch nozzle modulates said first flow pattern of wet etching solution by ceasing flow of wet etching solution.

6. The method of claim 1, wherein:
said first etch nozzle modulates said first flow pattern of wet etching solution by ceasing flow of wet etching solution and then applying deionized water to said first impact zone.

7. The method of claim 1, wherein:
said first etch nozzle modulates said first flow pattern of wet etching solution by ceasing flow of wet etching solution and then applying an etching quenchant to said first impact zone.

8. The method of claim 1, wherein:
said first etch nozzle modulates said first flow pattern of wet etching solution by changing a flow rate of wet etching solution.

9. The method of claim 1, wherein:
said first etch nozzle modulates said first flow pattern of wet etching solution by changing a composition of wet etching solution.

10. The method of claim 1, wherein:
said first etch nozzle modulates said first flow pattern of wet etching solution by changing a concentration of wet etching solution.

11. The method of claim 1, wherein:
said first etch nozzle modulates said first flow pattern of wet etching solution by changing a shape of said first flow pattern.

12. The method of claim 1, wherein:
said first etch nozzle and said second etch nozzle apply wet etching solution substantially normal to the surface of the semiconductor wafer.

13. The method of claim 1, wherein:
said first etch nozzle applies a first spray pattern to said first band-like impact zone at an angle in a range of about from 5° to 15° to the surface of the semiconductor wafer so that an inside edge of said first impact zone is offset from the center of said semiconductor wafer by a radial distance in a range of about from 5 mm to 25 mm.

14. The method of claim 1, further comprising:
rinsing said etch nozzles using a rinse nozzle when substantially no wet etching solution is flowing through said etch nozzles.

15. The method of claim 1, wherein:
said wafer holder, said semiconductor wafer and said first and second etch nozzles are located in a treatment container; and further comprising
rinsing wet etching solution from treatment container walls using a plurality of rinse nozzles.

16. The method of claim 1, wherein said wet etching solution comprises:
a complexing agent selected from the group consisting of a bidentate, a tridentate and a quadridentate complexing agent at a concentration in a range of about from 0.01M to 6M; and
an oxidizing agent at a concentration in a range of about from 0.2M to about 12M;
wherein said wet etching solution has a pH value in a range of about from 6 to 10.

17. The method of claim 1, wherein said wet etching solution comprises:
ethylenediamine at a concentration in a range of about from 0.04M to 0.2M; and
$H_2O_2$ at a concentration in a range of about from 0.2 M to 2M;
wherein said wet etching solution has a pH value in a range of about from 8.5 to 10.

18. The method of claim 1, further comprising:
forming said wet etching solution by mixing a complexing agent and an oxidizer less than two minutes before applying said wet etching solution to said semiconductor wafer.

19. The method of claim 1, further comprising:
heating said wet etching solution by using one or more heat-generating mixing events selected from the group consisting of: dissolution of a complexing agent in water; addition of a pH adjustor to a solution containing a complexing agent; and mixing of a solution of a complexing agent with a solution of an oxidizing agent.

20. The method of claim 1, wherein:
at least one of said first band-like impact zone and said second band-like impact zone has a substantially rectangular shape and extends completely across said semiconductor wafer substantially parallel to a wafer diameter.

21. The method of claim 20, wherein:
said first impact zone has a radial width in a range of about from 5 mm to 20 mm; and
said second impact zone has a radial width in a range of about from 5 mm to 20 mm.

22. The method of claim 1, further comprising:
rinsing wet etching solution from said semiconductor wafer using a rinse nozzle.

23. The method of claim 22, further comprising:
moving said semiconductor wafer between an etch chamber and a rinse chamber; wherein
applying wet etching solution to said semiconductor wafer using a plurality of etch nozzles for selectively modulating a first cumulative etching rate relative to a second cumulative etching rate is performed in said etch chamber; and
said rinsing wet etching solution from said semiconductor wafer is performed in said rinse chamber after said moving.

24. The method of claim 1, further comprising:
measuring a metal thickness on said semiconductor wafer during said applying wet etching solution to said semiconductor substrate using a non-wafer-contacting measuring device.

25. The method of claim 24, wherein:
said measuring a metal thickness using said non-wafer-contacting measuring device comprises immersing a plurality of electrodes in wet etching solution in close proximity to the wafer surface of said rotating semiconductor wafer and determining electrical resistance between a plurality of electrodes.

26. The method of claim 1, further comprising:
using a nozzle arm to support said first and second etch nozzles and to dispose said first and second etch nozzles substantially above the rotating semiconductor wafer in said wafer holder during localized etching.

27. The method of claim 26, further comprising:
moving said nozzle arm to a position in which said nozzle arm and said etch nozzles are not directly above the semiconductor wafer in said wafer holder.

28. The method of claim 26, further comprising:
moving said nozzle arm to an etching position in which a plurality of said etch nozzles are substantially aligned with a radius of a semiconductor wafer in said wafer holder.

29. The method of claim 28, further comprising:
adjusting the radial position of at least one of said first and second etch nozzles relative to the center of a semiconductor wafer.

30. The method of claim 26, further comprising:
moving said nozzle arm in a direction perpendicular to the semiconductor wafer in said wafer holder to change the distance of said first and second etch nozzles from said semiconductor wafer.

31. The method of claim 26, further comprising:
adjusting at least one of a plurality of said etch nozzles supported on said nozzle arm to change the distance between said at least one etch nozzle and the semiconductor wafer.

32. The method of claim 26, further comprising:
rinsing said nozzle arm and said etch nozzles using a rinse nozzle.

33. A method of removing metal from a semiconductor wafer using localized wet etching, comprising:
rotating a semiconductor wafer in a wafer holder positioned in a treatment container;
applying a first flow pattern of etching liquid to a first band-like impact zone of said rotating semiconductor wafer using a first etch nozzle during at least a portion of a total etching time;
simultaneously applying a second flow pattern of etching liquid to a second band-like impact zone of said rotating semiconductor wafer using a second etch nozzle during at least a portion of said total etching time, wherein said first impact zone and said second impact zone are spatially distinct from each other;
selectively controlling a first cumulative etching rate in a first local etch region of said semiconductor wafer relative to a second cumulative etching rate in a second local etch region by modulating said first flow pattern of etching liquid; and
rinsing etching liquid from said semiconductor wafer using a rinse nozzle, wherein said wafer holder, said semiconductor wafer, said first and second etch nozzles and said rinse nozzle are located in a treatment container; and further comprising
positioning a retractable vertical splash shield in an active position while applying said etching liquid to said semiconductor wafer so that said vertical splash shield substantially surrounds said semiconductor wafer in said wafer holder and is located between said wafer holder and an inner wall of said treatment container and is operable to inhibit etching liquid from etch nozzles and from a spinning semiconductor wafer from splashing onto said inner wall; and
during said rinsing, positioning said vertical splash shield in an inactive position so that said vertical splash shield is not proximate to said semiconductor wafer in said wafer holder.

34. A method of removing metal from a semiconductor wafer using localized wet etching, comprising:
rotating a semiconductor wafer in a wafer holder positioned in a treatment container;
applying a first flow pattern of etching liquid to a first band-like impact zone of said rotating semiconductor wafer using a first etch nozzle during at least a portion of a total etching time;

simultaneously applying a second flow pattern of etching liquid to a second band-like impact zone of said rotating semiconductor wafer using a second etch nozzle during at least a portion of said total etching time, wherein said first impact zone and said second impact zone are spatially distinct from each other;

selectively controlling a first cumulative etching rate in a first local etch region of said semiconductor wafer relative to a second cumulative etching rate in a second local etch region by modulating said first flow pattern of etching liquid; and positioning a retractable vertical splash shield in an active position while applying said etching liquid to said semiconductor wafer so that said vertical splash shield substantially surrounds said semiconductor wafer in said wafer holder and is located between said wafer holder and an inner wall of a treatment container housing the semiconductor wafer and, wherein the retractable vertical splash shield is operable to inhibit etching liquid from etch nozzles and from a spinning semiconductor wafer from splashing onto said inner wall.

* * * * *